(12) United States Patent
Nishinohara et al.

(10) Patent No.: US 6,541,829 B2
(45) Date of Patent: Apr. 1, 2003

(54) SEMICONDUCTOR DEVICE AND METHOD OF MANUFACTURING THE SAME

(75) Inventors: Kazumi Nishinohara, Yokohama (JP); Yasushi Akasaka, Yokohama (JP); Kyoichi Suguro, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 6 days.

(21) Appl. No.: 09/726,486

(22) Filed: Dec. 1, 2000

(65) Prior Publication Data

US 2001/0009292 A1 Jul. 26, 2001

(30) Foreign Application Priority Data

Dec. 3, 1999 (JP) .......................................... 11-345426
Jan. 20, 2000 (JP) ....................................... 2000-012107

(51) Int. Cl.⁷ ........................ H01L 29/76; H01L 29/94; H01L 31/062; H01L 31/113; H01L 31/119
(52) U.S. Cl. ...................... 257/402; 257/403; 257/407; 257/345; 257/372
(58) Field of Search ................................. 257/403, 402, 257/400, 404, 345, 372, 375, 376, 394, 407

(56) References Cited

U.S. PATENT DOCUMENTS

| 4,841,346 A | * | 6/1989 | Noguchi | 257/403 |
| 5,094,966 A | * | 3/1992 | Yamazaki | 438/287 |
| 5,548,143 A | * | 8/1996 | Lee | 257/269 |
| 5,698,884 A | * | 12/1997 | Dennen | 257/297 |
| 5,952,701 A | * | 9/1999 | Bulucea et al. | 257/407 |
| 6,229,188 B1 | * | 5/2001 | Aoki et al. | 257/404 |

OTHER PUBLICATIONS

Sze, Physics of Semiconductor Devices, John Wiley & Sons, second edition, p. 21.*

(List continued on next page.)

Primary Examiner—Steven Loke
Assistant Examiner—Shouxiang Hu
(74) Attorney, Agent, or Firm—Finnegan, Henderson, Farabow, Garrett & Dunner, L.L.P.

(57) ABSTRACT

A semiconductor device has a first semiconductor region formed in a semiconductor substrate and having a first conductivity type due to first-conductivity-type active impurities contained in the first semiconductor region, and a second semiconductor region formed between the first semiconductor region and the surface of the semiconductor substrate and having a second conductivity type due to second-conductivity-type active impurities contained in the second semiconductor region. The second semiconductor region contains first-conductivity-type active impurities whose concentration is zero or smaller than a quarter of a concentration of the second-conductivity-type active impurities contained in the second semiconductor region. An insulating film and a conductor are formed on the second semiconductor region. Third and fourth semiconductor regions of the second conductivity type are formed at the semiconductor surface in contact with the side faces of the second semiconductor region. This semiconductor device is capable of suppressing net impurity concentration variations as well as threshold voltage variations to be caused by a short channel effect or manufacturing variations.

14 Claims, 51 Drawing Sheets

OTHER PUBLICATIONS

Copy of U.S. patent application Ser. No. 09/559,356, filed Apr. 27, 2000 to Tsunashima et al.

Copy of U.S. patent application Ser. No. 09/344,105, filed Jun. 24, 1999 to Nishinohara.

Nishinohara et al., "Surface Channel Metal Gate CMOS with Light Counter Doping and Single Work Function Gate Electrode," Extended Abstracts of the 2000 International Conference on Solid State Devices and Materials (2000), pp. 46–47.

Rupp et al., "Extending Trench DRAM Technology to 0.15μm Groundrule and Beyond," IEDM (1999), pp. 2.3.1–2.3.4.

Chatterjee et al., "CMOS Metal Replacement Gate Transistors using Tantalum Pentoxide Gate Insulator," IEDM (1998), pp. 29.1.1–29.1.4.

Kühn et al., "New Method for Verification of Analytical Device Models Using Transistor Parameter Fluctuations," IEDM (1997), pp. 6.6.1–6.6.4.

Kizilyalli et al., "$n^+$–Polysilicon gate PMOSFET's with Indium Doped Buried–Channels," IEEE Electron Device Letters (Feb. 1996), 17:46–49.

Nishinohara et al., "Effects of Microscopic Fluctuations in Dopant Distributions on MOSFET Thershold Voltage," IEEE Transactions on Electron Devices (Mar. 1992), 39:634–639.

* cited by examiner

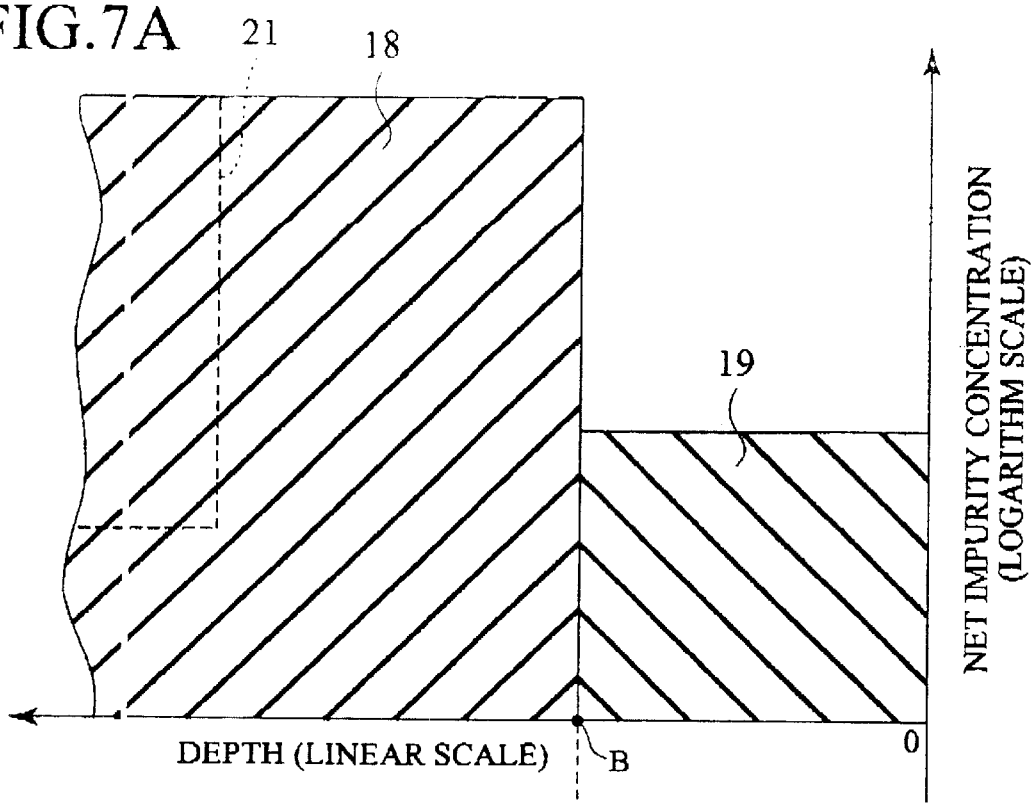
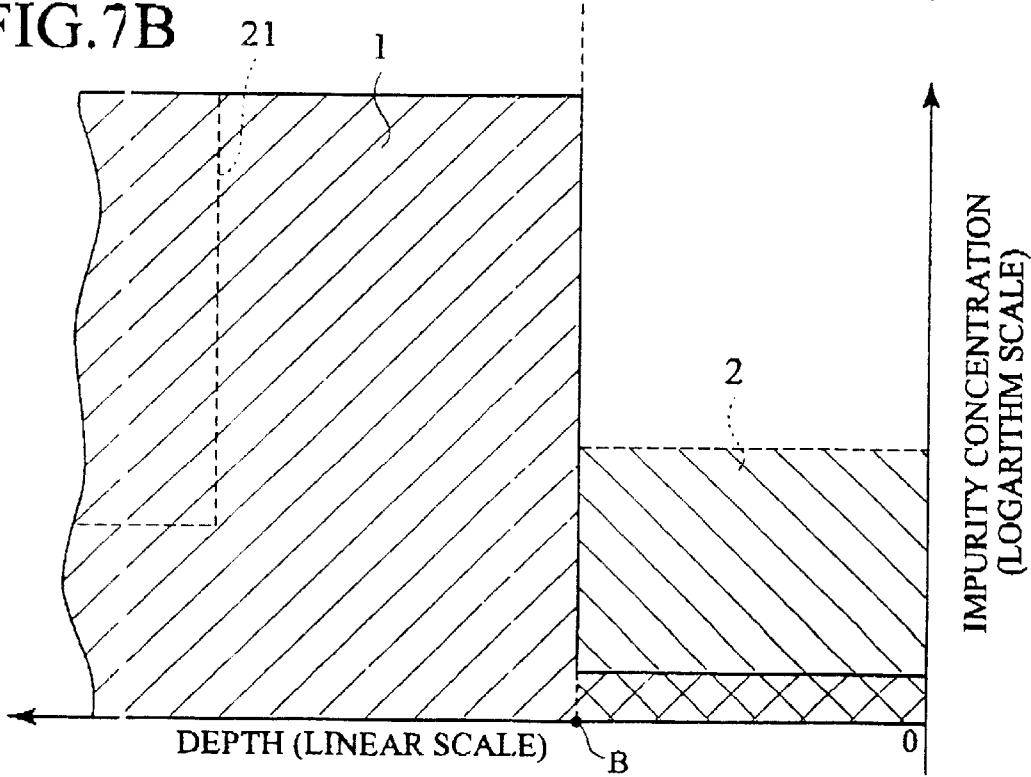

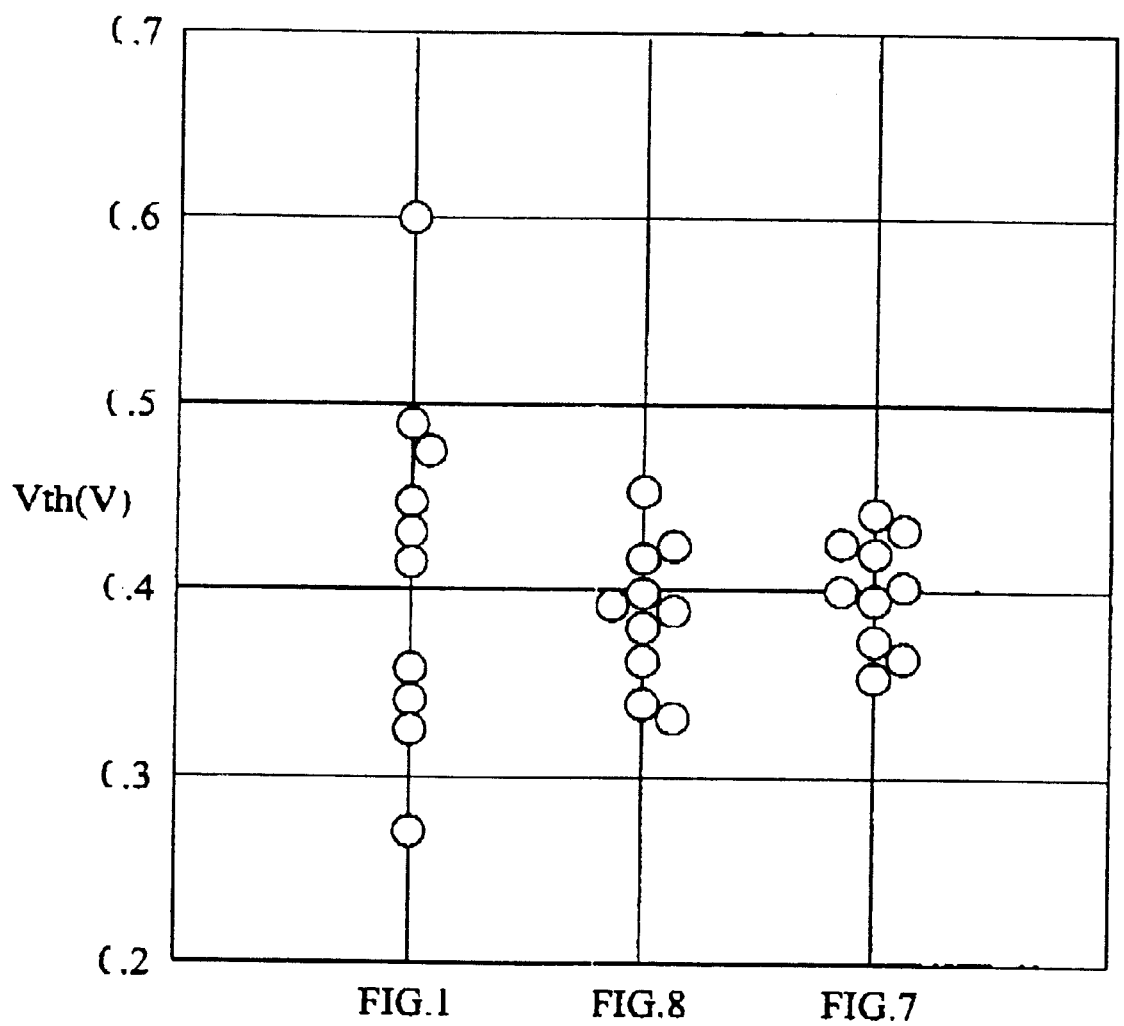

SEMICONDUCTOR DEVICE AND METHOD OF MANUFACTURING THE SAME

CROSS REFERENCE TO RELATED APPLICATIONS

The subject application claims benefit of the earlier filing dates of Japanese Patent Application Nos. Hei 11-345426 and 2000-12107 filed on Dec. 3, 1999 and Jan. 20, 2000 under the Paris Convention, the entire contents of which are incorporated by reference herein.

BACKGROUND OF THE INVENTION

1. Field of the Invention

The present invention relates to semiconductor devices such as MISFETs (metal insulator semiconductor field-effect transistors) capable of suppressing threshold voltage (Vth) variations due to a short channel effect or manufacturing variations. In particular, the present invention relates to MISFETs' impurity concentration profiles including channel impurity concentration profiles and counter impurity concentration profiles.

2. Description of the Related Art

It has been warned that micronization of a MISFET increases the influence of channel impurity concentration variations on Vth variations, to deteriorate the characteristics of the MISFET.

A CMOS (complementary metal oxide semiconductor) circuit may have a pMOSFET with an $n^+$ polysilicon gate and a counter-doped channel surface. The counter-doped channel surface has an opposite conductivity type from a channel conductivity type, thereby forming a buried channel. The buried channel will suffer from a short channel effect if the counter-doped channel surface is deep. The short channel effect is a phenomenon that a threshold voltage (Vth) drops as a gate length is shortened. When micronized, the pMOSFET must have a short gate length. If the gate length is shortened to a lithography control limit, a gate length variation will account for a significant part of the gate length and the short channel effect will vary the electric characteristics of the pMOSFET, to deteriorate yield of CMOS circuits. A micronized CMOS circuit must employ a low source voltage. To decrease source voltage, it is necessary to decrease the threshold voltage (Vth) of a transistor. The threshold voltage, however, increases in proportion to a substrate impurity concentration, which must be high to suppress the short channel effect. Namely, increasing a substrate impurity concentration to suppress the short channel effect results in deteriorating transistor characteristics.

To solve this problem, a counter-doped layer of high impurity concentration may be formed at the surface of a substrate. This may increase a substrate impurity concentration to suppress the short channel effect. The counter-doped layer of high impurity concentration, however, must be very shallow to provide a low Vth value. It is difficult to form such a shallow, high-impurity-concentration, counter-doped layer because the counter-doped layer is inevitably thickened by thermal impurity diffusion during high-temperature processes such as a gate insulating film forming process and an impurity activation process.

As mentioned above, a buried channel is formed when a channel impurity layer is counter-doped. For example, an n-type impurity distribution having a gentle concentration profile is formed in a substrate, and p-type impurities are introduced into a shallow area of the substrate to cancel the n-type impurity distribution at the substrate surface, as disclosed by I. C. Kizilyalli et al. in "$N^+$-Polysilicon Gate PMOSFETs with Indium Doped Buried-Channels," IEEE Electron Device Letters, vol. 17, pp 46–49, 1996. This technique introduces p-type counter impurities to form a shallow p-type region in a substrate. Compared with a deep profile, the shallow profile forms a channel closer to the substrate surface, to prevent an increase in the effective thickness of a gate insulating film and suppress the short channel effect. To cancel a high n-type impurity concentration around a pn junction, the p-type impurities to be introduced must be of high concentration. MOSFETs with buried channels and $n^+$ polysilicon gates are known to involve large Vth variations.

To meet a low source voltage, nMOSFETs as well as pMOSFETs are required to have low Vth values. A low Vth value is achievable by counter doping even if a channel impurity concentration is high. MOSFETs conventionally employ polysilicon gates that involve high gate resistance to hinder micronization. The gate resistance is reducible by replacing the polysilicon gates with metal gates. The metal gates provide a high work function, and therefore, an nMOSFET having a metal gate and a buried channel will simultaneously realize a low Vth value and a high channel impurity concentrations to suppress the short channel effect, as disclosed by A. Chatterjee et al. in "CMOS Metal Replacement Gate Transistors Using Tantalum Pentoxide Gate Insulator," IEDM 98, pp 777–780, 1998. However, there are no reports that described how to realize a low Vth value with a metal gate. It is even claimed that a surface channel is superior to a buried channel for a metal gate because the buried channel involves large Vth variations. Namely, a large problem with the metal gate is a channel impurity concentration profile.

SUMMARY OF THE INVENTION

As mentioned above, buried-channel MOSFETs involve large Vth variations, and the cause of such Vth variations has been unclear. The inventors clarify the cause as follows.

FIG. 1 is a model showing a typical impurity concentration profile in a semiconductor substrate under a gate oxide film of an nMOSFET having a buried channel. A horizontal axis represents depths from an interface between the gate oxide film and the surface of the substrate. A vertical axis represents impurity concentrations. A channel impurity concentration profile 1 represents a $p^+$ region containing channel impurities and is high and unchanged from the substrate surface to the inner part of the substrate. A counter impurity concentration profile 2 represents a counter-doped $n^+$ impurity layer whose conductivity type is opposite to the conductivity type of the channel impurity region. The counter profile 2 extends from the substrate surface to a depth of 10 nm. The counter profile 2 is higher than the channel profile 1 and is unchanged. Based on these profiles 1 and 2, Vth variations will be simulated.

FIG. 2 is a graph showing simulation results on typical buried channel structures. The graph shows counter impurity concentrations and corresponding threshold voltage (Vth) values, as well as counter impurity concentration variations and corresponding Vth variations. The simulations are based on a source voltage of 1 V and a drain electrode receiving 1 V to measure each Vth value. The channel impurity concentration profile 1 of FIG. 1 has a concentration of $2\times10^{18}$ cm$^{-3}$. In FIG. 2, an abscissa represents counter impurity concentrations and an ordinate Vth values and Vth variations due to variations in the counter impurity concentration profile 2 of FIG. 1. A curve with "+" marks indicates Vth values. A curve with squares indicates Vth variations when the counter profile 2 of 10 nm deep is made shallower by 0.5 nm to 9.5 nm. A curve with "Δ" marks indicates Vth variations when the impurity concentration of the counter profile 2 is reduced by 2%. These depth and concentration variations were selected to correspond to actual semiconductor device manufacturing variations. In FIG. 2, a low Vth value of 0.4 V is achievable with an increased counter impurity concentration of $5.3 \times 10^{18}$ cm$^{-3}$. At this concentration, the 0.5-nm-deep variation curve indicates a Vth variation of 50 mV, and the 2%-concentration variation curve indicates a Vth variations of 10 mV.

The cause of such variations will be studied in connection with an nMISFET.

A threshold voltage Vth of the MISFET is determined by a net impurity concentration profile irrespective of a channel impurity concentration profile or a counter impurity concentration profile. The net profile is a profile of net impurity concentrations, and each net in purity concentration is the absolute value of a difference between a p-type impurity concentration and an n-type impurity concentration at a given location. An impurity concentration is the concentration of electrically active impurities. Namely, an impurity concentration is an active impurity concentration and is not equal to a chemical concentration of impurity atoms. Generally, impurities introduced into a semiconductor to act as p- or n-type impurities have an electric activation ratio that is dependent on the kind and concentration of the impurities. Impurity concentrations referred in this specification are not chemical concentrations but are active concentrations representing electrically active impurities. Accordingly, the absolute value of an impurity concentration difference corresponds to a p-type impurity concentration if p-type impurities exceed n-type impurities and an n-type impurity concentration if n-type impurities exceed p-type impurities. This is because the charge of n-type impurities and the change of p-type impurities of the same concentration cancel each other. When a transistor starts to operate in response to a gate bias, a depletion layer grows toward the inner part of a substrate in which the transistor is formed. The depletion layer produces space charge due to net impurities therein, to form an electric field that determines the operation of the transistor. As the depletion layer expands, carriers (holes) are driven toward the inner part of the substrate. In the depletion layer, part of the space charge that is not canceled by the change of carriers (electrons or holes) helps form a channel electric field. The depletion layer is defined as a region where a carrier concentration is smaller than an impurity concentration by 10% or more.

To suppress the short channel effect, the depletion layer must stay around the substrate surface. To achieve this, the concentration of channel impurities must be high, and to cancel the high channel impurity concentration at the substrate surface, it is necessary to introduce counter impurities at high concentration. This is the reason why the counter impurity concentration profile 2 of FIG. 1 is high. Variations in the height or depth of the counter profile 2 vary the position of a pn junction or a net p-type impurity concentration profile around the pn junction. The channel impurity concentration profile 1 of FIG. 1 is also high, and therefore, variations in the channel profile 1 vary the pn junction position or a net n-type impurity concentration profile around the pn junction. In this way, the larger the channel and counter impurity concentration variations, the greater the variations in a net impurity concentration profile around a pn junction. The net impurity concentration profile determines a Vth value. If one of the p- and n-type impurity concentration profiles varies, a net impurity profile varies to change a Vth value. A buried-channel transistor more easily varies it Vth than a surface-channel transistor because the surface-channel transistor determines Vth according to a single impurity concentration profile while the buried-channel transistor determines Vth according to two impurity concentration profiles. Namely, the buried-channel transistor easily changes its channel structure due to variations in the net impurity concentration profile thereof.

The problem mentioned above is common to every transistor having a pn junction in a channel. Namely, the problem occurs on a surface-channel transistor that is formed by introducing n-type impurities into a shallow depth or at a low concentration, or by controlling the work function of gate electrode material, or by applying a substrate bias. The problem also occurs on a transistor whose channel is intermediate between the surface-channel transistor and the buried-channel resistor.

Generally, a gate electrode made of metal or metal compound has a work function in the middle of a silicon band gap. This configuration tends to increase a threshold voltage Vth in a MISFET. To drop Vth for micronization of a MISFET, a buried channel is uses as mentioned above. The buried channel, however, varies Vth to determine yield of micronized ICs. To provide a metal gate without a buried channel, metal having a work function at an end of the silicon band gap is effective. When employing such metal for gate electrodes, an nMISFET and a pMISFET in a CMOS circuit must be made different metal materials (dual gates), to complicate manufacturing processes and increase costs. In this way, micronization of metal gate MISFETs for a CMOS circuit involves a difficult task of finding a proper combination of work functions and channel profiles.

An object of the present invention is to provide a semiconductor device capable of suppressing Vth variations against the short channel effect or manufacturing variations.

Another object of the present invention is to provide a method of manufacturing a semiconductor device capable of suppressing Vth variations against the short channel effect or manufacturing variations.

Impurity concentration profiles that cause little Vth variations found by the inventors will be explained.

Based on the fact that overlapping p- and n-type impurity concentration profiles one another increases Vth variations, the inventors tried to find an optimum channel impurity concentration profile that reduces Vth variations.

FIG. 3 is a model showing a channel impurity concentration profile in a semiconductor substrate under a gate oxide film of a surface channel nMOSFET. A horizontal axis represents distances from an interface between the gate oxide film and the surface of the substrate, and a vertical axis represents channel impurity concentrations. First, it is assumed that a p$^+$ region of high impurity concentration constantly extends to the inner part of the substrate. In this case, a segment 4 and a dotted line 3 define a channel impurity concentration profile. As the nMOSFET is micronized, the threshold voltage Vth thereof increasingly varies due to the short channel effect. The short channel effect is suppressible by thinning the gate insulating film and by increasing the concentration of substrate impurities. The short channel effect is also suppressible by reducing the depth of a source or drain, in particular the drain, or both. In this example, the source-drain structure is unchanged, i.e., the depth of a source-drain layer junction is fixed to 35 nm, to study the influence of channel impurities on the short channel effect. For micronization, power consumption must be minimized, a source voltage must be dropped, and Vth must be decreased. To decrease Vth, the concentration of impurities at the substrate surface must be lowered. To achieve this, the dotted line 3 of the channel impurity concentration profile 1 is replaced with segments 5 and 6, to form a stepped channel impurity concentration profile. At the same time, the channel profile 1 may be changed to have a dotted line 7 because the short channel effect is suppressible if the segment 4 has a specified length.

To evaluate Vth variations with the stepped channel impurity concentration profile 1, the short channel effect that directly influences Vth variations must be quantized. FIG. 4 is a graph showing Vth variations with respect to gate length (L) variations. An abscissa represents gate lengths and an ordinate represents Vth values. A curve 8 represents gate lengths and corresponding Vth values. The shorter the gate length, the smaller the Vth value. This is the short channel effect. The shorter the gate length, the large the inclination of the curve 8. This inclination of the curve 8 is considered to indicate the magnitude of the short channel effect. To evaluate the inclination of the curve 8, the inventors worked to an SCE (short channel effect) range as follows:

$$(\text{SCE range:L}) = \text{Vth}(L+8\%) - \text{Vth}(L-8\%) \quad (1)$$

where L is an optional gate length, L+8%, is a gate length longer than L by +8%, Vth(L+8%) is a threshold voltage at L+8%, L−8% is a gate length shorter than L by 8%, and Vth(L−8%) is a threshold voltage at L−8%). The value of 8% in the expression (1) is optional and may be set in the range of gate length variations to be caused in MOSFET manufacturing processes, to evaluate Vth variations caused by manufacturing variations.

Effectiveness of the SCE ranges in evaluating the magnitude of the short channel effect will be studied according to the graph of FIG. 4. A gate length L1 corresponds to an SCE range R1 on the Vth axis, and a gate length L2 corresponds to an SCE range R2. The SCE range R2 is greater than the SCE range R1, and therefore, it is concluded that the SCE ranges are capable of quantizing the short channel effect. The curve 8 is alterable to a dotted line 9 or 10 by changing a corresponding impurity concentration profile. Namely, an impurity concentration profile that provides a minimum SCE range with respect to a given gate length (for example, L2) is a required impurity concentration profile. Vth variations caused by channel impurity variations are dependent on the structure of a channel. Vth variations in a transistor having a pn junction in a channel are dependent on a Vth value that is determined by gate material and a channel impurity concentration profile.

FIG. 5 is a graph showing Vth values and SCE ranges with respect to distances (the depths of the segment 5 in FIG. 3) from the surface of a semiconductor substrate to the step of a stepped impurity concentration profile (FIG. 3) in a metal-gate transistor. Values on the graph are based on simulations. The simulations were carried out on assumptions that the segment 4 of FIG. 3 corresponds to an impurity concentration of $5 \times 10^{18}$ cm$^{-3}$, the segment 6 of FIG. 3 corresponds to an impurity concentration of $1 \times 10^{17}$ cm$^{-3}$, and a gate length of 95 nm. In FIG. 5, an abscissa represents distances from the substrate surface to the step (the segment 5 of FIG. 3), and an ordinate represents Vth values and SCE ranges. A curve with squares indicates Vth values, and a curve with "Δ" marks indicates SCE ranges. It is understood that the deeper the low-impurity-concentration surface layer, the smaller the Vth value and larger the SCE range. A Vth value of 0.4 V is attained at a depth of 50 nm and an SCE range of 0 mV. The Vth curve at the depth of 50 nm shows that the Vth value will vary by 14 mV if the depth is reduced by 2.5 nm to 47.5 nm. This variation of 14 mV is a third of the Vth variation of 50 mV of FIG. 2. When the level of the segment 6 of FIG. 3 is lowered below $1 \times 10^{17}$ cm$^{-3}$, no substantial change is observed in the simulation results of FIG. 5, except that Vth slightly decreases. Consequently, the stepped profile of FIG. 3 causes smaller Vth variations with respect to impurity concentration variations, compared with the profile of FIG. 1. The stepped profile of FIG. 3 is effective to reduce Vth variations with respect to impurity concentration variations. It is required to further reduce the SCE range of the stepped profile of FIG. 3.

To achieve this, a first aspect of the present invention provides a semiconductor device having a first semiconductor region formed in a semiconductor substrate and having a first conductivity type (for example, p-type) due to first-conductivity-type active impurities contained in the first semiconductor region, and a second semiconductor region formed between the first semiconductor region and the surface of the semiconductor substrate and having a second conductivity type (for example, n-type) due to second-conductivity-type active impurities contained in the second semiconductor region. The second semiconductor region also contains first-conductivity-type active impurities whose concentration is zero or smaller than a quarter of the concentration of the second-conductivity-type active impurities contained in the second semiconductor region. The semiconductor device further has an insulating film formed on the surface of the semiconductor substrate over the second semiconductor region, a conductor formed on the insulating film, a third semiconductor region of the second conductivity type formed at the surface of the semiconductor substrate in contact with a side face of the second semiconductor region, and a fourth semiconductor region of the second conductivity type formed at the surface of the semiconductor substrate in contact with a side face of the second semiconductor region.

The first aspect realizes a low impurity concentration at a junction area and at the substrate surface and a small difference between a net impurity concentration and a p- or n-type impurity concentration. This reduces the influence of p- or n-type impurity concentration variations on a net impurity concentration, thereby suppressing Vth variations. For a metal-gate transistor that must have a pn junction in a channel due to a high work function, the first aspect suppresses Vth variations. The impurity concentration profiles of the first aspect are producible with a damascene gate process. PMISFETs and nMISFETs having metal gates according to the first aspect are capable of forming high-performance semiconductor IC chips at high yield.

According to the first aspect, the concentration profile of the first-conductivity-type impurities in the first semiconductor region may steeply decrease toward the substrate surface and may include a part where a concentration ratio per 3 nm is smaller than 0.9. This secures a high p-type impurity concentration region, suppresses the short channel effect, reduces a difference between a net impurity concentration profile in the n-type impurity region and an n-type impurity concentration profile in the same region, and suppresses Vth variations.

According to the first aspect, the concentration of second-conductivity-type impurities at the bottom of the second semiconductor region may be smaller than half the maximum concentration of first-conductivity-type impurities contained in a depletion layer formed during the operation of the semiconductor device. This secures a high p-type impurity concentration area, suppresses the short channel effect, decreases the concentration of n-type impurities, reduces the location dependence of the n-type impurity profile to suppress n-type impurity variations, and suppresses net n- and p-type impurity profile variations to suppress Vth variations.

According to the first aspect, at the bottom of the second semiconductor region, a concentration gradient of the second-conductivity-type impurities is smaller than that of the first-conductivity-type impurities. This provides the same advantage mentioned above.

According to the first aspect, the concentration of second-conductivity-type impurities at the bottom of a depletion layer formed during the operation of the semiconductor device may be smaller than a quarter of the maximum concentration of the first-conductivity-type impurities in the depletion layer. This decreases the concentration of n-type impurities in a part of the p-type impurity region that determines the characteristics of the MISFET, reduces a difference between a net p-type profile and a p-type profile, and suppresses Vth variations.

According to the first aspect, a peak concentration of the second-conductivity-type impurities in the second semiconductor regions is on the semiconductor substrate side of the second semiconductor region. This separates a main distribution of the second-conductivity-type (for example, n-type) impurities from the p-type impurities, reduces a difference between a net impurity concentration profile in the n-type region and an n-type-impurity concentration profile in the same region, and suppresses Vth variations.

According to the first aspect, the concentration of first-conductivity-type impurities may be smaller than half a peak concentration of second-conductivity-type impurities in the second semiconductor region at the peak concentration position of the second-conductivity-type impurities. For example, the concentration of p-type impurities is lower than half the concentration of n-type impurities at a peak of the n-type impurity concentration profile in the second semiconductor region, to decrease a difference between a net n-type impurity concentration profile and a n-type impurity concentration profile in the second semiconductor region to suppress Vth variations.

According to the first aspect, the concentration of first-conductivity-type impurities may be smaller than a quarter of the concentration of second-conductivity-type impurities at the substrate surface. For example, the concentration of p-type impurities at the substrate surface where Vth is strongly influenced by the p-type impurities is decreased below the concentration of n-type impurities. This reduces a difference between a net n-type impurity concentration profile and an n-type impurity concentration profile, to suppress Vth variations.

According to the first aspect, the concentration of second-conductivity-type impurities at the substrate surface may be smaller than two times the concentration of second-conductivity-type impurities at the bottom of the second semiconductor region, or smaller than two times a peak concentration of second-conductivity-type impurities in the second semiconductor region. At the same time, the concentration of second-conductivity-type impurities at the substrate surface may be greater than half the concentration of second-conductivity-type impurities at the bottom of the second semiconductor region. In this case, the second-conductivity-type (for example, n-type) impurities have a gentle concentration profile without localization. This suppresses n-type impurity variations, net n-type impurity variations, net p-type impurity variations, and Vth variations and makes the control of Vth values easier.

According to the first aspect, a concentration profile of the first-conductivity-type impurities in the first semiconductor region may sharply fall toward the substrate surface and may have a part where a concentration ratio per 1 nm is 0.9 or smaller. This secures a high-concentration area of first-conductivity-type (for example, p-type) impurities to suppress the short channel effect and reduces the concentration of n-type impurities to suppress Vth variations.

According to the first aspect, the first-conductivity-type impurities may be indium. When applied to nMISFETs, the indium provides a small diffusion coefficient to form a p-type impurity region.

According to the first aspect, the second-conductivity-type impurities may be phosphorus. The phosphorus has a large diffusion coefficient to form nMISFETs having a gentle n-type impurity concentration profile.

According to the first aspect, the second-conductivity-type, impurities may be antimony or arsenic. The antimony has a small diffusion coefficient to form nMISFETs having a narrow n-type impurity concentration profile, which may reduce an overlap area with a p-type impurity concentration profile. This secures a sufficient net p-type impurity concentration to suppress the short channel effect and Vth variations.

According to the first aspect, the first-conductivity-type impurities may be antimony or arsenic. The antimony or arsenic has a small diffusion coefficient to form a proper n-type impurity concentration profile for pMISFETs.

According to the first aspect, the second-conductivity-type impurities may be boron. The boron has a large diffusion coefficient to form pMISFETs having a gentle p-type impurity concentration profile.

According to the first aspect, the second-conductivity-type impurities may be indium. This indium has a small diffusion coefficient to form a pMISFET having a narrow p-type impurity concentration profile.

According to the first aspect, the conductor may be made of metal or metal compound. This reduces the resistance of a gate electrode and reduces an increase in the effective thickness of a gate insulating film due to interface depletion. This prevents the short channel effect, realizes a low Vth value for a MISFET without Vth variations.

The semiconductor device of the first aspect with the first conductivity type being p ad the semiconductor device of the first aspect with the first conductivity type being n may be formed on the same semiconductor substrate. This arrangement provides a metal-gate nMISFET and a metal-gate pMISFET of low gate resistance, no increase in the effective thickness of a gate insulating film, and little Vth variations. These semiconductor devices realize a high performance, low-power-consumption, semiconductor IC chip.

The semiconductor device of the first aspect with the first conductivity type being p and the semiconductor device of the first aspect with the first conductivity type being n may have conductors made of the same metal or the same metal compound. Producing pMISFETs and nMISFETs having the same gate material simplifies production processes and reduces manufacturing costs.

A second aspect of the present invention provides a method of manufacturing a semiconductor device, including a first step of introducing first-conductivity-type impurities into first and second regions of a semiconductor substrate, the first region being in the vicinity of the surface of the semiconductor substrate, the second region behind the first region away from the surface of the semiconductor substrate, a concentration profile of first-conductivity-type active impurities in the second region being at least four times higher than a concentration profile of first-conductivity-type active impurities in the first region, a second step of introducing second-conductivity-type impurities into the first region so that a concentration of second-conductivity-type active impurities in the first region is higher than a concentration of the first-conductivity-type active impurities in the first region, a third step of forming an insulating film on the substrate of the semiconductor substrate, a fourth step of forming a conductor on the insulating film, and a fifth step of forming a semiconductor region of the second conductivity type on each side of the conductor in contact with the second region. The semiconductor device thus formed has steep or narrow impurity concentration profiles.

According to the second aspect, the fifth step may be carried out first. Thereafter, an opening for implanting impurities is formed, the first step is carried out to introduce the first-conductivity-type impurities into the substrate through the opening, and the third and fourth steps are carried out. This method employs the damascene gate process to form a gate electrode conductor, to minimize heat treatment on the channel impurities implanted in the first step and realize a steep impurity concentration profile.

According to the second aspect, the second step may be carried out after the formation of the opening. This reduces heat treatment on the counter impurities implanted in the second step, to produce a narrow impurity concentration profile.

According to the second aspect, the second step may be carried out before the fifth step. When manufacturing an nMISFET (or a pMISFET with inverted polarities) by the damascene gate process, counter impurities are doped first, and a n-type impurity region at the surface is smoothly distributed by heat treatment. Ion implantation for making a channel is carried out after heat treatment for activating source and drain impurities. This minimizes heat treatment on p-type impurities, to secure a steep p-type impurity concentration profile.

According to the second aspect, the insulating film may be formed by chemical vapor growing. This implants channel impurities, and then, forms a gate insulating film at a low temperature without thermal oxidation, to secure a steep or narrow channel impurity concentration profile.

According to the second aspect, no step carried out after the fourth step may maintain temperatures higher than 850 degrees centigrade for more than 60 seconds. This reduces high-temperature heat treatment, secures a steep or narrow channel impurity concentration profile, and makes the control of impurity concentrations easier.

A third aspect of the present invention provides a semiconductor device having a semiconductor base layer containing first conductive impurities, a semiconductor layer formed on the base layer and having a groove whose bottom is the surface of the base layer, an insulator layer for covering the bottom and side walls of the groove, and a conductor layer formed in the groove on the insulator layer.

The semiconductor layer contains second conductive impurities whose conductivity type is opposite to the conductivity type of the first conductive impurities. The surface of the base layer has an impurity diffusion layer containing the second conductive impurities whose concentration is lower than the concentration of those in the semiconductor layer. The semiconductor layer with the groove forms a pattern that is identical to a pattern formed by the impurity diffusion layer.

A fourth aspect of the present invention provides a method of manufacturing a semiconductor device including the steps of preparing a semiconductor base layer containing first conductive impurities and forming a semiconductor layer on the base layer, the semiconductor layer containing second conductive impurities whose conductivity type is opposite to that of the first conductive impurities, forming an impurity diffusion layer by diffusing part of the second conductive impurities contained in the semiconductor layer into the surface of the base layer, forming a groove in the semiconductor layer after the impurity diffusion layer forming step, the groove having a bottom that is the surface of the base layer, forming an insulator layer on the semiconductor layer, to cover the bottom and side walls of the groove and leave a space in the groove, and forming a conductor layer on the insulator layer to fill at least part of the space in the groove.

The impurity diffusion layer is formed by solid-phase-diffusing, the second conductive impurities contained in the semiconductor layer into the surface of the base layer, before forming the groove for the conductor layer. The impurity diffusion layer corresponds to conventional MISFETs source and drain extensions and a counter dope layer for a buried channel. Namely, the impurity diffusion layer serves as the extensions and counter dope layer. Unlike the prior art that forms the counter dope layer separately from the extensions after the formation of a groove, the fourth aspect of the present invention maintains a constant contact state between a source-drain diffusion layer and a channel region. Compared with ion implantation, the solid-phase diffusion of the fourth aspect is easy to form a thin impurity diffusion layer. The fourth aspect, therefore, provides a metal gate MISFET capable of sufficiently suppressing the short channel effect, lowering a threshold voltage, and minimizing characteristics variations.

The fourth aspect forms the semiconductor layer and an element isolation film to surround the semiconductor layer. The second conductive impurities are solid-state-diffused into an element region surrounded by the element isolation film. When seen orthogonally to the principle plane of the base layer, the semiconductor layer and impurity diffusion layer are identical with the element region before the formation of the groove. Namely, the semiconductor layer pattern including the groove is identical with the impurity diffusion layer pattern.

The fourth aspect forms the impurity diffusion layer by solid-phase-diffusing the second impurities from the semiconductor layer into the surface of the base layer, so that the thickness and concentration of the impurity diffusion layer are uniform under the semiconductor layer and under the conductor layer. The fourth aspect not only makes the impurity diffusion layer pattern identical with the semiconductor layer pattern including the groove but also makes the thickness and impurity concentration of the impurity diffusion layer uniform.

The fourth aspect forms the insulator layer and conductor layer in the groove by successively filling at least part of the groove with the layers and by removing parts of the layers outside the groove by, for example, CMP. The element isolation film is used as a stopper for the CMP. Before the CMP, the top of the semiconductor layer may be flush with or higher than the top of the element isolation film, and the CMP puts them substantially in the same plane.

As mentioned above, the present invention provides a high-performance semiconductor device having micronized transistors that are resistive to impurity concentration variations caused by processing variations, and a method of manufacturing such a semiconductor device. The present invention also provides a metal-gate MISFET capable of suppressing the short channel effect with the use of impurity concentration profiles having a pn junction in a channel. The MISFET realizes a low Vth value and suppresses Vth variations caused by impurity concentration variations. The metal-gate MISFET is superior to a polysilicon-gate transistor in performance and is able to provide fine ICs at high yield.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

BRIEF DESCRIPTION OF THE DRAWINGS

FIG. 7A shows net impurity concentration profiles under a gate insulating film of a semiconductor device according to the present invention;

FIG. 7B shows a channel impurity concentration profile and a counter impurity concentration profile corresponding to the profiles of FIG. 7A;

FIG. 34 is a graph showing Vth variations with respect to statistical variations in the numbers or arrangements of channel and counter impurity atoms;

DESCRIPTION OF THE PREFERRED EMBODIMENTS

Figure 1:
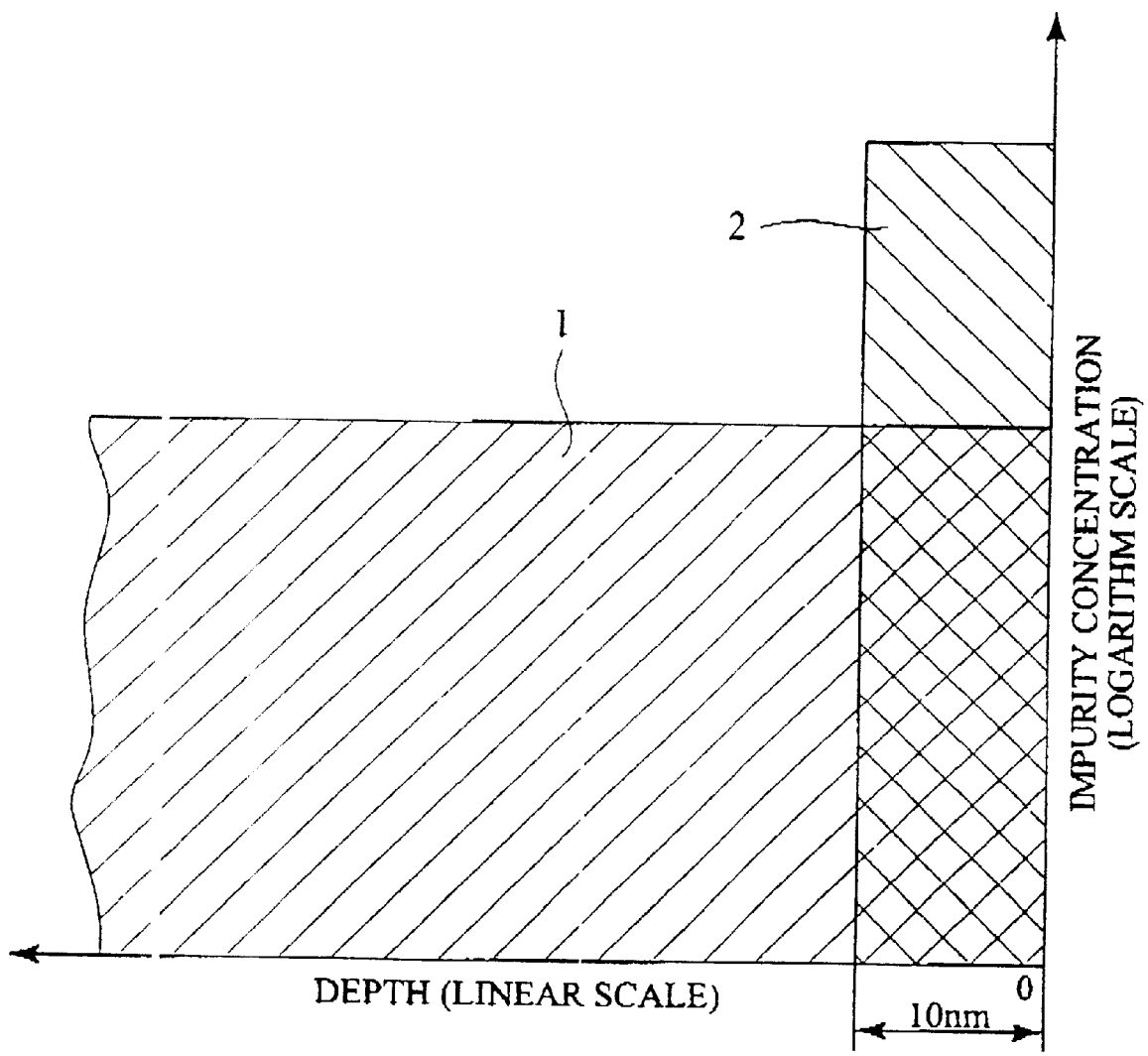
FIG. 1 shows typical impurity concentration profiles to form a buried channel under a gate oxide film of an nMOSFET.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Figure 6A:
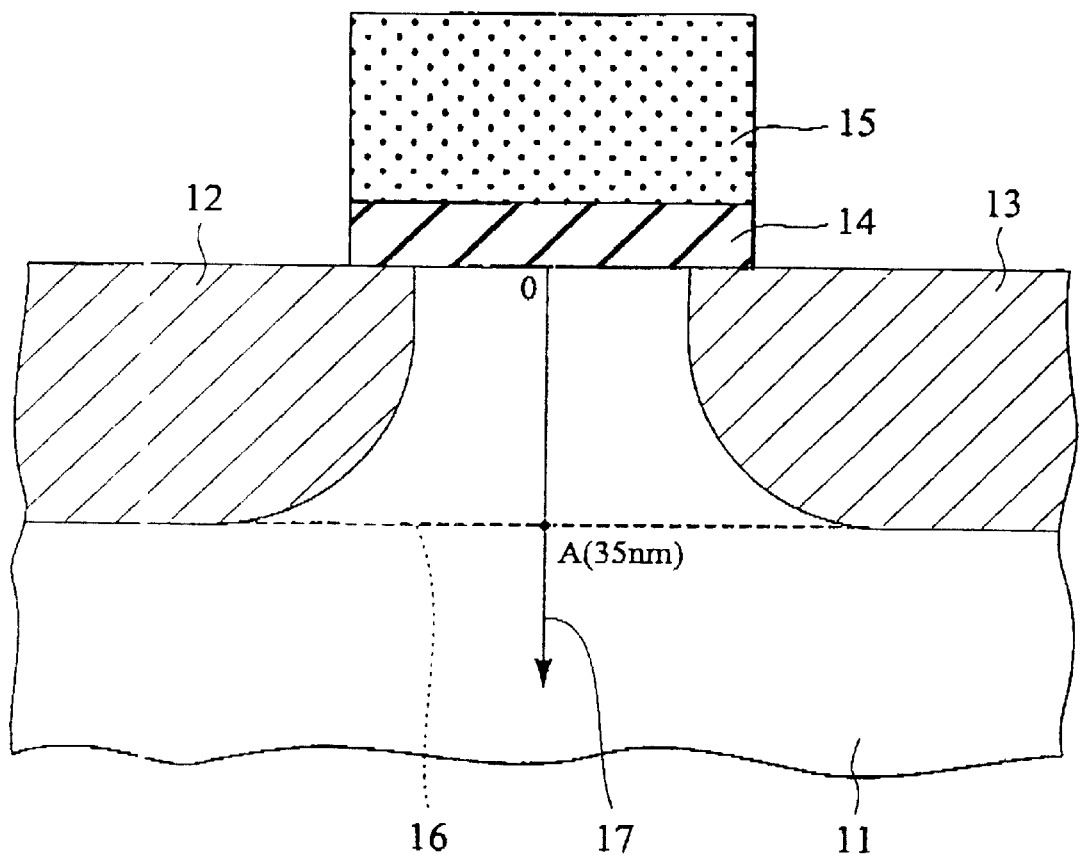
FIGS. 6A to 6C are sectional views showing a MOSFET.

FIG. 6A is a sectional view showing a typical MOSFET. The MOSFET has a substrate 11, a source region 12, a drain region 13, a gate insulating film 14, and a gate electrode 15. A coordinate axis 17 is set for the sake of convenience. The axis 17 has a zero point on an interface between the surface 11 and the insulating film 14 and has a positive direction into the inner part of the substrate 11. The zero point of the axis 17 is not limited to the one showing in FIG. 6A and may be set at an optional position excluding the source and drain regions 12 and 13. The bottoms of the source and drain regions 12 and 13 define a plane 16, which intersects the axis 17 at a depth A. The depth A is usually about 35 nm.

FIGS. 7A and 7B show basic impurity concentration profiles for semiconductor devices according to the present invention. In FIGS. 7A and 7B, a horizontal axis corresponds to the axis 17 of FIG. 6A. A vertical axis of FIG. 7A represents net impurity concentrations, and a vertical axis of FIG. 7B represent channel and counter impurity concentration. The difference between a channel impurity concentration and a counter impurity concentration at each depth in FIG. 7B forms a net impurity concentration at the same depth in FIG. 7A.

In FIG. 7A, first-conductivity-type impurities form a net concentration profile 18 below a depth B. The profile 18 may be constant or may have a smaller concentration area as indicated with a dotted line 21. Second-conductivity-type impurities form a net concentration profile 19 between a depth 0 and the depth B. The level of the profile 19 is preferably smaller than a maximum of the profile 18. It is preferable that the depth B is shallower than the depth A of FIG. 6A. The first and second conductivity types are opposite to each other. If the first conductivity type is n, then the second conductivity type is p. If the first conductivity type is p, then the second conductivity type is n.

In FIG. 7B, channel impurities form a concentration profile 1. The level of the profile 1 is low between the depth 0 and the depth B and high below the depth B. The low level of the profile 1 may be zero. On the other hand, counter impurities form a concentration profile 2 between the depth 0 and the depth B. Between the depth 0 and the depth B, the level of the profile 2 is greater than that of the profile 1. Namely, a high impurity concentration area is formed around the depth of a junction of the source and drain regions 12 and 13, and the high impurity concentration area sharply decreases toward the surface of the substrate 11. At the same time, a low-concentration impurity area of opposite polarity is formed in the surface area.

According to studies made by the inventors, a MOSFET channel containing counter impurities causes smaller Vth variations with respect to impurity concentration variations that are caused by processing variations, if the difference between the concentration of channel or counter impurities and a net impurity concentration is small and if cancellation between the channel and counter impurities is substantially nil. If both the channel and counter impurities have high concentrations, their respective variations will severely affect a net impurity concentration profile that is resonant from cancellation between the channel and counter impurities. If there is little cancellation between the channel and counter impurities, a concentration of counter impurities at the surface of a substrate can be lowered to suppress Vth variations because absolute concentration variations due to processing variations are low at low concentrations.

When a transistor is micronized, the number of impurity atoms in a channel depletion layer of the transistor decreases, and statistical variations in the number or arrangement of the impurity atoms increasingly affect Vth variations. Studies on such statistical variations have not satisfactorily been done even among persons skilled in the art. The inventors found that the influence of variations in the number and arrangement of impurity atoms on Vth variations increases as the concentration of counter impurities at a substrate surface increases with respect to a given Vth value. Accordingly, the present invention tries to reduce Vth variations by sharply dropping the concentration of channel impurities, which is high to suppress the short channel effect, at the surface of a substrate and by lowering the concentration of counter impurities at the substrate surface to provide a required low Vth value.

In this specification, the concentration or number of impurity atoms is the concentration or number of active impurity atoms and is not equal to the chemical concentration of impurities. Generally, the active impurity concentration is smaller than the chemical impurity concentration, and the ratio of the active impurity concentration to the chemical impurity concentration is called an activation ratio. Impurities introduced into silicon by, for example, ion implantation are partly active, and inactive impurities are activated by heat treatment. The activation ratio of impurities decrease as the concentration of impurities increases. The activation ratio usually decreases in the vicinity of a substrate surface or an interface between a substrate surface and a gate insulating film. A typical channel region involves an impurity concentration of about $5 \times 10^{18}$ $cm^{-3}$, and at this concentration, most kinds of impurities are 100% activated by annealing. At a substrate surface, however, this activation ratio is hardly secured. The buried channel impurity concentration profile of FIG. 1 has a high-concentration impurity area at a substrate surface, to decrease the activation ratio. On the other and, the active impurity concentration profile of FIG. 7B has a high-concentration channel impurity area at the inner part of a substrate with a sufficient activation ratio. At the substrate surface, FIG. 7B has no high-concentration impurity area, and therefore, secures a high activation ratio. The impurity concentration profiles of FIG. 7B are effective to suppress Vth variations. An actual chemical impurity distribution can be examined with the use of an impurity analyzing technique such as SIMS. When designing channel profiles and ion implantation energy, the profiles of FIG. 7B need no consideration on an activation ratio decrease at a substrate surface. Securing the high channel profile 1 of FIG. 7B is important to suppress the short channel effect. To form the high channel profile 1 of FIG. 7B, impurities of about $5 \times 10^{18}$ $cm^{-3}$ are introduced until the activation ratio of the area starts to decrease. At this time, the steepness of the high impurity concentration toward a low impurity concentration in the vicinity of a substrate surface differs between an active impurity concentration profile and a chemical impurity concentration profile obtained by SIMS. In an area where the activation ratio starts to decrese, the steepness of the active impurity concentration profile is gentler than that of the chemical impurity concentration profile. Accordingly, the channel impurity concentration profile 1 of FIG. 7B must be designed, according to activation ratios, to sharply decrease toward a substrate surface and keep a sufficient low level at the substrate surface. The activation ratios affect, in particular, steepness around a concentration peak, and the activation ratio of the channel profile 1 at the substrate surface is usually sufficient. The steepness of the active impurity concentration profile can be confirmed from a chemical impurity concentration profile obtained by SIMS.

Figure 6B:
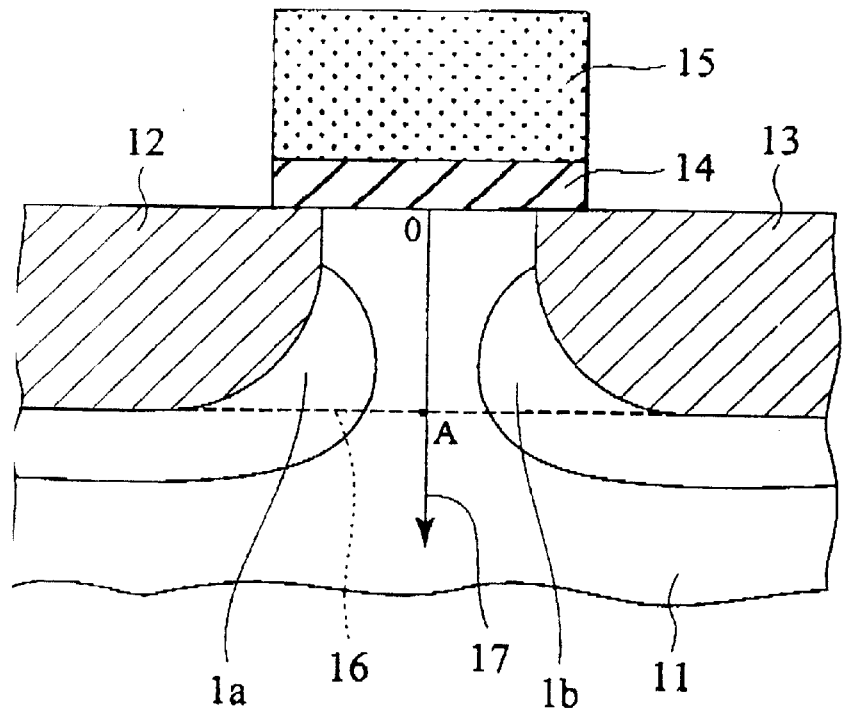

To suppress the short channel effect due to micronization, a halo region is frequently used. This will be explained with reference to FIGS. 6B to 6C. In FIG. 6B, a halo region 1a is formed in a channel region in the vicinity of a source region 12, and a halo region 1b is formed in the channel region in the vicinity of a drain region 13. The halo regions 1a and 1b contain each a relatively high concentration of first-conductivity-type impurities compared with the channel region that is also the first conductivity type. The halo regions 1a and 1b may overlap each other at the center of the channel region, to form an overlapping area 1c of FIG. 6C. In this case, the channel impurity concentration profile 1 covers the regions 1a, 1b, and 1c. In this specification, the channel impurity concentration means the concentration of first-conductivity-type impurities including impurities in the halo regions.

There are several counter impurity concentration profiles depending on situations. An example will be explained in connection with an nMOSFET having a mid-gap gate electrode made of metal whose Fermi level agrees with the center energy level of a silicon band gap. This gate material is also applicable to a pMOSFET by inverting the polarities of channel and counter impurities because the pMOSFET and nMOSFET have the same gate and substrate energy bands with opposite polarities.

A work function difference between the substrate and gate electrode of a metal-gate nMOSFET is smaller than that of an n$^+$-polysilicon-gate nMOSFET, and therefore, the threshold voltage Vth of the metal-gate nMOSFET is higher than that of the n$^+$-polysilicon-gate nMOSFET. To reduce the Vth value of the metal-gate nMOSFET, counter impurities are applied to a conventional buried channel. The inventors found through simulations that the conventional buried channel greatly increases Vth variations due to impurity concentration variations.

Accordingly, the present invention employs two types of channel structures for metal-gate nMOSFETs depending on the Vth values thereof. If there are no counter impurities on the surface side of p-type channel impurities, a high Vth value and a surface channel are formed. Adding counter impurities gradually decreases Vth and gradually changes the surface channel into a buried channel. If a Vth value is between those of the surface and buried channels and if a channel is formed in the vicinity of a substrate surface, the conventional problem of an increase in the effective thickness of a gate insulating film will not occur. In this case, the conventional technique for a buried-channel pMOSFET of introducing counter impurities to a shallow area provides no benefit of improving electric characteristics.

A channel structure just before becoming a buried channel provides a Vth value of about 0.4 V in the case of a mid-gap metal gate. If Vth is below 0.4 V, a channel appears below a substrate surface, to increase the effective thickness of a gate insulating film.

Figure 8A:
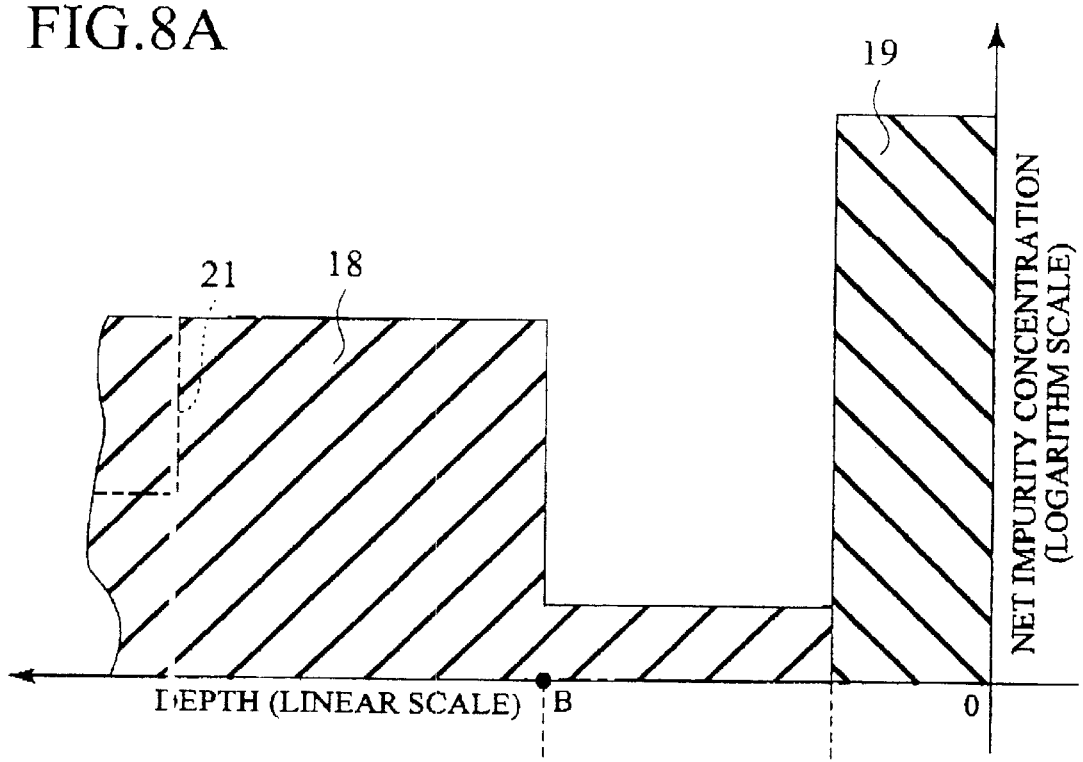
FIGS. 8A to 10B show impurity concentration profiles under a gate insulating film of a semiconductor device modified from the profiles of FIGS. 7A and 7B.
Figure 8B:
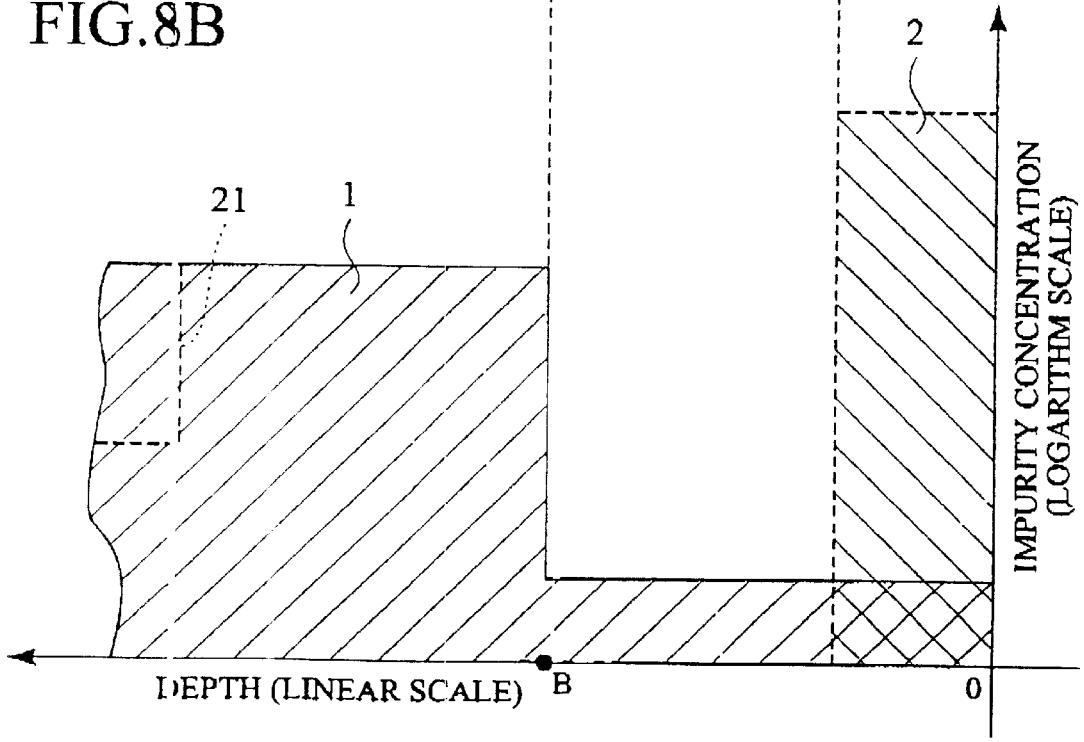

FIG. 8B shows a counter impurity concentration profile 2 applicable for a mid-gap metal gate nMOSFET with Vth being below 0.4 V (for pMOSFET, an absolute value of Vth being below (0.4 V) with a buried channel, or for a pMOSFET having an n$^+$ polysilicon gate and a buried channel. Like the profile of FIG. 7B, a channel impurity concentration profile 1 of FIG. 8B steeply decreases at a substrate surface, and a counter impurity concentration profile 2 provides a required Vth value. The counter profile 2 ends in the vicinity of the substrate surface, to suppress an increase in the effective thickness of a gate insulating film. If the Fermi level of the metal gate electrode deviates from a mid-gap, Vth deviates accordingly. If the Fermi level deviates from the mid-gap toward a conduction band by xV, an interface Vth value between a surface channel and a buried channel will be (0.4−x) V for an nMOSFET and −(0.4+x) V for a pMOSFET. FIG. 8A shows net impurity concentration profiles representing the absolute values of differences between the channel impurity concentrations and the counter impurity concentrations of FIG. 8B.

Figure 9A:
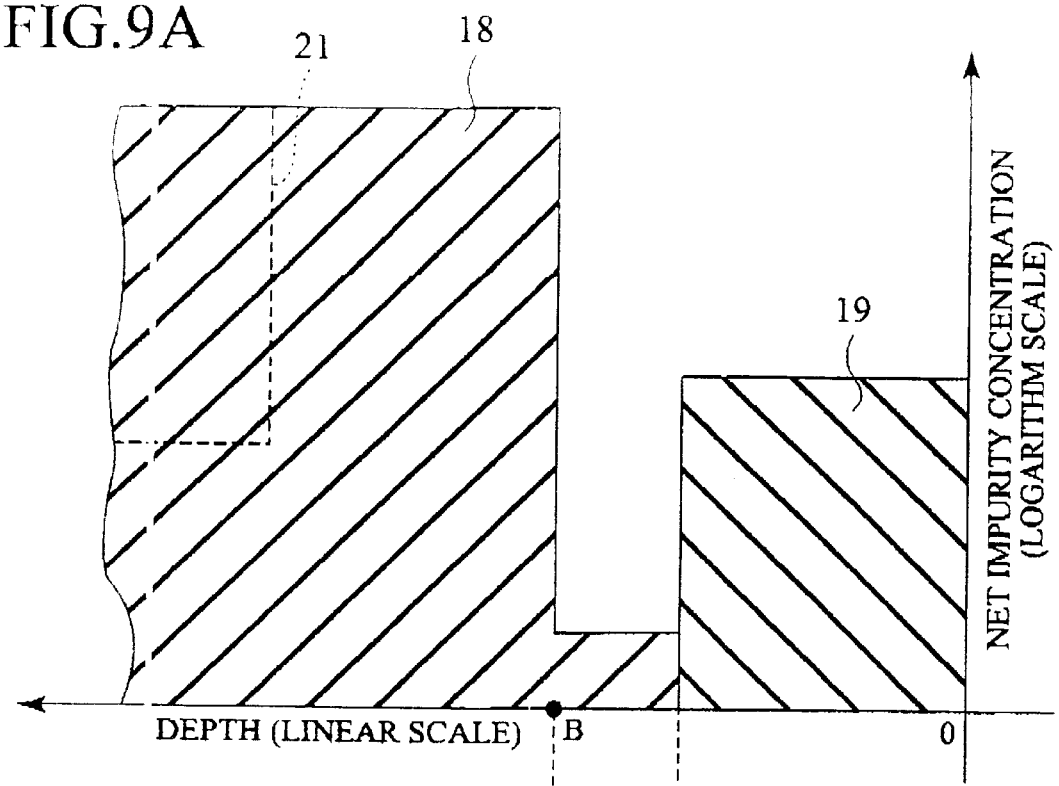
Figure 9B:
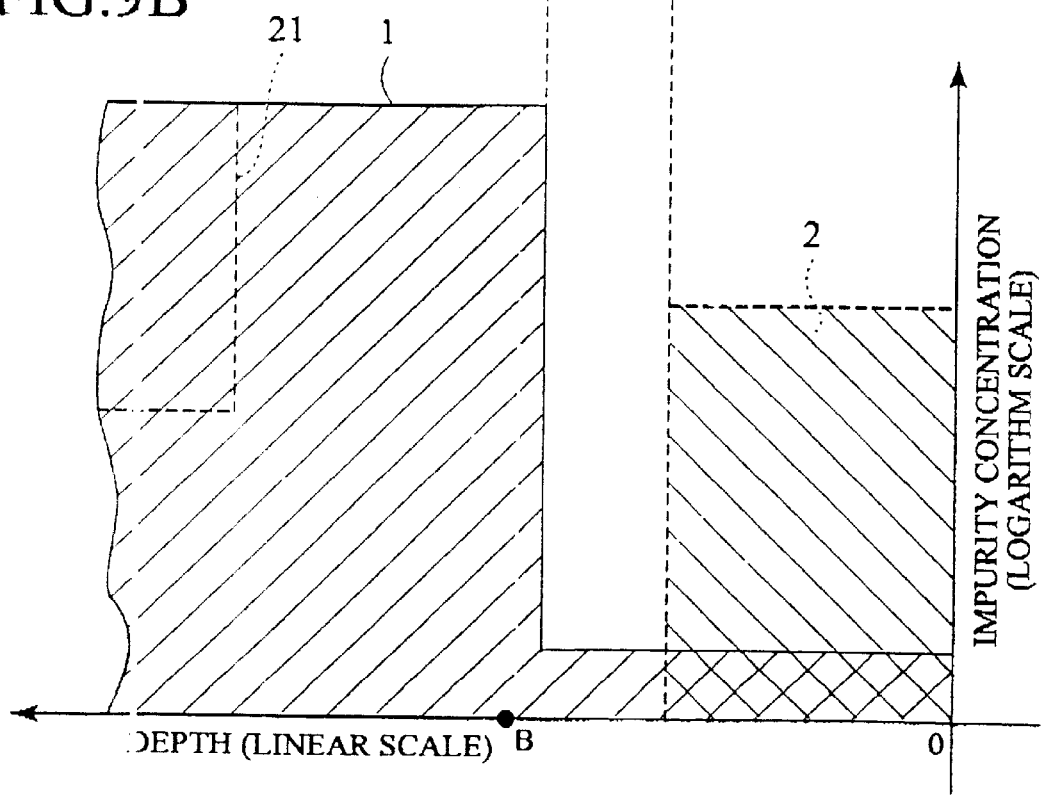
Figure 10A:
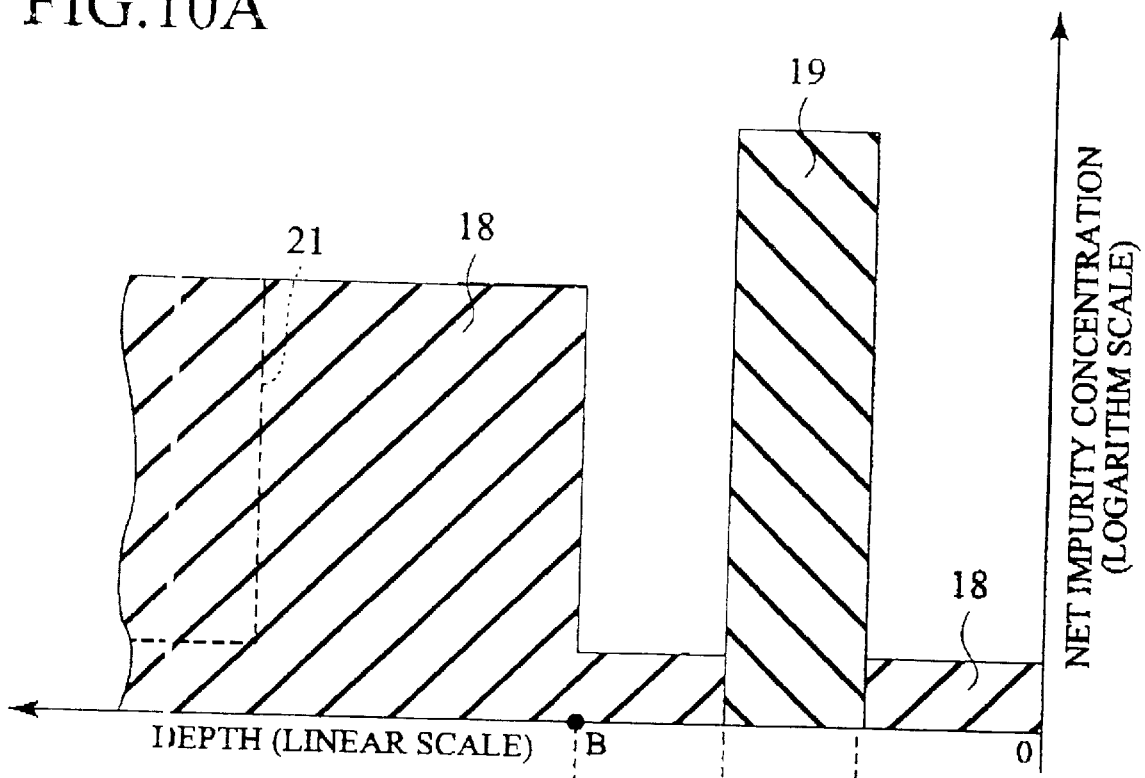
Figure 10B:
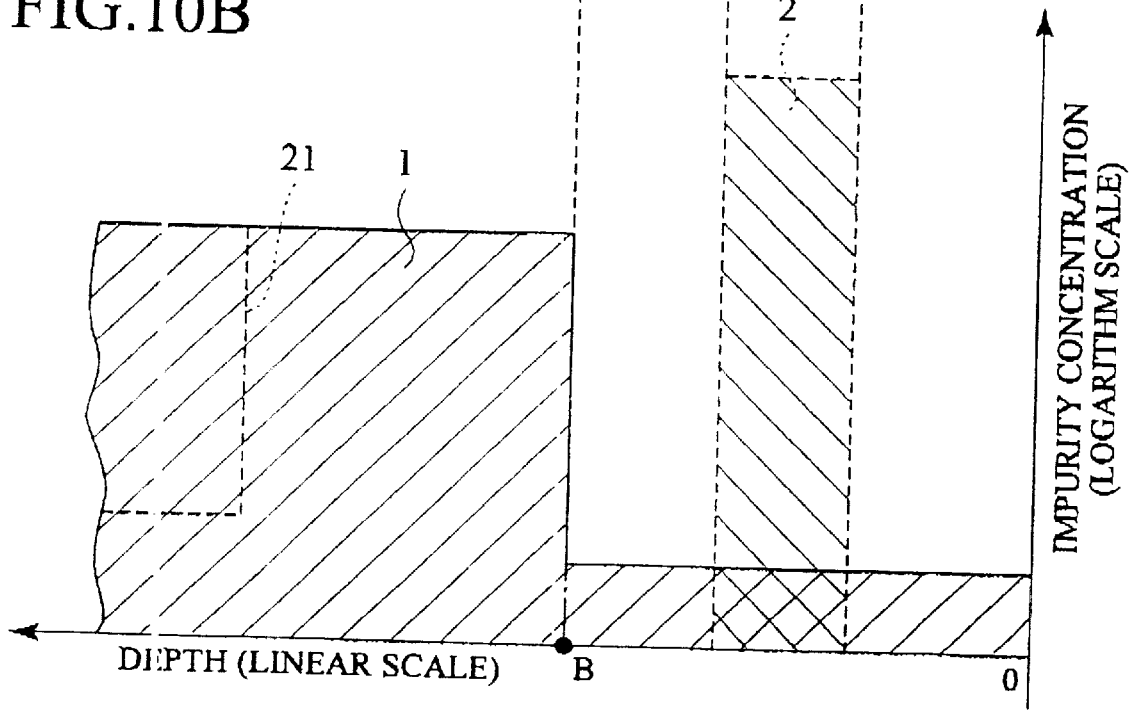

FIGS. 9B and 10B show counter impurity concentration profiles 2 applicable when Vth is above an interface value between the surface channel and buried channel of a metal-gate nMOSFET (for a pMOSFET, the absolute value of Vth is greater than the interface value). In this case, there is no need of forming a shallow counter impurity profile, as mentioned above. The profiles of FIGS. 9B and 10B shows a low impurity concentration at a pn junction between p-type channel impurities and n-type counter impurities, so that no concentration cancellation occurs at the pn junction. The counter profiles 2 of FIGS. 9B and 10B are applicable when the concentration of active p-type channel impurities is insufficient to suppress the short channel effect, because the n-type counter impurities do not cancel the p-type channel impurities. In FIG. 10B, the concentration of counter impurities at a substrate surface is low to maintain the mobility of channel carriers (electrons or holes) and increase a current value. It is difficult, however, to form the narrow counter profile 2 of FIG. 10B in a shallow low-concentration surface layer without variations. Accordingly, this profile is employable only when precision process control is carried out.

If the counter impurity layers of FIGS. 9B and 10B are wide, they properly suppress Vth variations due to process variations. It is preferable to widen each n-type counter impurity layer to an extent not to cancel active p-type impurities. Channel impurity concentration profiles 1 of FIGS. 9B and 10B are the same as the profile 1 of FIG. 7B. FIG. 9A shows net impurity concentration profiles corresponding to the absolute values of differences between the channel impurity concentrations and the counter impurity concentrations of FIG. 9B. FIG. 10A shows net impurity concentration profiles corresponding to the absolute values of differences between the channel impurity concentration and the counter impurity concentrations of FIG. 10B.

FIGS. 11A, 11B, 12A, and 12B show impurity concentration profiles applicable when the concentration of active p-type channel impurities is sufficiently high to suppress the short channel effect.

Figure 11A:
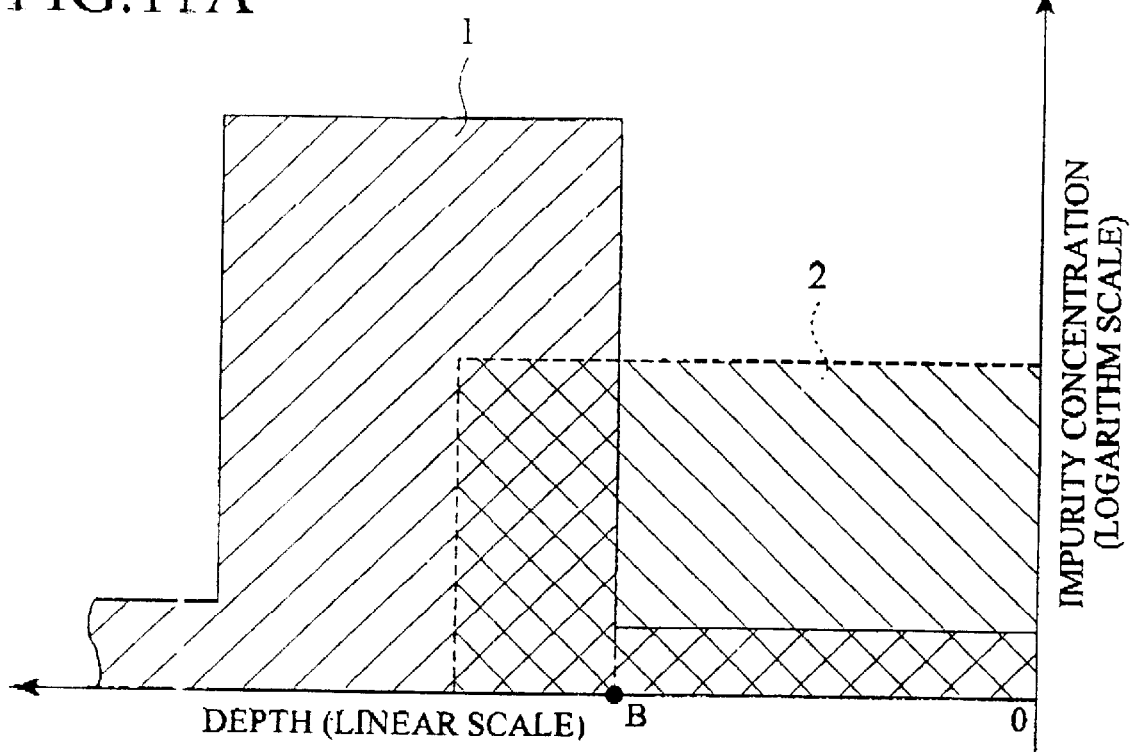
FIGS. 11A to 12B show impurity concentration profiles under a gate insulating film of a semiconductor device modified from the profile of FIG. 7B.
Figure 11B:
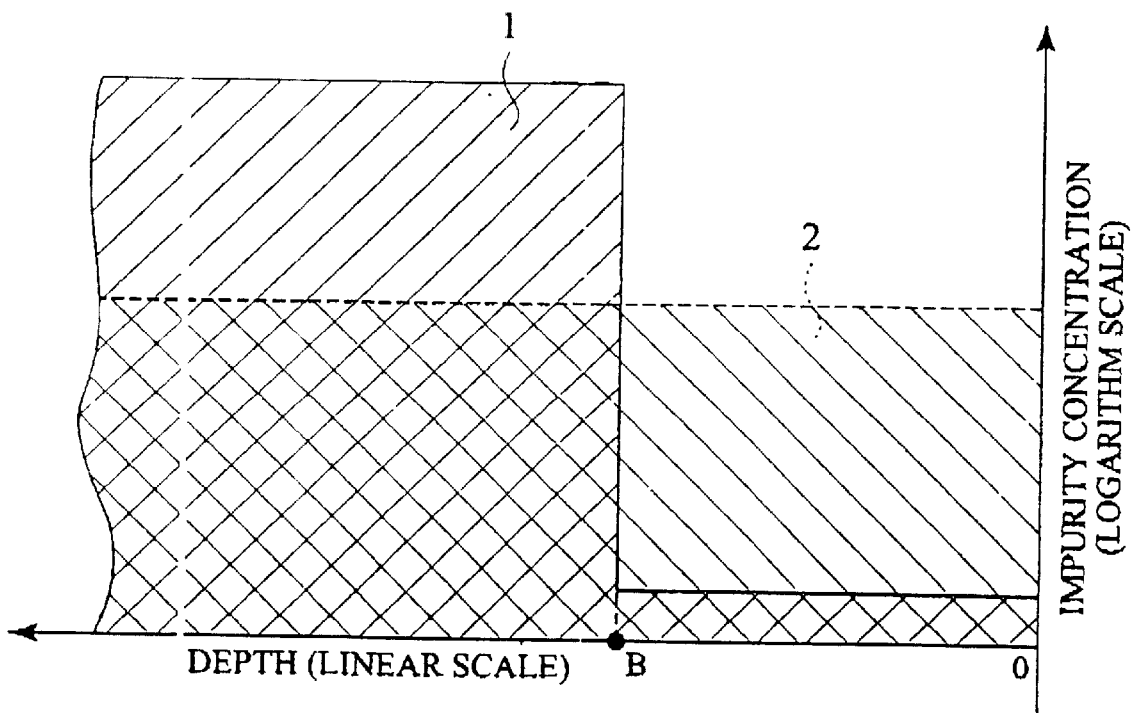

In FIG. 11A, the concentration of p-type channel impurities steeply decreases in the vicinity of a substrate surface, and the concentration of n-type counter impurities is low. A counter impurity concentration profile 2 overlaps a channel impurity concentration profile 1. The channel profile 1 steeply drops in the vicinity of the substrate surface, so that the low-concentration counter impurities provide a required low Vth value. The low-concentration counter impurities cancel little channel impurities, so that sufficient channel impurities are secured to suppress the short channel effect. FIG. 11B shows an n-type impurity concentration profile 2 that extends to the inner part of a substrate. This profile is applicable when a sufficient concentration of p-type impurities is securable.

Figure 12A:
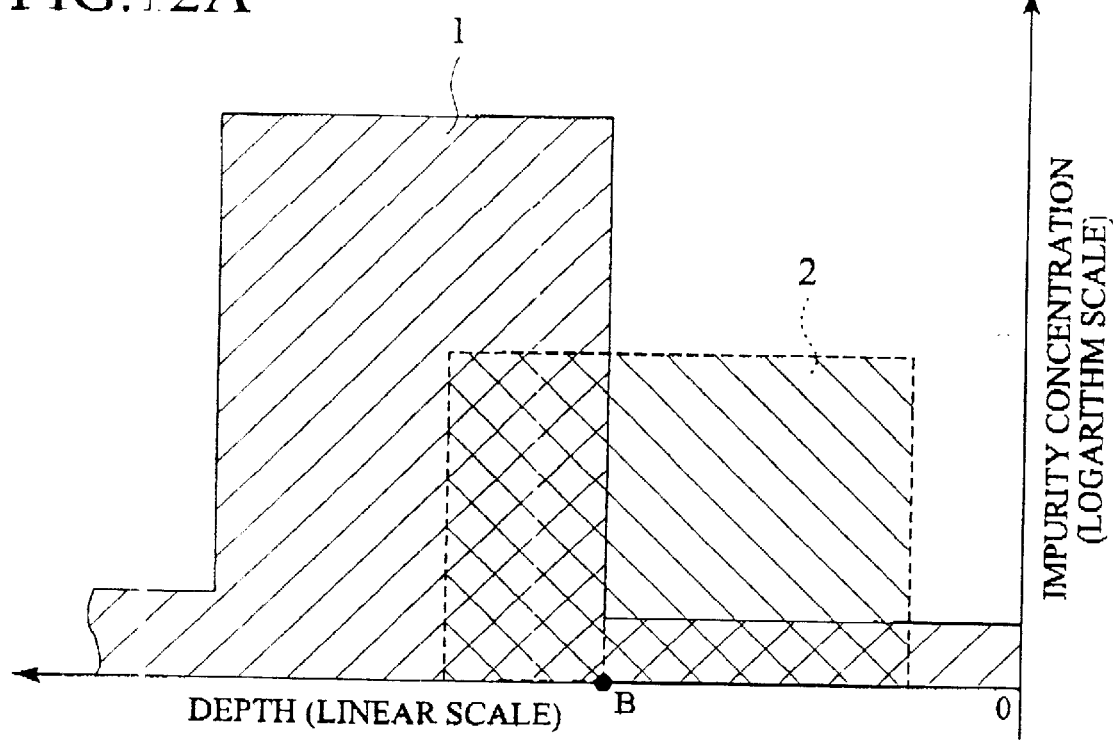
Figure 12B:
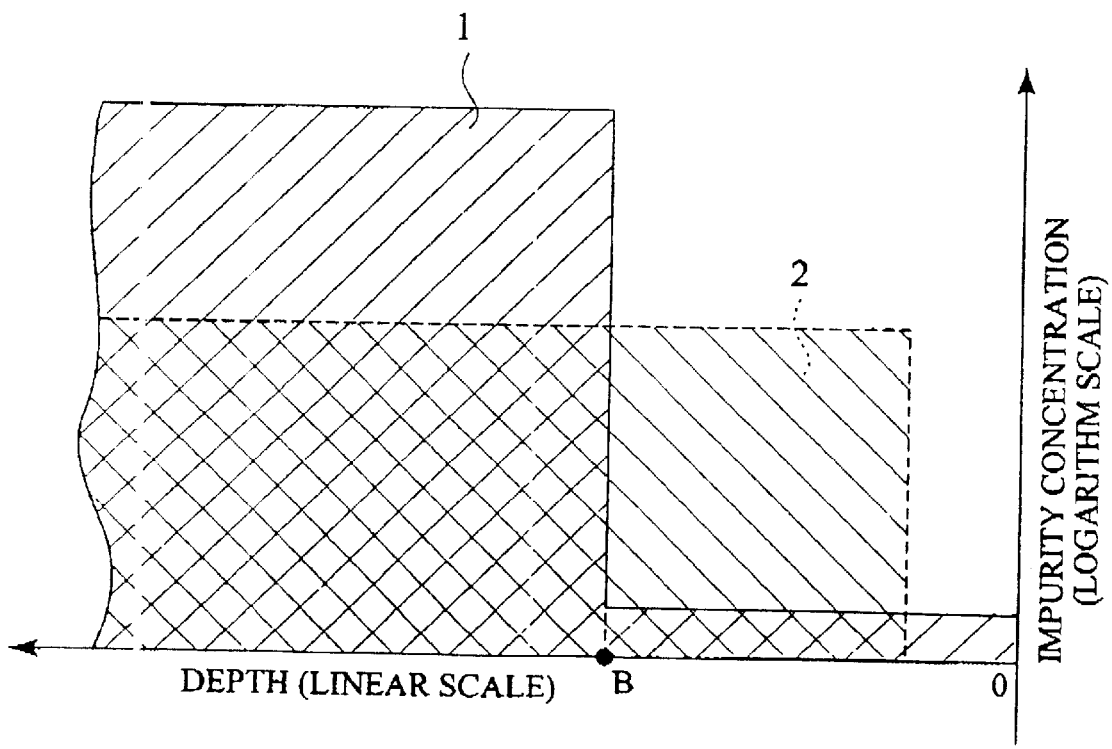

FIG. 12A shows an n-type counter impurity concentration profile 2 that is low at a substrate surface. The inventors found that, for a very fine MOSFET, Vth variations affected by the number and arrangement of impurity atoms are suppressible by removing atoms at a substrate surface. Vth variations are caused partly by first-conductivity-type impurity variations and partly by second-conductivity-type impurity variations. Increasing the concentration of second-conductivity-type impurities cancels Vth variations caused by first-conductivity-type impurity variations, to decrease total Vth variations. At an interface between a surface channel and a buried channel, Vth variations become minimum. Further increasing the concentration of second-conductivity-type impurities again increases Vth variations. In FIG. 12A, a p-type channel impurity concentration profile 1 sharply decreases near the substrate surface to reduce statistical variations. The n-type counter impurity concentration profile 2 is low in a surface area and is minimized at the substrate surface, to further reduce Vth variations due to statistical variations in the number and arrangement of impurity atoms. The Vth variations suppressing effect of FIG. 12A is particularly effective when a channel is sufficiently buried to provide a required Vth value. The counter profile 2 may extend to the inner part of the substrate as shown in FIG. 12B.

A very fine transistor involves Vth variations due to statistical variations that easily occur in the number and arrangement of reduced impurity atoms in a channel region. This problem is usually discussed in connection with a surface channel. In the surface channel where channel carries are distributed, Vth variations are mostly caused by channel impurities. The inventors found that Vth variations are particularly caused by impurities on the substrate surface side of a channel depletion layer.

In the case of a buried channel, Vth variations are also caused by process variations when forming a shallow counter impurity concentration profile. No studies have been made on relationships between the statistical variations mentioned above and buried channels, and therefore, there are no countermeasures for Vth variations caused by the statistical variations.

The concentration of counter impurities may be increased at a substance surface and may steeply be decreased at a depth where channel carriers are produced, to suppress statistical variations in the number and arrangement of impurity atoms acting on the channel carriers. This technique may improve transistor characteristics by suppressing an increase in the effective thickness of a gate insulating film. However, the technique is insufficient to suppress Vth variations caused by statistical variations of impurity atoms.

In the case of a buried channel, the influence of statistical variations in the number and arrangement of impurity atoms on Vth variations must be studied more precisely than in the case of a surface channel.

Figure 13A:
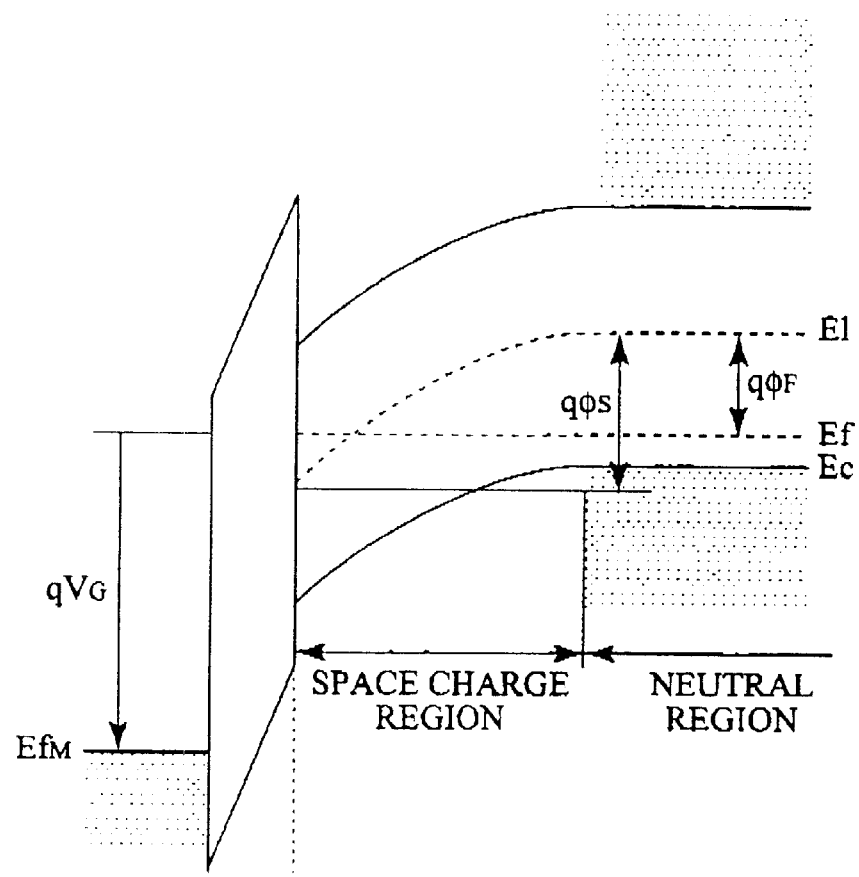
FIG. 13A shows an energy band of an nMOSFET.
Figure 13B:
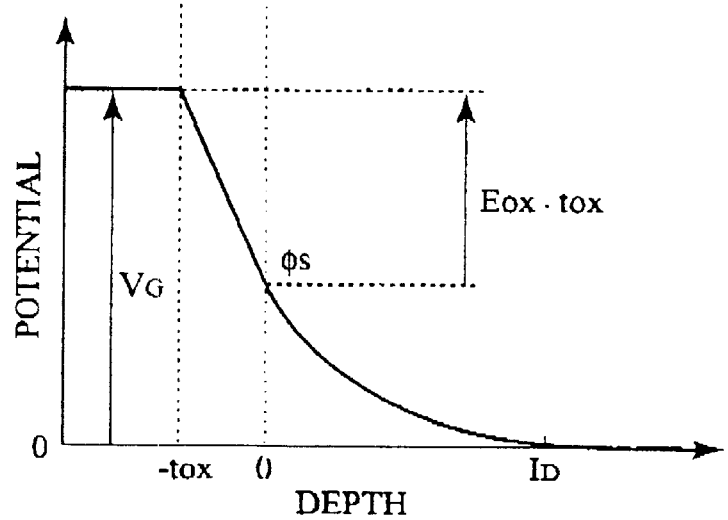
FIG. 13B is a graph showing potential in a depth direction of the nMOSFET of FIG. 13A.

In FIGS. 13A and 13B, electric potential that determines a gate bias VG is lower than electric potential $\Phi s$ at the surface of a silicon substrate by the thickness tox of a gate insulating film due to an inclination determined by an electric field Eox at the substrate surface.

Figure 14:
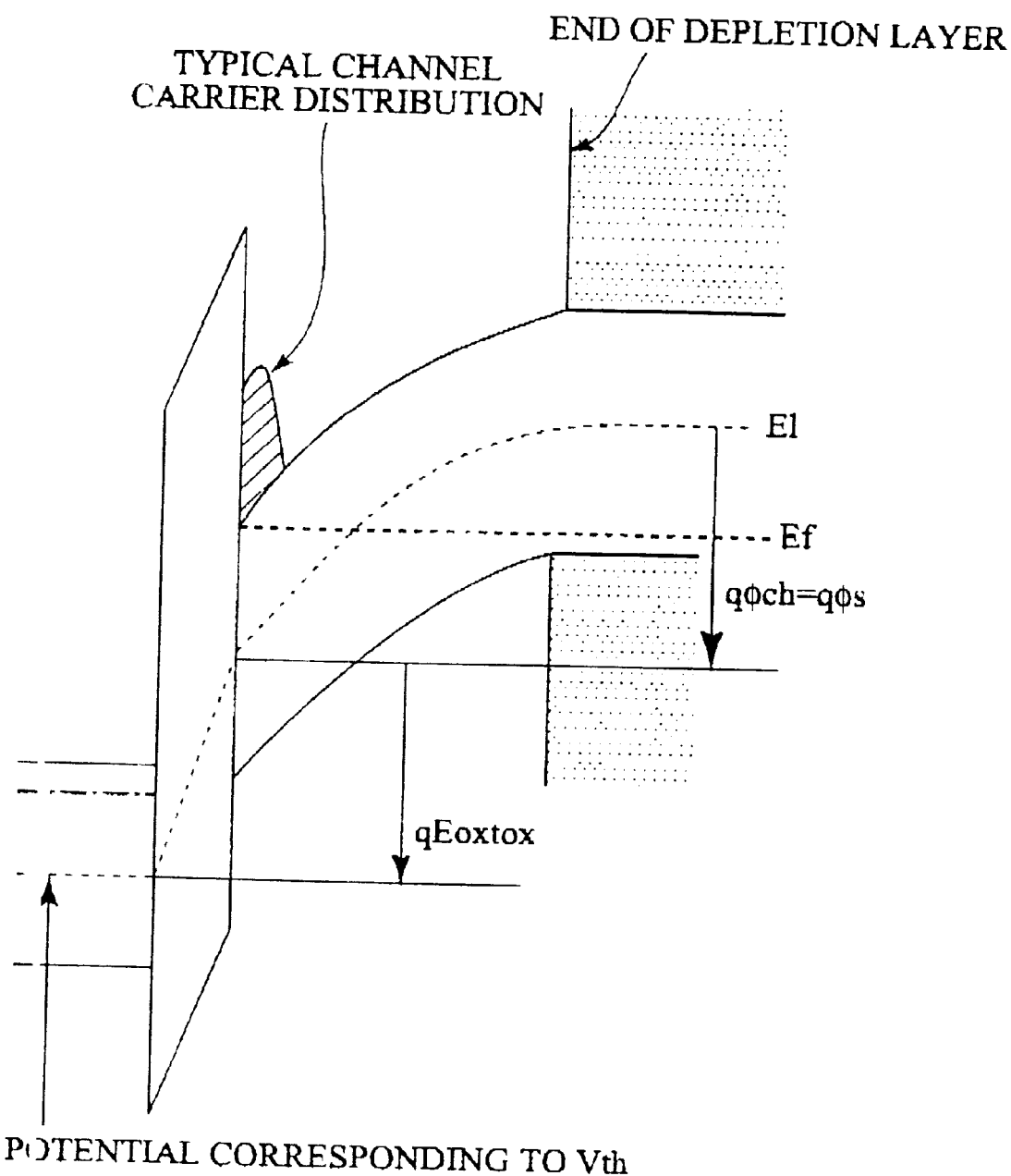
FIG. 14 shows an energy band of a surface-channel nMOSFET.
Figure 15:
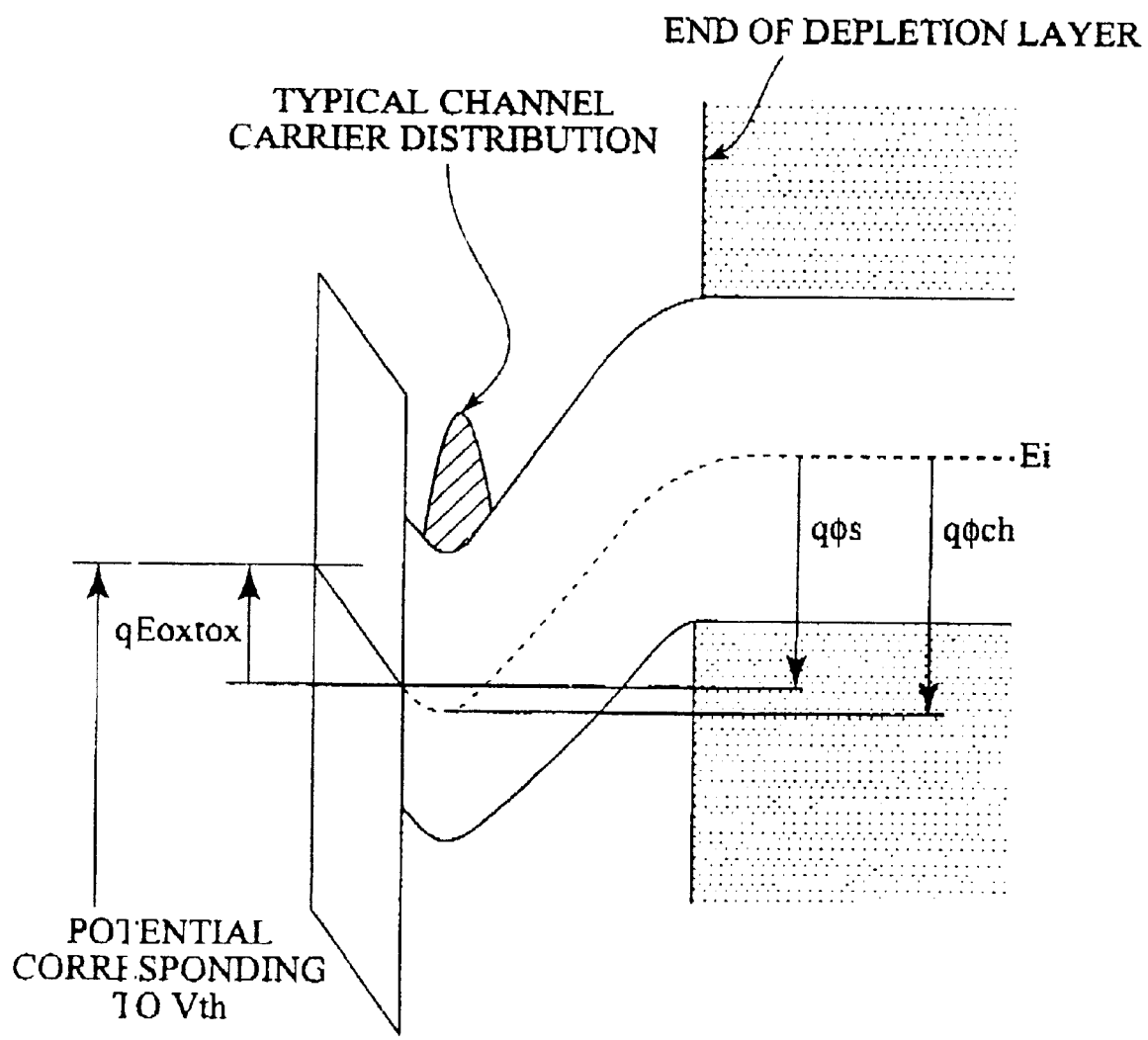
FIG. 15 shows an energy band of a buried-channel nMOSFET.

In FIG. 14, a surface channel has channel carriers at a substrate surface, and electric potential $\Phi ch$ at the channel carrier position is equal to $\Phi s$. A distribution of carriers in the surface channel extends according to an electron wave function. $q\Phi ch$ must be potential at the gravity position of the carrier distribution and is shifted from the substrate surface by several nanometers. Statistical variations of impurity atoms in a depletion layer vary $\Phi ch$ and Eox, thereby varying Vth. Eox is an electric field reaching the gate electrode. Impurity atoms closer to the gate electrode, i.e., the substrate surface have larger influence on $\Phi s$.

In the case of a surface channel, a surface position that provides the largest influence on $\Phi s$ is a position where a channel is formed. The influence of impurity atom variations on electric potential at the channel position increases as surface impurity variations increase. Namely, the channel position and the position where the influence of impurity variations is large coincide with each other.

Figure 16:
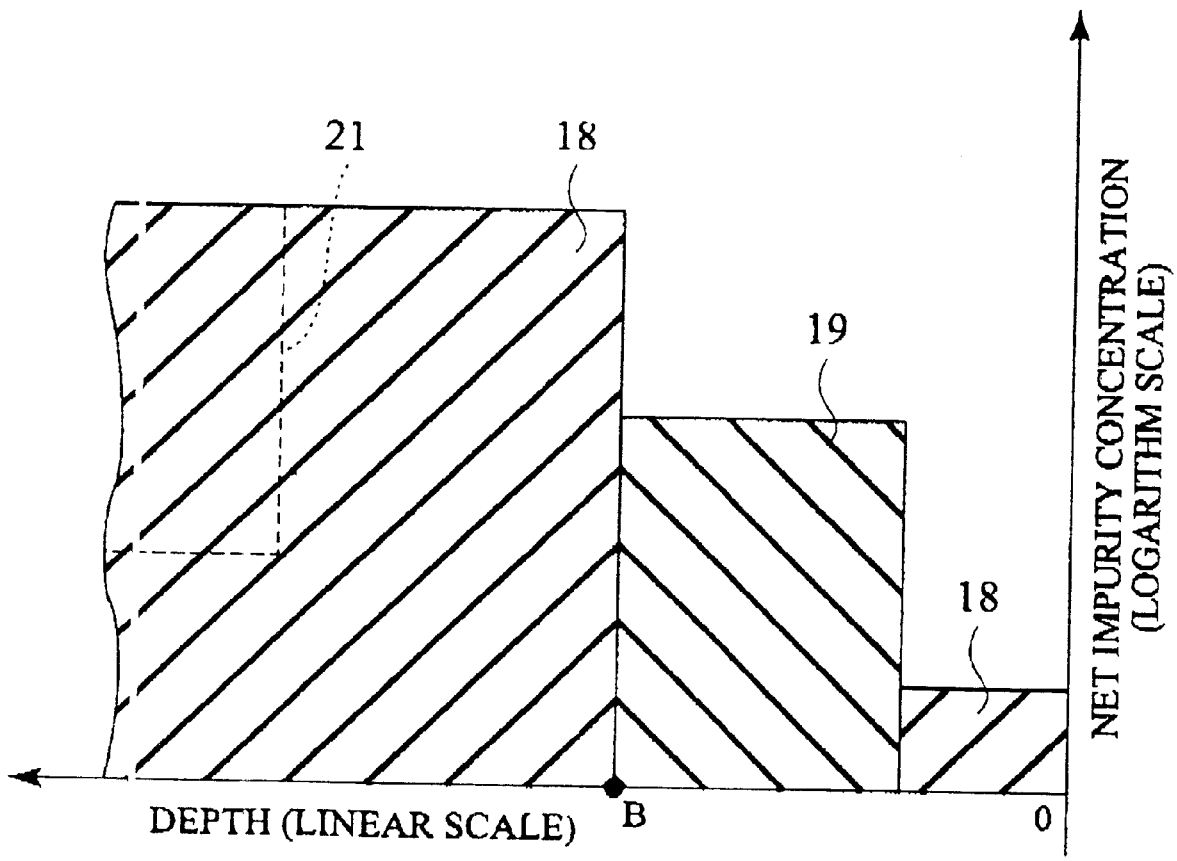
FIG. 16 shows impurity concentration profiles under a gate insulating film of a semiconductor device modified from the profile of FIG. 7A.

In the case of a buried channel, $\Phi s$ variations vary potential corresponding to a Vth value. $\Phi s$ is greatly influenced by impurity concentration variations at a substrate surface. To suppress the influence of impurity atom variations on electric potential at the buried channel, the concentration of counter impurities at a depth where channel carriers are produced may be decreases and the concentration of counter impurities at a substrate surface may steeply be increased. However, the high concentration of counter impurities at the substrate surface vary impurity charge at the substrate surface in the vicinity of a gate electrode, to increase $\Phi s$ variations as well as Vth variations. Namely, Vth variations due to statistical variations of impurity atoms must be suppressed by suppressing variations in net impurity concentration profiles 18 and 19 of FIG. 16 in the vicinity of a substrate surface instead of a channel position. This suppresses $\Phi x$ variations as well as Eox variations. In particular, decreasing, or preferably, zeroing the concentration of counter impurities at a substrate surface as shown in FIGS. 12A and 12B is effective to suppress Vth variations. Similarly, decreasing, or ideally, zeroing the concentration of channel impurities at a substrate surface without worsening the short channel effect is effective to reduce Vth variations caused by statistical variations of impurity atoms. FIG. 16 shows net impurity concentrations corresponding to the absolute values of differences between the channel impurity concentrations and the counter impurity concentrations of FIGS. 12A and 12B. If the concentration of channel impurities at a substance surface is low, the concentration of counter impurities will be decreased to provide a required Vth value and suppress Vth variations due to statistical variations.

In the case of a buried channel, lowering the concentration of counter impurities at the surface of a substrate and increasing the same at the inner part of the substrate may increase the effective thickness of a gate insulating film, to cause an S factor deterioration and the short channel effect. To avoid this, a surface counter impurity layer is needed.

When a transistor having counter impurities shows a surface channel, it is effective to employ a channel impurity concentration profile that sharply decreases at a substrate surface and a counter impurity concentration profile that is low at the substrate surface. Since a channel is formed at the substrate surface, there is no increase in the effective thickness of a gate insulating film and there is little need of forming a shallow counter impurity layer. Decreasing a gate bias below Vth gradually drives carriers to the inner part of a substrate depending on a counter impurity distribution. Therefore, a shallow counter layer that is capable of maintaining a small current with respect to a zero gate bias is sufficient. In the case of a metal gate, a channel impurity distribution containing a counter impurity layer realizes a Vth of about 0.4 V in a surface channel area.

Figure 2:
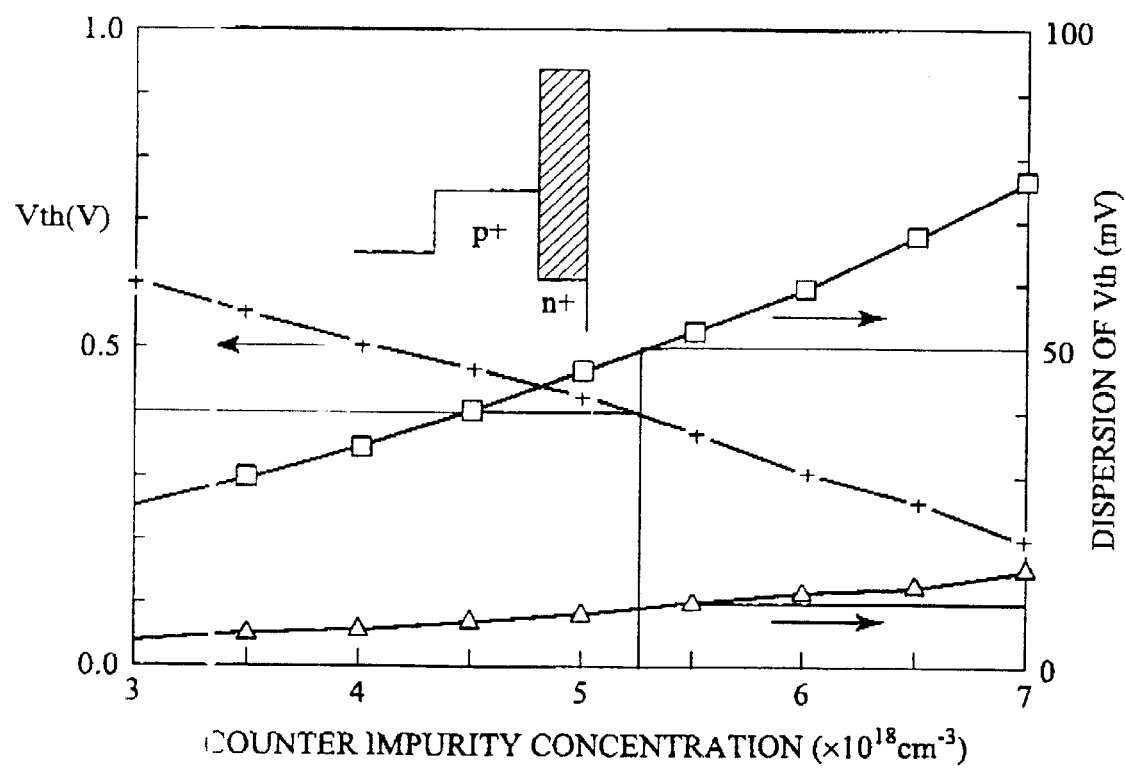
FIG. 2 is a graph showing Vth variations and counter impurity concentration variations with respect to counter impurity concentrations in a buried-channel, metal-gate MOSFET.
Figure 3:
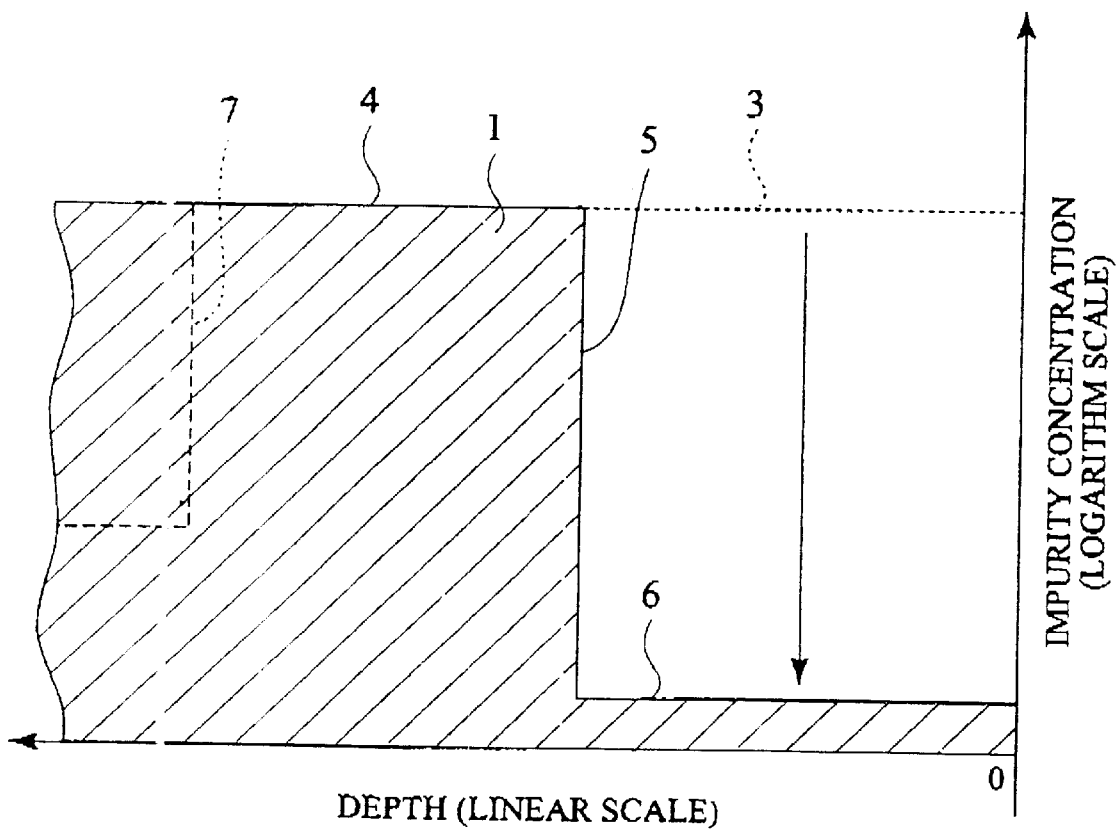
FIG. 3 shows a stepped channel impurity concentration profile to form a surface channel under a gate oxide film of an nMOSFET according to a basic idea of the present invention.
Figure 4:
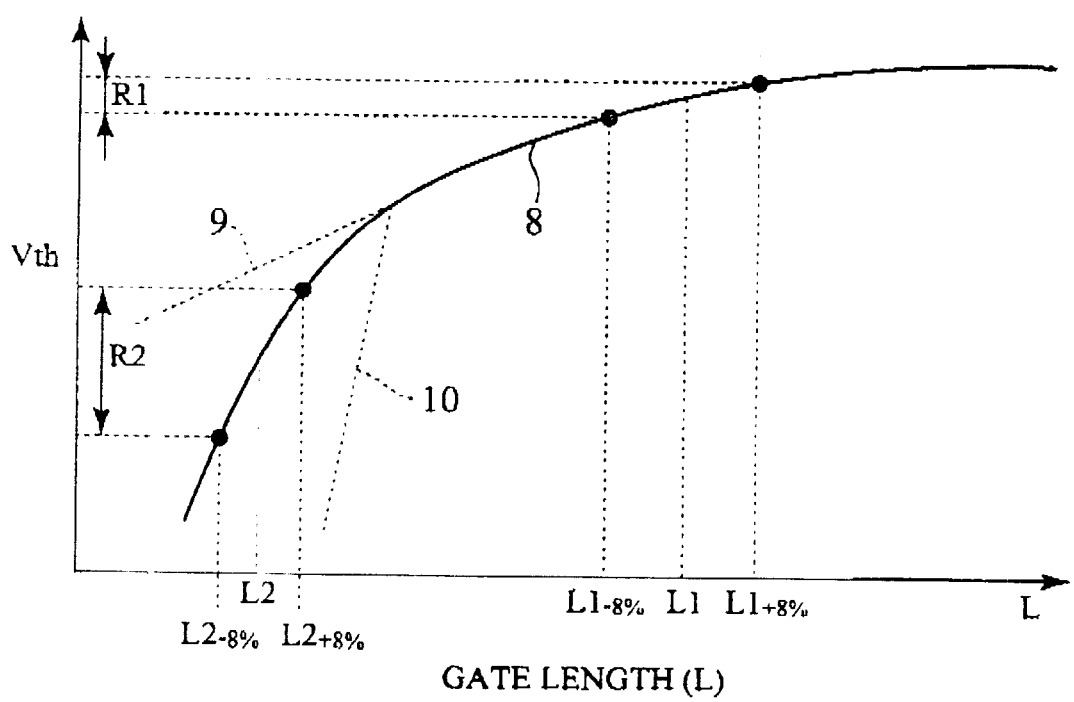
FIG. 4 is a graph showing Vth variations with respect to gate length (L) variations.
Figure 5:
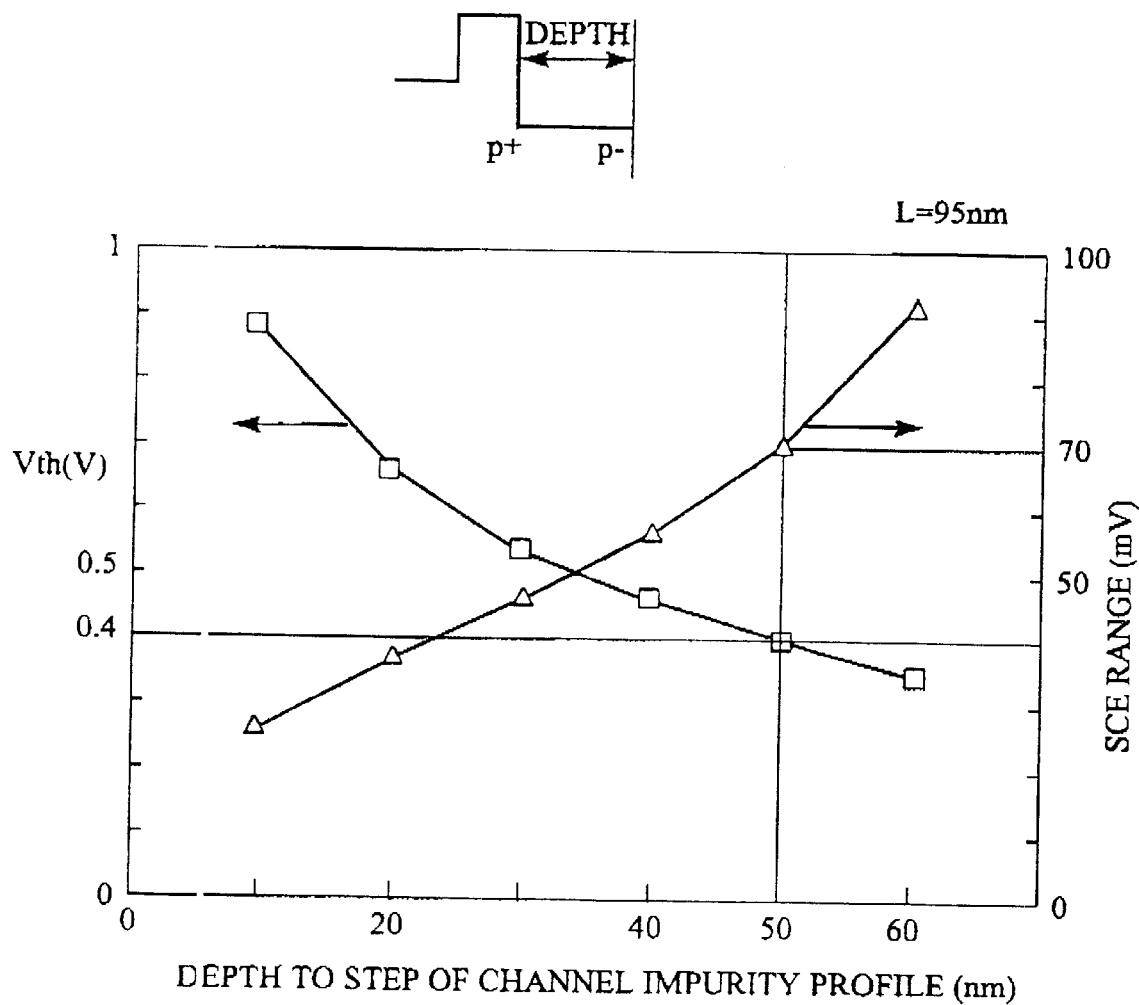
FIG. 5 is a graph showing Vth values and SCE ranges with respect to the distance between a substrate surface and a step of the stepped profile of FIG. 3.
Figure 17:
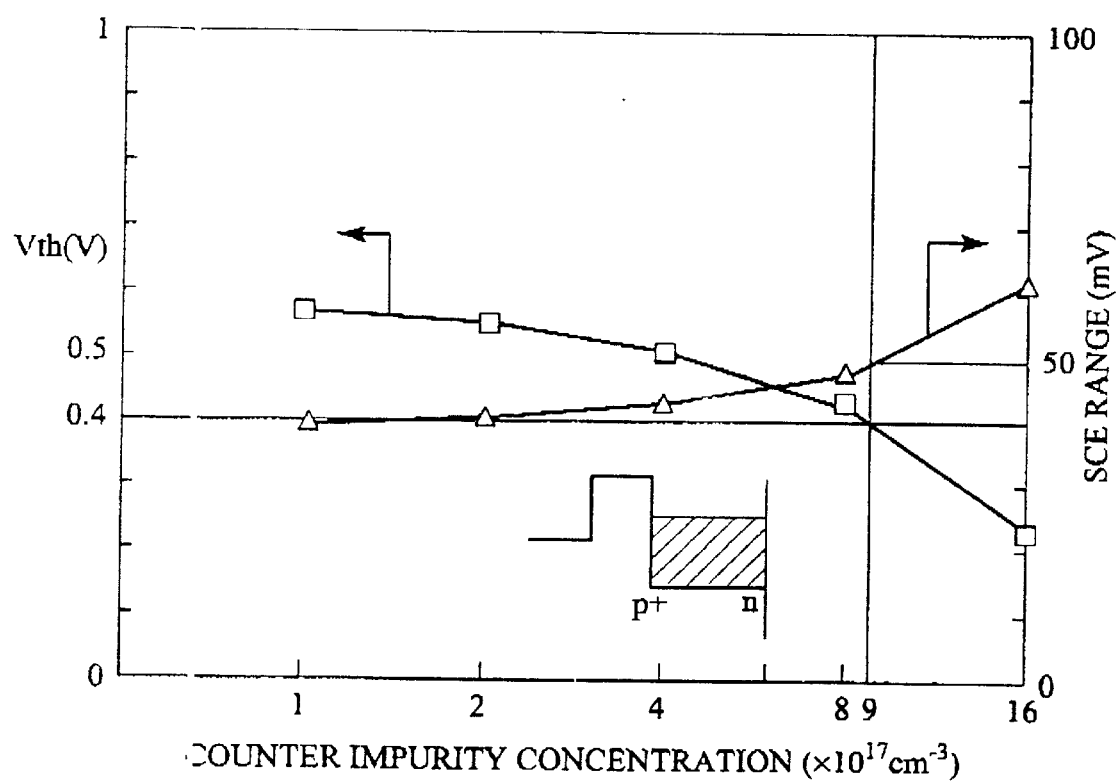
FIG. 17 is a graph showing Vth values and SCE ranges with respect to counter impurity concentrations when the stepped profile of FIG. 7A is applied for a metal gate.

FIG. 17 shows simulated relationships between counter impurity concentrations, Vth values, and SCE ranges based on the stepped profile of FIG. 7B. It is assumed that a higher concentration level of the p-type impurity concentration profile 1 of FIG. 7B is $5\times10^{18}$ cm$^{-3}$, a lower concentration level thereof is zero, the distance B from the substrate surface to the step is 25 $\mu$m, and a gate length is 95 nm. In FIG. 17, an abscissa represents counter impurity concentrations, and an ordinate represents Vth values and SCE ranges. A curve with squares indicates Vth values, and a curve with "Δ" marks indicates SCE ranges. The graph shows that the Vth values decrease and the SCE ranges increases as the counter impurity concentration increase. A low Vth value of 0.4 V is achievable with a counter impurity concentration of $9 \times 10^{17}$ cm$^{-3}$. At this concentration, the SCE range is about 50 mV. In FIG. 2, a Vth value of 0.4 V corresponds to a counter impurity concentration of $5.3 \times 10^{18}$ cm$^{-3}$. compared with this, the example of FIG. 17 achieves the same Vth value of 0.4 V at a one fifth or smaller counter impurity concentration. In FIG. 5, a Vth value of 0.4 V corresponds to an SCE range of 70 mV. Compared with this, the example of FIG. 17 achieves the same Vth value of 0.4 V by reducing the SCE range by 20 mV. In this way, the stepped profile of FIG. 7B is capable of reducing the concentration of counter impurities further than the profile of FIG. 1 and reducing the SCE range further than the stepped profile of FIG. 3 while suppressing Vth variations.

Figure 18:
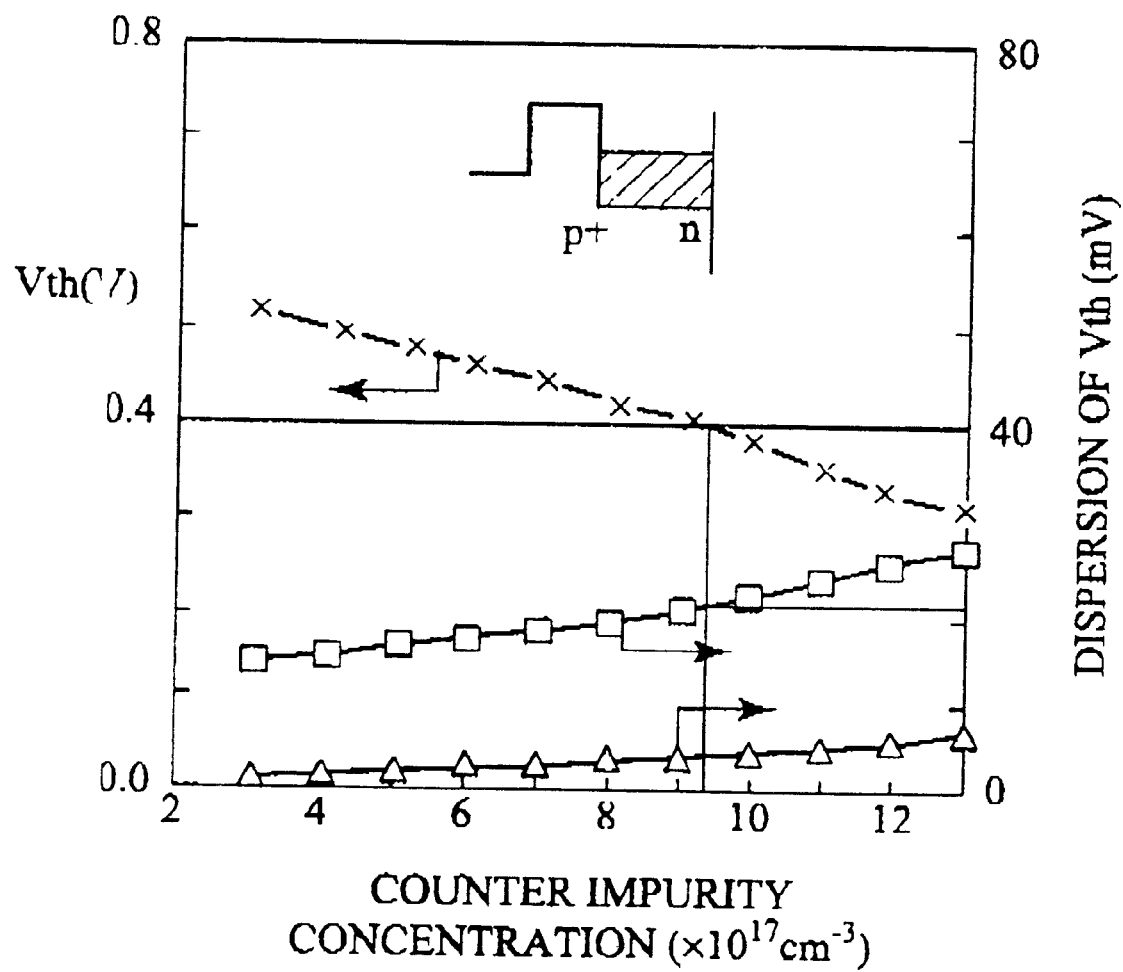
FIG. 18 is a graph showing Vth values and Vth variations with respect to counter impurity concentrations when the stepped profile of FIG. 7A is applied for a metal gate.

FIG. 18 is a graph showing simulation results of Vth values with respect to counter impurity concentrations and Vth variations with respect to counter impurity variations. This simulation was made by adjusting the p-type impurity concentration profile 1 of FIG. 7B to the net impurity concentration profile of FIG. 16. In FIG. 18, an abscissa represents n-type impurity concentrations in an n$^+$ counter impurity layer, and an ordinate represents Vth variations due to variations in the counter impurity concentration profile 2 of FIG. 7B. A curve with "x" marks indicates Vth values. A curve with squares indicates Vth variations when a pn junction at a depth of 25 nm is increased by 1 nm to 24 nm. A curve with "Δ" marks indicates Vth variations when the level of the counter profile 2 is reduced by 2%. The Vth curve with "x" marks of FIG. 18 corresponds to the Vth curve with squares of FIG. 17. The variation conditions set for FIG. 18 are based on variations to occur during semiconductor device manufacturing. In FIG. 18, a low Vth value of 0.4 V is achievable with an n-type impurity concentration of $9.3 \times 10^{17}$ cm$^{-3}$. At this high concentration, there are a Vth variation of about 20 mV on the depth variation curve with squares and a Vth variation of 5 mV on the concentration variation curve with "Δ" marks. In FIG. 2, there is a Vth variation of 50 mV on the depth variation curve, and therefore, the example of FIG. 18 reduces the variation to 40%. In FIG. 2, there is a Vth variation of 10 mV on the concentration variation curve, and therefore, the example of FIG. 18 halves the variation. In this way, the stepped profile of FIG. 7B suppresses Vth variations against concentration profile variations further than the profile of FIG. 1.

Embodiment 1

Figure 19:
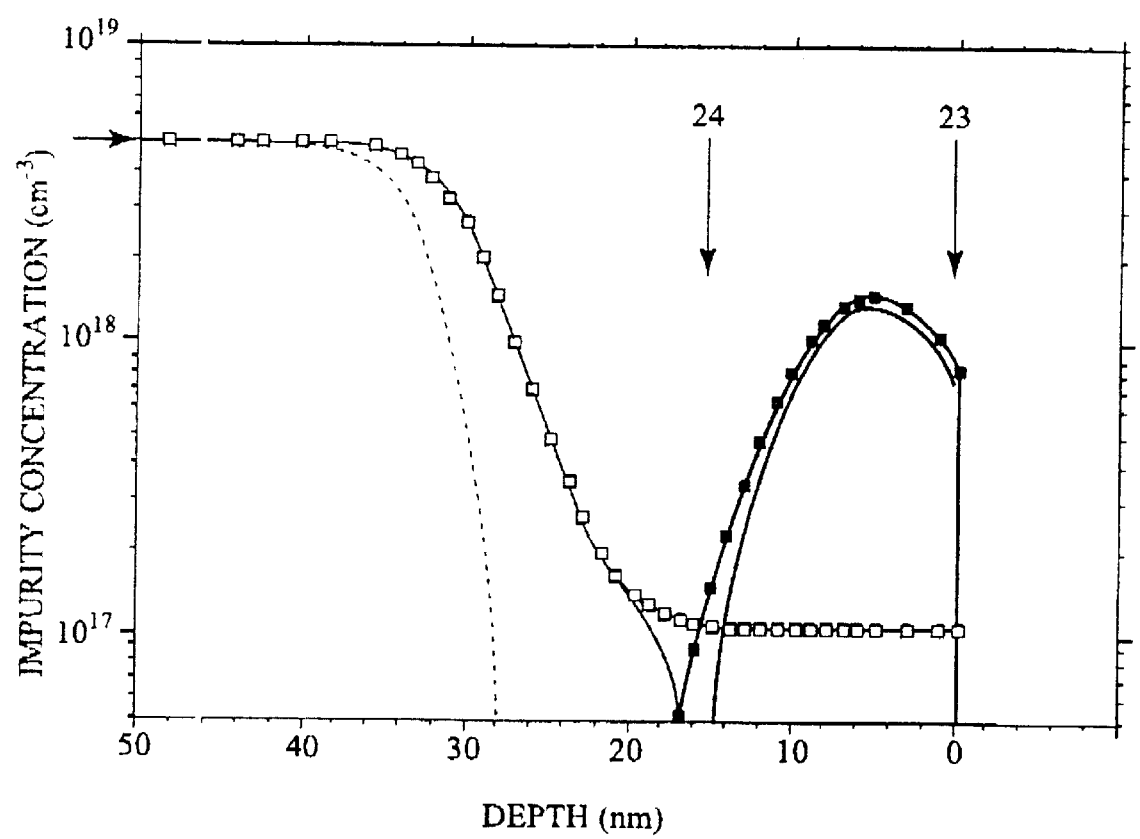
FIG. 19 shows impurity concentration profiles based on the modified stepped profiles of FIGS. 9A and 9B, according to an embodiment 1 of the present invention.

FIG. 19 shows impurity concentration profiles in a depth direction of a MIS transistor according to the embodiment 1 of the present invention. The profiles of FIG. 19 are based on the profiles of FIG. 9B and are realizable through ion implantation and thermal diffusion. The profiles of FIG. 19 are based on carrier (hole) concentrations provided by device similar ions with a gate voltage of Vth. An abscissa represents depths from an interface between the surface of a substrate and a gate insulating film into the inner part of the substrate, and an ordinate represents impurity concentrations. Continuous-line curves indicate net impurity concentration profiles. A curve with black squares indicates a counter (n-type) impurity concentration profile. A curve with white squares indicates a channel (p-type) impurity concentration profile. A dash-line curve indicates a carrier (hole) concentration profile with a drain electrode receiving 1 V and a gate voltage being Vth. Each impurity concentration profile represents a distribution of impurities in the substrate and is formed by averaging, at each depth measured from the substrate surface, impurity concentrations in the channel regions of transistors of the same function in an IC chip. The following explanation is based on an n-channel MIS transistor if not specified particularly. In the case of a p-channel MIS transistor, the explanation for the n-channel MIS transistor is applicable by inverting the conductivity types of respective regions.

The embodiment 1 implants channel (p-type) impurities at a high concentration of $5 \times 10^{18}$ cm$^{-3}$ below a depth of about 35 nm. The channel impurity concentration profile steeply decreases from a depth of about 30 nm toward the substrate surface 23. The channel impurity concentration profile must be high to suppress the short channel effect and must be low at the substrate surface 23 to provide a low Vth value. The channel impurity concentration profile is approximated by Fermi's distribution function.

The embodiment 1 declines the channel impurity concentration profile by 20% per 1 nm at the maximum, to attain a channel impurity concentration of $1 \times 10^{17}$ cm$^{-3}$ at the substrate surface. This provides a low Vth value even if the concentration of counter (n-type) impurities is low.

Namely, the concentration of counter impurities is about $1.4 \times 10^{18}$ cm$^{-3}$, and the concentration of net n-type impurities is about $1.3 \times 10^{18}$ cm$^{-3}$, so that the net n-type impurity concentration profile is little affected by the channel impurity concentration profile. This means that the net n-type impurity concentration profile is little affected by channel impurity variations and is mostly determined by counter impurity variations. Also, the influence of p-type impurity variations on Vth variations is small. The embodiment 1 suppresses the concentration of counter impurities to provide a required Vth value and reduce net n-type impurity variations and Vth variations due to counter impurity variations.

Figure 20:
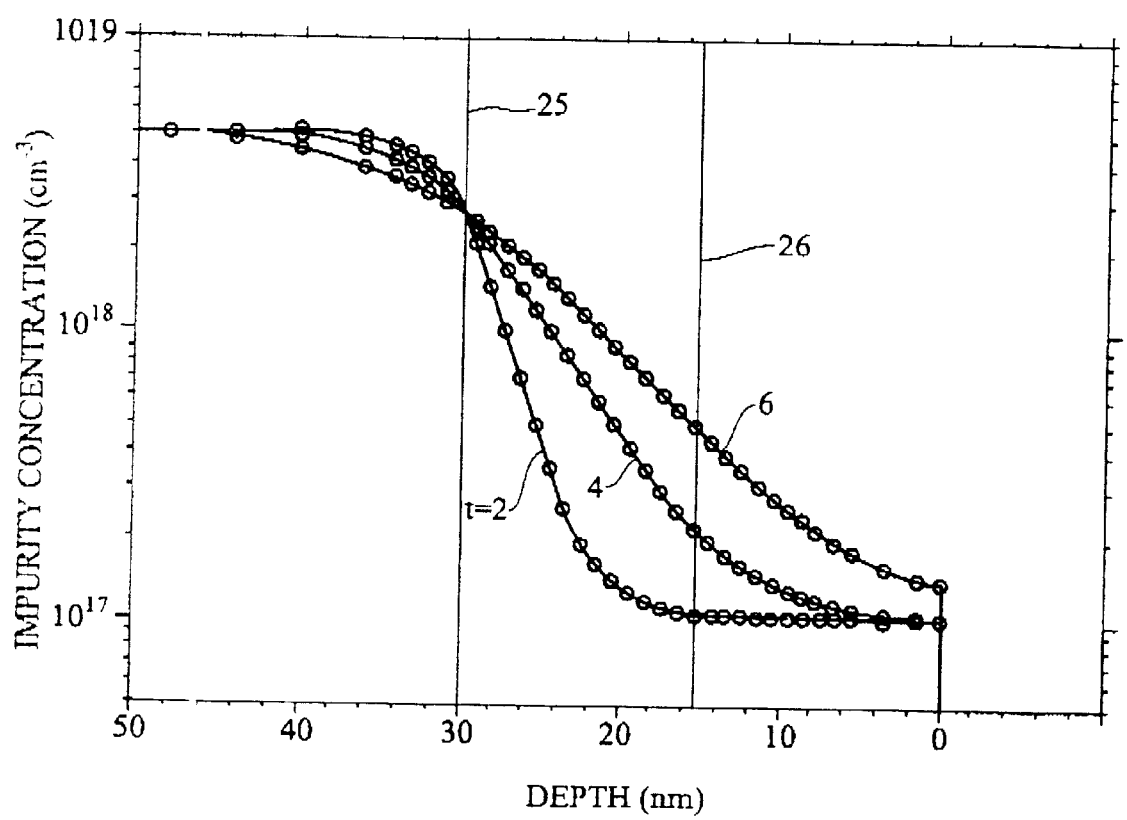
FIG. 20 shows three channel impurity concentration profiles used to examine the effectiveness of the embodiment 1.

FIG. 20 shows three channel impurity concentration profiles to examine the effect of the embodiment 1. Generally, a transistor having a pn junction in a channel shows a gently inclining channel (p-type) impurity concentration profile due to high-energy ion implantation and heat treatment. The channel impurity concentration profiles of FIG. 20 are generated by changing a shape factor of Fermi's distribution function to 2, 4, and 6. The profile with t=2 corresponds to the channel impurity concentration profile of FIG. 19. A peak counter impurity concentration is adjusted to provide a Vth value of 0.4 V for each p-type impurity concentration profile. The peak counter impurity concentration is set at a depth of 15 nm from a substrate surface. When t=6, a surface p-type impurity concentration is about $1 \times 10^{17}$ cm$^{-3}$, and a concentration decrease toward the substrate surface is gentle. The profile of t=4 is intermediate between the profiles of t=2 and t=6. To obtain a Vth value of 0.4 V, the profile of t=6 involves a peak counter impurity concentration of $2 \times 10^{18}$ $^{-3}$, and the profile of t=4 involves a peak counter impurity concentration of $1.7 \times 10^{18}$ cm$^{-3}$. As t decreases, a necessary counter impurity concenatration becomes smaller and the absolute values of net n-type impurity concentration variations become smaller. Each channel impurity concentration profile is generally low and Vth variations are small because a net n-type impurity concentration profile is determined by a counter impurity concentration profile.

Figure 21:
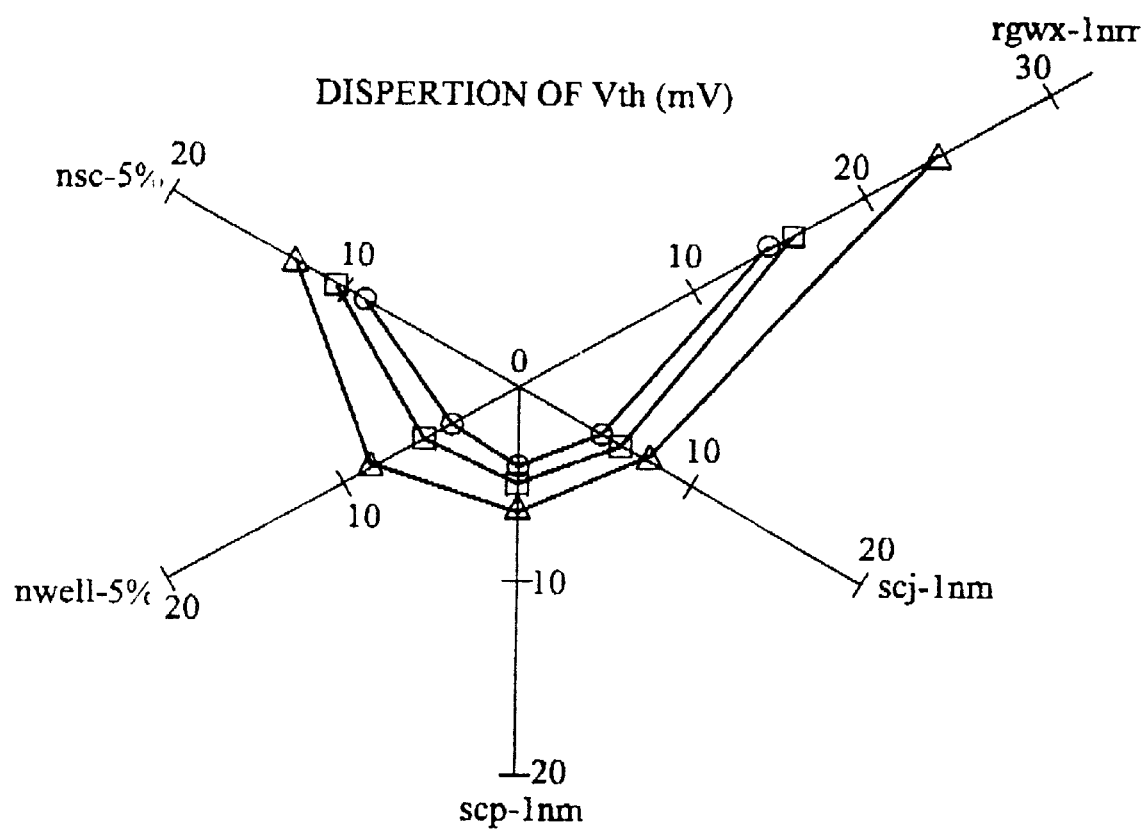
FIG. 21 is a graph showing Vth variations with respect to variations in the profiles of FIG. 20.

FIG. 21 is a graph showing Vth variations corresponding to the three profiles of FIG. 20. Values shown in FIG. 21 are based on device simulations. An axis "nsc-5%" represents Vth variations with respect to a 5% variation in a counter impurity concentration profile. An axis "nwell-5%" represents Vth variations with respect to a 5% variation in a channel impurity concentration profile. An axis "rgwx-1 nm" represents Vth variations to be caused when a position where a channel impurity concentration sharply decreases (at a depth of 30 nm indicated with a line 25 of FIG. 20) is varied by 1 nm. An axis "scp-1 nm" represents Vth variations to be caused when a peak (at a depth of 15 nm indicated with a line 26 of FIG. 20) counter impurity concentration is varied by 1 nm. An axis "scj-1 nm" represents Vth variations to be caused when the distance (set as 20 nm) from a peak counter impurity concentration to a position where a concentration is one tenth of the peak concentration is varied by 1 nm. A curve with "Δ" marks indicates t=6, a curve with squares indicates t=4, and a curve with circle marks indicates t=2. The graph of FIG. 21 shows that the smaller the t, the smaller the Vth variations with respect to any one of the channel impurity concentration variations, counter impurity concentration variations, and variations in the position of a step of a stepped channel impurity concentration profile. In addition, the smaller the shape factor t, the smaller the Vth variations with respect to the peak counter impurity concentration variations and the counter impurity concentration variations. Consequently, Vth variations can be minimized by inclining a step in a stepped channel impurity concentration profile s steeper as possible.

FIG. 21 will be compared with FIG. 2. In FIG. 2, a 2% impurity concentration variations causes a 10-mV Vth variation. In FIG. 21, even a 5% impurity concentration variation causes only a 10-mV Vth variation. In FIG. 2, a 0.5-nm profile depth variation causes a 50-n V Vth variation. In FIG. 21, even a 1-nm channel profile step depth variation with t=6 causes only a 24-mV Vth variation. In this way, the profiles of FIG. 20 with t=6 or smaller greatly suppress Vth variations compared with the profile of FIG. 1. If t=6, a maximum profile gradient per 1 nm provides a concentration ratio of about 0.9. Namely, a concentration ratio of 0.9 or smaller compounds to t=6 or smaller.

The embodiment 1 forms a counter impurity concentration profile within a low-concentration surface area of a channel impurity concentration profile. The embodiment 1 sets the concentration of counter impurities at an end of a depletion layer to a quarter or smaller of the maximum concentration of channel impurities in the depletion layer. To suppress the short channel effect, the embodiment 1 provides a p-type channel impurity concentration profile with a high-concentration area at the inner part of a substrate. A depletion layer extends in the high-concentration area of the channel impurity concentration profile, and the characteristics of a transistor are heavily dependent on the high-concentration change of the p-type impurity region in the depletion layer. Since the high-concentration area of the channel impurity concentration profile contains no counter impurities, a net p-type channel impurity concentration profile in the depletion layer is determined only by the channel impurity concentration profile. Even if the counter impurities vary, the important part of the net p-type impurity concentration profile to determine Vth is not affected thereby. To narrow a counter impurity concentration profile, the embodiment 1 may form a low-concentration pn junction on the substrate surface side of the counter impurity concentration profile as shown in FIG. 10B.

The embodiment 1 lowers the concentrations of p- and n-type impurities at a pn junction lower than a maximum channel impurity concentration in a depletion layer by one digit or more, to reduce the influence of impurity concentration variations on transistor operations. A depletion layer is defined as an area where a carrier concentration is smaller than an impurity concentration by 10% or more. In FIG. 19, the end of a depletion layer is around a depth of 38 nm, and a maximum channel impurity concentration in the depletion layer is present at the depletion layer end and is $5 \times 10^{18}$ cm$^{-3}$. The maximum channel impurity concentration may be present at a position shallower than the depletion layer end.

At the substrate surface 23 of FIG. 19, the embodiment 1 makes a channel impurity concentration a quarter or smaller of a counter impurity concentration. The influence of a charge distribution unit on electric characteristics is greater at the substrate surface than at the inner part of the substrate. Decreasing the influence of a channel impurity concentration profile on a net n-type impurity concentration at the substrate surface reduces the influence of channel impurity concentration variations on electric characteristics. Generally, a maximum net n-type impurity concentration in a depletion layer greatly influences electric characteristics. Accordingly, at the position where a maximum net n-type impurity concentration appears, the embodiment 1 reduces a channel impurity concentration to a quarter or smaller of the counter impurity concentration, thereby reducing the influence of channel impurity concentration variations on electric characteristics.

According to the embodiment 1, the position of a peak counter impurity concentration is shallower than the position of a pn junction. This puts the major part of a counter impurity concentration profile away from a channel impurity concentration profile, so that a net n-type impurity concentration profile is determined only by the counter impurity concentration profile. At the same time, a net p-type impurity concentration profile is determined on y by the channel impurity concentration profile. This reduces variations in the net p- and n-type impurity concentration profiles due to variations in the counter and channel impurity concentration profiles, thereby suppressing Vth variations.

The embodiment 1 may increase the concentration of counter impurities to suppress Vth variations in a MISFET of low Vth. It is preferable to form a counter impurity concentration profile within the low-concentration surface area of a channel impurity concentration profile. If the high-concentration counter impurity profile overlaps an end of the channel in purity concentration profile, the embodiment 1 sharply decreases the channel impurity concentration profile, to suppress Vth variations.

The embodiment 1 sharply decreases a channel impurity concentration profile at a depth of 30 nm toward a substrate surface as shown in FIG. 19. The sharp declining point may be brought closer to the substrate surface to further suppress the short channel effect. To achieve this with the same Vth as that of FIG. 19, a counter impurity concentration profile higher or wider than that of FIG. 19 is employed. If the sharp declining point is moved toward the inner part of the substrate and if an n-type impurity concentration profile lower or narrower than that of FIG. 19 is employed to realize the same Vth as that of FIG. 19, the short channel effect will be worsened than that of FIG. 1. Generally, moving the sharp declining point toward a substrate surface increases Vth variations due to impurity concentration variations. In this way, suppressing the short channel effect and suppressing Vth variations due to impurity concentration variations are trade-offs. An optimum channel impurity concentration profile for a required Vth value must be determined in consideration of the accuracy of gate processing lithography and etching for transistor manufacturing and the accuracy of impurity control in ion implantation and heat treatment. The channel impurity concentration profiles of the embodiment 1 are capable of suppressing the short channel effect as well as Vth variations due to impurity concentration variations, to provide transistors having low Vth values. The embodiment 1 is capable of providing high-speed, low-power-consumption Cs at high yield.

Embodiment 2

Figure 22:
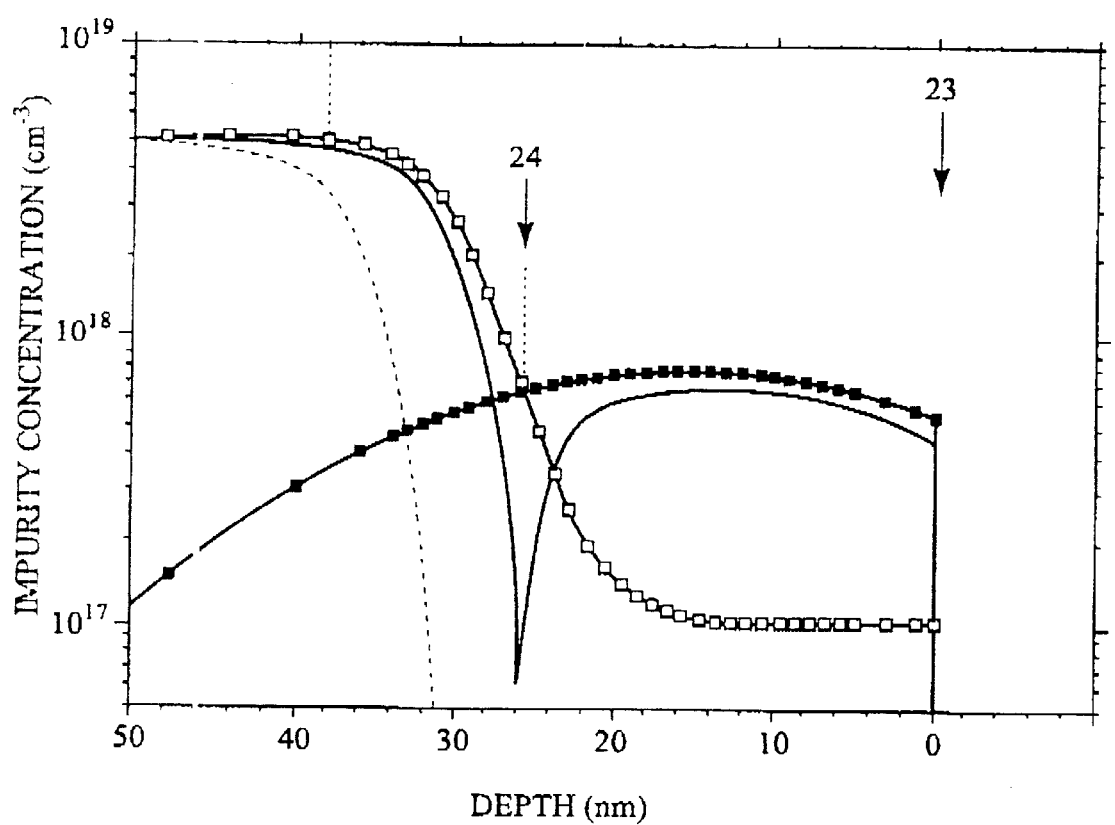
FIG. 22 shows impurity concentration profiles based on the stepped profiles of FIGS. 7A and 7B, according to an embodiment 2 of the present invention.

FIG. 22 shows impurity concentration profiles in a depth direction of a MIS transistor according to the embodiment 2 of the present invention. The profiles of FIG. 22 are based on the stepped profile of FIG. 7A and are realizable through ion implantation and thermal diffusion. The profiles of FIG. 22 are based on carrier (hole) concentrations provided by device simulations with a gate voltage of Vth. An abscissa, an ordinate, a continuous-line curve, a curve with black squares, a curve with white squares, and a dash-line curve have the same meanings as those of FIG. 19. Like the embodiment 1, the embodiment 2 employs a channel impurity concentration profile that steeply declines toward a substance surface 23 and a counter impurity concentration profile that is low at a pn junction, to suppress the short channel effect. Unlike the embodiment 1, the embodiment 2 makes a counter impurity concentration gradient gentler than a channel impurity concentration gradient at an increased between the counter and channel impurity concentration profiles. The embodiment 2 extends the counter impurity concentration profile to a high-concentration area of the channel impurity concentration profile.

The embodiment 2 equalizes the channel and counter impurity concentration profiles to each other at a depth of 26 nm (numeral 24 in FIG. 22), to form a pn junction. The stepped channel impurity concentration profile of the embodiment 2 sharply falls toward the substrate surface 23. This reduces the concentration of channel and counter impurities at the pn junction to about 12% of a maximum channel impurity concentration in a depletion layer. The concentrations of channel and counter impurities at the pn junction are each about $6 \times 10^{17}$ cm$^{-3}$. The low channel impurity concentration at the pn junction reduces net n-type impurity concentration variations due to channel impurity concentration variations at the pn junction. This stabilizes transistor operations.

The counter impurity concentration profile has a peak at a depth of about 15 nm and extends gently. A counter impurity concentration gradient at the pn junction is smaller than a channel impurity concentration gradient. As a result, the channel impurity concentration profile has little depth dependence, and a net n-type impurity concentration profile and electric characteristics are stable.

Figure 23:
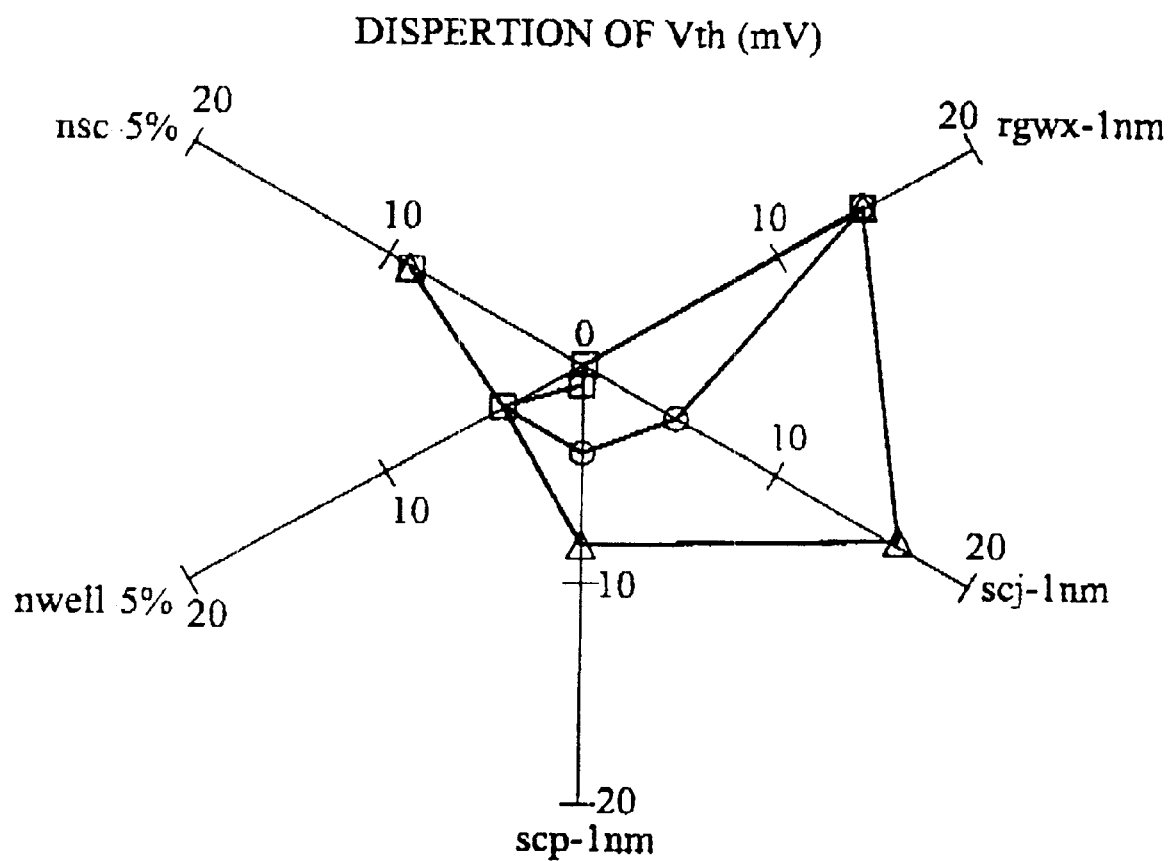
FIG. 23 is a graph showing Vth variations with respect to channel and counter impurity concentration variations in the profiles of FIG. 22.

FIG. 23 is a graph showing Vth variations with respect to profile variations in connection with three counter impurity concentration profiles based on the profiles of FIG. 22. Values shown in FIG. 23 are based on device simulations. A channel impurity concentration profile is fixed at t=2, and a depth where the channel impurity concentration profile steeply falls is fixed at 30 nm. The position of a peak counter impurity concentration is fixed at a depth of 15 nm. The distance between the peak counter impurity concentration and a position where a counter impurity concentration is one tenth of the peak concentration is changed to change a counter impurity concentration profile gradient. The meanings of axes nsc-5%, nwel-5%, rgwx-1 nm, scp-1 nm, and scj-1 nm are the same as those of FIG. 21. A line with squares represents scj=40 nm and corresponds to the counter impurity concentration profile of FIG. 22. A line with circles represents scj=20 nm, and a line width "Δ" marks represents scj=10 nm. Values on the axes nsc-5%, nwell-5%, and rgwx-1 nm are unchanged with respect to scj changes. Values on the axes scp-1 nm and scj-1 nm become smaller as scj increases. This means that Vth variations are suppressible by increasing scj, i.e., by making the counter impurity concentration gradient gentler.

FIG. 23 will be compared with FIG. 2. In FIG. 2, a 10-mV Vth variation is observed at a 2% concentration variation. In FIG. 23, the same Vth variation is observed only at a 5% concentration variation. In FIG. 2, a 50-mV Vth variation is observed at a 0.5-nm depth variation. In FIG. 23, a 17-mV Vth variation is observed at a 9-nm scj variation on the counter impurity concentration profile with scj=10 nm that causes the largest variation. In this way, the profiles of FIG. 22 further suppress Vth variations than the profile of FIG. 2 if scj is above 10 nm. To obtain a Vth value of 0.4 V, the counter impurity concentration profile with scj=40 nm must have a peak concentrations of $7.5 \times 10^{17}$ cm$^{-3}$. If scj=20 nm, a peak concentration of $9.4 \times 10^{17}$ cm$^{-3}$ is needed, and if scj=10 nm, a peak concentration of $1.6 \times 10^{18}$ cm$^{-1}$ is needed. These peak concentrations are less than one third of the peak counter impurity concentration of $5 \times 10^{18}$ cm$^{-3}$ of FIG. 2 for the Vth of 0.4 V.

In FIG. 22, the gradient of the channel impurity concentration profile at the pn junction is greater than that of the counter impurity concentration profile, and the channel impurity concentration profile steeply rises toward the inner part of the substrate. This cancels the counter impurity concentration profile that overlaps a net p-type impurity concentration profile, to form a high net p-type impurity concentration profile. If the counter impurity concentration profile is flat, the concentrations have no positional dependence and the net p-type impurity concentration profile and electric characteristics are not affected by variations in the counter impurity concentration profile that overlaps the net p-type impurity concentration profile around the pn junction.

Although the net p-type impurity concentration profile around the pn junction is mainly determined by the channel impurity concentration profile, the net p-type impurity concentration profile is influenced by the difference between the channel and counter impurity concentration profiles. The gradient of the counter impurity concentration profile is smaller than that of the channel impurity concentration profile, and the positional dependence of the channel impurity concentration profile is small. As a result, channel impurity concentration variations cause little variations in the difference between the channel and counter impurity concentration profiles. Namely, variations in the net p-type impurity concentration profile and electric characteristics are small.

At a peak counter impurity concentration position in FIG. 22, the level of the channel impurity concentration profile is less than a quarter of the level of the counter impurity concentration profile. Generally, a peak net n-type impurity concentration in a depletion layer greatly influences electric characteristics. At the peak net n-type impurity concentration position, the channel impurity concentration profile is low to reduce impurity concentration variations and electric characteristic variations.

At the substrate surface 23, the channel impurity concentration profile is lower than a quarter of the content impurity concentration profile. Unit charge on the substrate surface side of the depletion layer influences electric characteristics more greatly than unit charge on the substrate inner side of the depletion layer. The embodiment 2 reduces the channel impurity concentration profile lower than a quarter of the counter impurity concentration profile at the substrate surface, to reduce the influence of the channel impurity concentration profile on a net n-type impurity concentration profile and decrease electric characteristic variations due to channel impurity concentration variations.

According to the embodiment 2, the bottom of a depletion layer is at a depth of about 38 nm, and a maximum channel impurity concentration in the depletion layer is $5 \times 10^{18}$ cm$^{-3}$. The position of the maximum channel impurity concentration may be shallower than the bottom of the deletion layer.

According to the embodiment 2, the concentration of counter impurities at a substance surface is higher than half a maximum counter impurity concentration, is higher than half the concentration of counter impurities at a pn junction, and is lower than twice the concentration of counter impurities at the pn junction. As a result, the counter impurity concentration profile of the embodiment 2 has little positional dependence, and therefore, counter impurity concentration variations cause little variations in net n- and p-type impurity concentration profiles.

According to the embodiment 2, the peak of the counter impurity concentration profile is located at the center of a low-concentration surface area of the channel impurity concentration profile. This peak may be closer to the surface or the inner part of the substrate. The peak may be in the net p-type impurity concentration profile or at the bottom thereof. It is possible to prepare a flat counter impurity concentration profile without a peak, like the profile 2 of FIGS. 11A and 11B.

Increasing counter impurity concentrations may provide a lower Vth value. For the same Vth value, a lower counter impurity concentration profile is preferable. If a required low Vth is obtainable with the use of a low-concentration n-type impurity layer, it is preferable to prepare a flat counter impurity concentration profile. Even if counter impurity concentrations are high comparable to channel impurity concentrations, to affect a net p-type impurity concentration profile, the embodiment 2 makes the inclination of a channel impurity concentration profile that falls toward a substrate surface larger than the inclination of a counter impurity concentration profile, to suppress Vth variations. Increasing counter impurity concentrations brings a net p-type impurity concentration profile away from the substrate surface, to reduce the influence of p-type impurity concentration variations on Vth. The p-type impurity concentration variations themselves are small because the counter impurity concentration profile of the embodiment 2 is gentle.

The embodiment 2 is superior to the embodiment 1 in that the embodiment 2 involves a gentle counter impurity concentration profile that has less positional or shape dependence. Accordingly, the counter impurity concentration profile of the embodiment 2 is easy to form and control. The embodiment 1 must restrict the width of a counter impurity concentration profile to the width of a low-concentration surface area of a channel impurity concentration profile. To achieve this, the embodiment 1 must control counter impurity concentrations, the position of a peak counter impurity concentration, and the shape of the counter impurity concentration profile. On the other hand, the embodiment 2 employs a gentle counter impurity concentration profile, which is producible without restricting heat treatment. The embodiment 2 only controls counter impurity concentrations. The higher the counter impurity concentrations, the lower the Vth values, and therefore, it is necessary to precisely control the counter impurity concentrations according to a channel impurity concentration profile in a depletion layer and a required Vth value. The embodiment 2 provides a required Vth value by forming a channel impurity concentration profile that sharply falls in the vicinity of a substrate surface and by forming a counter impurity concentration profile that can be formed only by controlling the concentrations of counter impurities.

Embodiment 3

Figure 24:
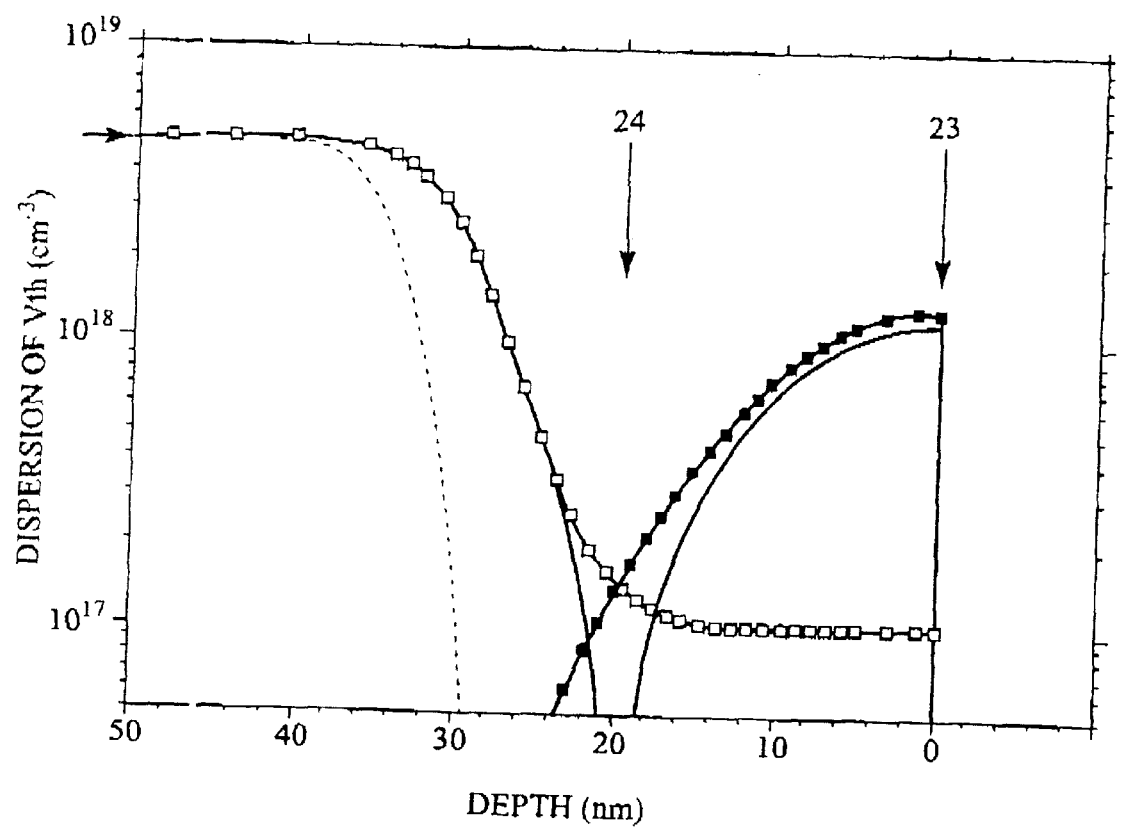
FIG. 24 shows impurity concentration profiles based on the modified stepped profiles of FIGS. 9A and 9B, according to an embodiment 3 of the present invention.

FIG. 24 shows impurity concentration profiles in a depth direction of a MIS transistor according to the embodiment 3 of the present invention. The profiles of FIG. 24 are based on the stepped profile of FIGS. 9A and 9B and are realizable with ion implantation and thermal diffusion. The profiles of FIG. 24 are based on carrier (hole) concentration provided by device simulations with a gate voltage of Vth and a drain electrode voltage of 1 V. The meanings of an abscissa, an ordinate, a continuous-line curve, a curve with black squares, a curve with white squares, and a dash-line curve are the same as those of FIG. 19. The embodiment 3 employs a channel impurity concentration profile that steeply decreases toward a substrate surface 23 and a counter impurity concentration profile that is low at a pn junction, to suppress the short channel effect. Unlike the embodiments 1 and 2, the embodiment 3 forms a peak counter impurity concentration at the substrate surface 23. The embodiment 3 lowers the channel impurity concentration profile at the pn junction and in an area where it overlaps a net n-type impurity concentration profile, and increases the counter impurity concentration profile to realize a low Vth value. The counter impurity concentration profile that provides a high net n-type impurity concentration profile is controlled to decrease the absolute values of counter impurity concentration variations. In this way, the embodiment 3 reduces the influence of channel and counter impurity concentration variations on net n- and p-type impurity concentrations, to reduce the electric characteristic variations.

The embodiment 3 is superior to the embodiment 1 in that a peak counter impurity concentration is at a substrate surface to introduce more counter impurities into the substrate surface while keeping low impurity concentrations at a pn junction. As a result, the embodiment 3 relaxes heat treatment conditions compared with the embodiment 1. The embodiment 3 may form a shallow counter impurity concentration while minimizing heat treatment. In this case, the sharply declining part of the channel impurity concentration profile can be brought closer to the substrate surface while keeping low impurity concentrations at the pn junction 24, thereby suppressing the short channel effect.

The embodiments 1 to 3 are applicable to polysilicon gate electrodes as well as to metal gate electrodes. The metal gates may have a gate-insulating-film-contacting part made of at least nitride of IV-, V-, or VI-group transition metal elements, carbon nitride, or silicon nitride. More precisely, the gate-insulating-film-contacting part may be made of tungsten (W) nitride, molybdenum (Mo) nitride, tantalum (Ta) nitride, titanium (Ti) nitride, W-silicon nitride, Mo-silicon nitride, Ta-silicon nitride, Ti-silicon nitride, Ti-carbon nitride, W-carbon nitride, Mo-carbon nitride, or Ta-carbon nitride. The gate-insulating-film-contacting part may be made of ruthenium (Ru) with oxygen, Ru with nitrogen, and Ru oxide (RuO$_2$) with nitrogen.

The work function of the gate-insulating-film-contacting part influences a Vth value. If the diameter of each crystal at the part is large, Vth will vary because the work function differs depending on a face orientation. The diameter of each crystal at the part must be smaller than 10 nm, preferably smaller than 30 nm.

The embodiments 1 to 3 provide a significant effect when applied to metal gate MISFETs, in particular, MISFETs employing metal such as titanium nitride (TiN) whose work function is present around the center of a silicon band gap. In this case, pMISFETs and nMISFETs provide large Vth values. The Vth values can be reduced by employing the embodiments 1 to 3. The embodiments 1 to 3 can produce a high-performance CMOS MISFETs having low Vth values without Vth variations, by employing the same metal or metal compound having a work function around the center of a silicon band gap for metal gates without using dual gates.

Embodiment 4

Figure 25:
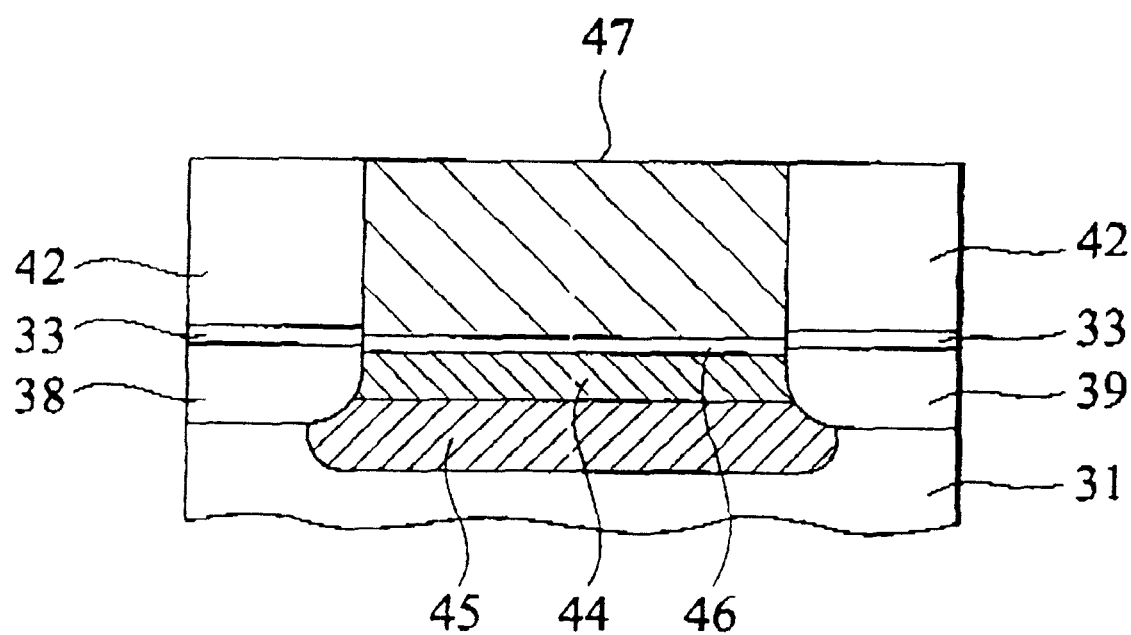
FIG. 25 is a sectional view showing a MISFET according to an embodiment 4 of the present invention employing the impurity concentration profiles of the embodiment 2.

The embodiment 4 of the present invention provides a MISFET having the impurity concentration profiles of the embodiment 2 of FIGS. 7A, 7B, and 22 and a method of manufacturing the MISFET. FIG. 25 is a sectional view showing the MISFET of the embodiment 4. The MISFET has a semiconductor substrate 31 of a first conductive type, a gate insulating film 46 in contact with the top surface of the substrate 31, and a gate electrode 47 in contact with the top surface of the insulating film 46. The substrate 31 includes a counter impurity region 44 of a second conductivity type formed under the insulating film 46, a channel impurity region 45 of the first conductivity type formed under the counter impurity region 44, a source region 38 of the second conductivity type formed at the surface of the substrate 31 in contact with the counter impurity region 44, and a drain region 39 of the second conductivity type formed at the surface of the substrate 31 in contact with the counter impurity region 44. The counter and channel impurity regions 44 and 45 have the impurity concentration profiles of the embodiment 2. A sacrificial insulating film 33 is formed over the source and drain regions 38 and 39. An interlayer insulating film 42 is formed on the sacrificial insulating film 33.

Although the source and drain regions 38 and 39 are not extended under gate electrode 47 in FIG. 25, it is preferable to extend the source and drain regions 38 and 39 under the gate insulating film 46 below the ends of the gate electrode 47, to reduce gate-source resistance and gate-drain resistance.

FIGS. 26A to 26E are sectional views showing the method of the embodiment 4 for manufacturing a MISFET having the channel impurity concentration profiles of the embodiment 2. This method employs a damascene gate process. The damascene gate process enables the gate electrode 47 to be formed without polysilicon and enables the activation of source and drain impurities before the formation of the gate electrode 47. This enables the gate electrode 47 to be made from metal or metal compound. When the gate electrode 47 is formed from polysilicon, high-temperature heat treatment is needed, and further heat treatment is needed to activate source and drain impurities, to deteriorate a channel impurity concentration profile. The damascene gate process needs no such heat treatment, and therefore, never deteriorates a channel impurity concentration profile. Namely, the damascene gate process is appropriate for realizing the channel impurity concentration profile of the embodiment 2 that steeply decreases toward a substrate surface. The manufacturing method will be explained in detail.

Figure 26A:
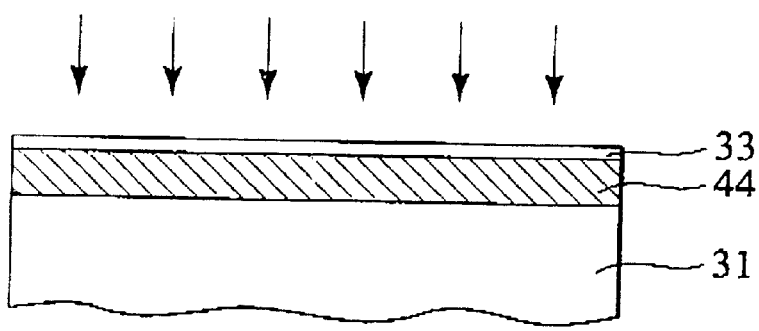
FIGS. 26A to 26E are sectional views showing a method of manufacturing the MISFET of FIG. 25.

(1) In FIG. 26A, a sacrificial insulating film 33 of 100 nm thick is formed on a silicon substrate 31 by thermal oxidation. Through the sacrificial insulating film 33, n-type impurities 49 are implanted. The n-type impurities are, for example, phosphorus ions of $5 \times 10^{13}$ cm$^{-2}$ and are implanted at 40 keV in acceleration energy. Later, the impurities are diffused by heat treatment to form a counter impurity concentration profile having a gentle gradient at the surface of the substrate. Instead of the ion implantation, a silicon layer of 50 nm thick uniformly containing n-type impurities may epitaxially be grown on the substrate 31.

Figure 26B:
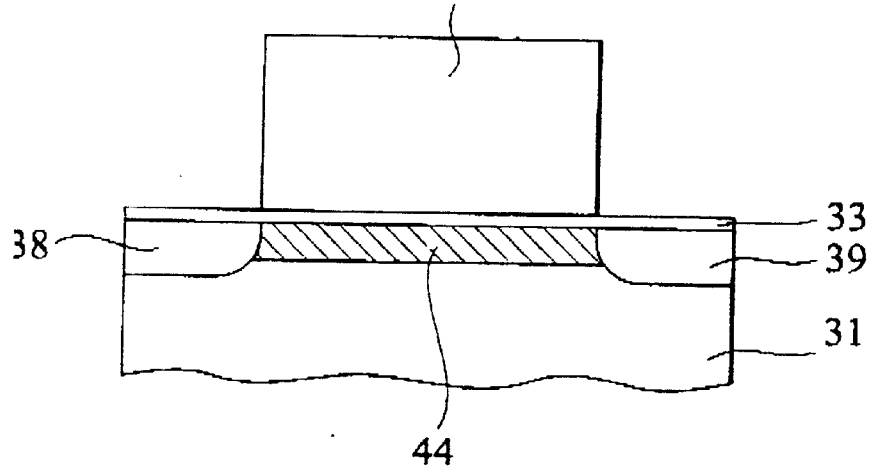

(2) In FIG. 26B, a dummy gate electrode pattern 35 of 50 to 200 nm thick is formed on the sacrificial insulating film 33 by lithography and anisotropic etching. The pattern 35 may be a silicon oxide film containing hydrogen, a silicon oxide film formed by thermal oxidation, a silicon oxide film formed by thermal nitriding, an amorphous silicon film, or a polysilicon film. Forming the pattern 35 from silicon-based semiconductor film or insulating film instead of metal minimizes side-face irregularities to be caused by reactive ion etching (RIE) on the pattern 35, thereby minimizing gate length variations.

The pattern 35 is used as a mask to implant impurity ions and form source and drain regions 38 and 39 by annealing.

The annealing for activating the source and drain regions 38 and 39 is carried out before the formation of a channel impurity concentration profile and a gate electrode 47, so that the channel impurity concentration profile and gate electrode 47 are free from the influence of the annealing.

Figure 26C:
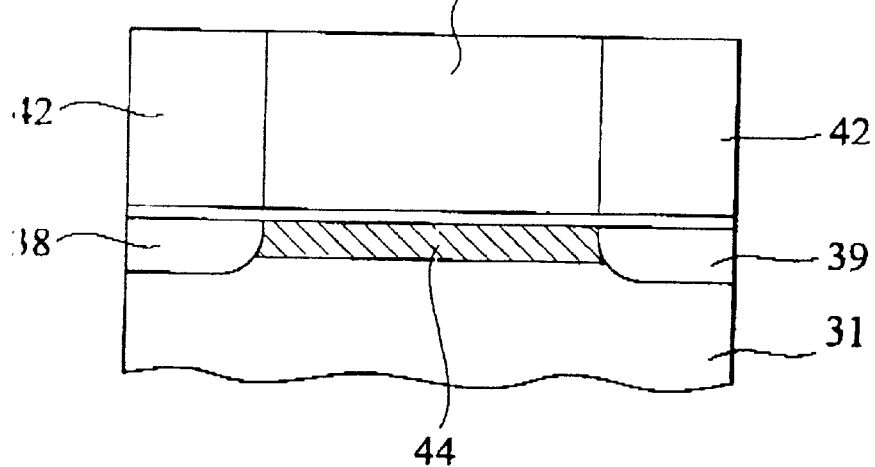

(3) In FIG. 26C, a silicon oxide film serving as an interlayer insulating film 42 is entirely formed by CVD to cover the pattern 35. The silicon oxide film is polished by CMP (chemical mechanical polishing) or MP (mechanical polishing) to expose the pattern 35. The silicon oxide film is flattened to form the interlayer insulating film 42. The film 42 may be a lamination of a lower silicon oxide film and an upper silicon oxide film containing phosphorus.

Figure 26D:
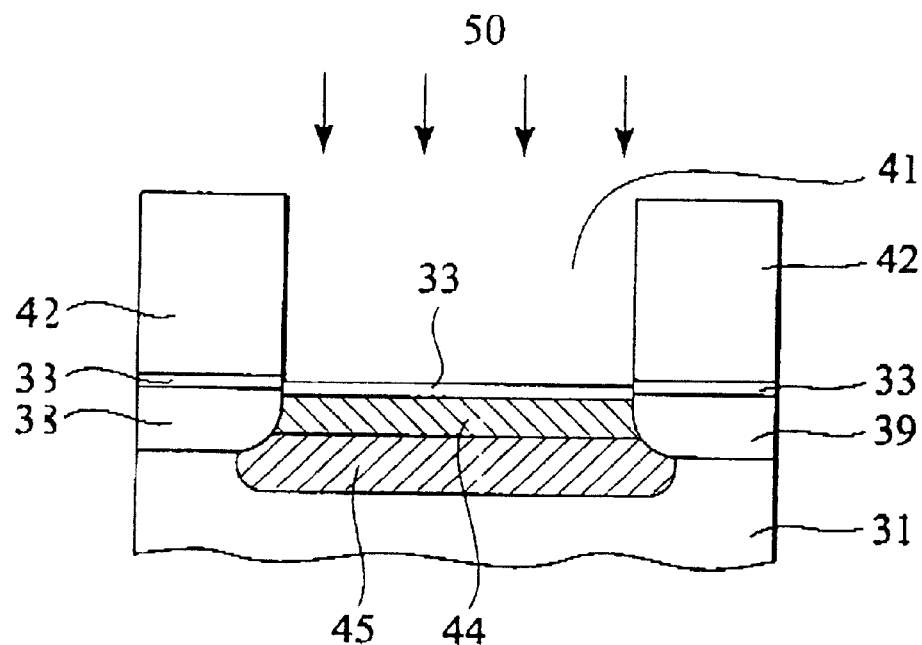

(4) In FIG. 26D, the pattern 35 and sacrificial insulating film 33 are removed by wet etching to form an opening 41. A sacrificial oxide film of 5 nm thick is deposited in the opening 41. Channel impurities 50 are selectively implanted by ion implantation into the substrate 31 through the opening 41. When forming an nMISFET, indium (In) ions of $5 \times 10^{13}$ cm$^{-2}$ are implanted at 200 keV. The implanted ions are activated by rapid thermal annealing (RTA) at 900 degrees centigrade for 30 seconds. When forming a pMISFET, boron (B) ions are used as counter impurities and antimony (Sb) ions as channel impurities at the same dose and acceleration energy as those for the nMISFET.

In addition to or instead of the ion implantation 50, a quadrant halo ion implantation may be carried out to form the channel impurity region 45 before the annealing of step (2) of FIG. 26B to activate the source and drain regions 38 and 39.

In this case, ions are obliquely implanted around the dummy gate electrode pattern 35 (FIG. 26B) along incident axes passing through the source and drain regions 38 and 39. At this time, the ions are implanted even under the pattern 35. Each incident axis may have an angle of 25 degrees with respect to the substrate surface. Generally, gate electrodes formed on a wafer are oriented in two orthogonal directions. Accordingly, four incident axes inclined by +x, −x, +y, and −y with respect to the substrate surface are used to obliquely implant ions. This is the quadrant halo ion implantation. The ions are activated by RTA at 900 degrees centigrade for 10 seconds.

Figure 6C:
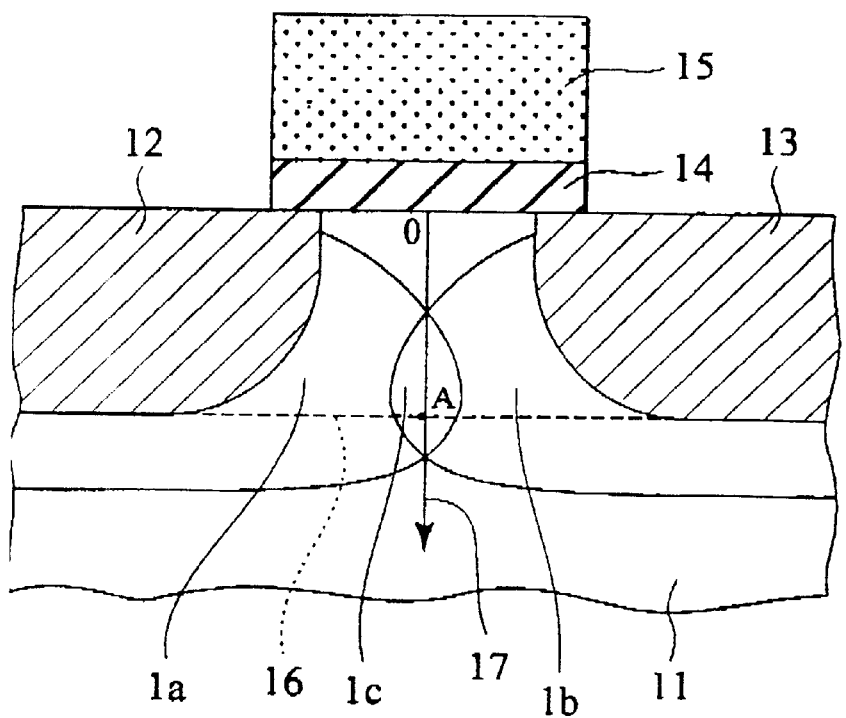

The pattern 35 is narrow, and the region 45 into which ions are obliquely implanted is away from the substrate surface, and therefore, the impurity concentration of a channel center area gradually increases according to a gate length as shown in FIGS. 6B and 6C. If the gate length is shortened, the channel impurity concentration may be increased accordingly, to suppress the short channel effect.

Figure 26E:
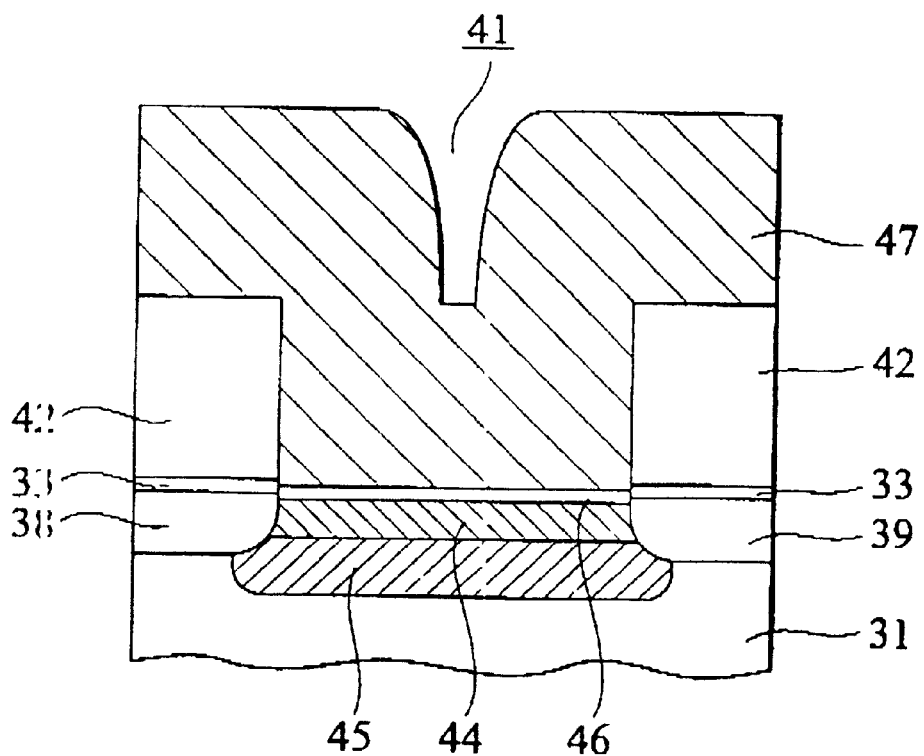

(5) In FIG. 26E, the sacrificial oxide film 33 is removed, and a gate insulating film 46 is formed by CVD. A metal film 47 serving as a metal gate electrode is formed. The metal film 47 may be made of TiN, which is entirely deposited by CVD over the substrate surface to fill the opening 41.

(6) Expression part of the metal film 47 outside the opening 41 is removed by CMP to MP to complete the MISFET.

Embodiment 5

Figure 27:
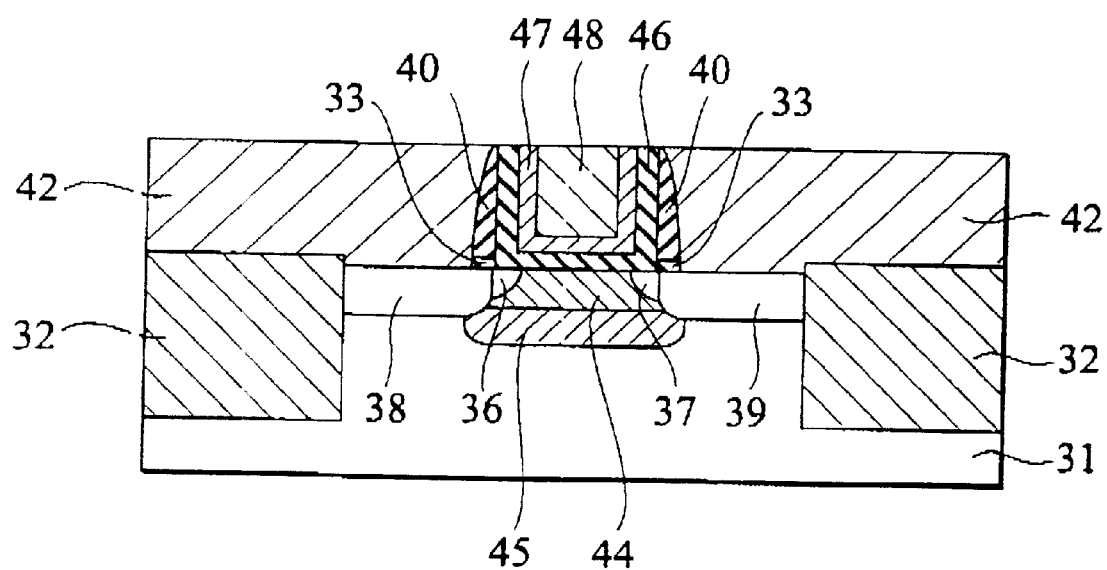
FIG. 27 is a sectional view showing a MISFET according to an embodiment 5 of the present invention employing the impurity concentration profiles of the embodiment 1.

The embodiment 5 of the present invention provides a MISFET having the impurity concentration profiles of the embodiment 1 of FIGS. 9A, 9B, and 19 and a method of manufacturing the MISFET. FIG. 27 is a sectional view showing the MISFET of the embodiment 5. The MISFET has a semiconductor substrate 31 of a first conductivity type, a gate insulating film 46 in contact with the top surface of the substrate 31, a first gate electrode 47 in contact with the top surface of the gate insulating film 46, and a second gate electrode 48 in contact with the top surface of the first gate electrode 47. The substrate 31 includes a counter impurity region 44 of a second conductivity type formed under the insulating film 46, a channel impurity region 45 of the first conductivity type formed under the counter impurity region 44, a source region 46 of the second conductivity type formed at the surface of the substrate 31 in connect with the counter impurity region 44, a drain region 37 of the second conductivity type formed at the surface of the substrate 31 in contact with the counter impurity region 44, a deep source region 38 of the second conductivity type formed at the surface of the substrate 31 in contact with the source region 36, and a deep drain region 39 of the second conductivity type formed at the surface of the substrate 31 in contact with the drain region 37. The counter and channel impurity regions 44 and 45 have the impurity concentration profiles of the embodiment 1. A sacrificial insulating film 33 is formed on the surfaces of the deep source and drain regions 38 and 39 in contact with the side face of the insulating film 46. A side wall 40 is formed on the sacrificial insulating film 33 in contact with the side face of the gate insulating film 46. An interlayer insulating film 42 is formed on the deep source and drain regions 38 and 39 in contact with the side faces of the sacrificial insulating film 33 and side wall 40. An element isolation region 32 is formed in contact with the side faces of the deep source and drain regions 38 and 39 and the bottom surface of the interlayer insulating film 42.

In FIG. 27, the source region 36 (source extension region) and drain region 37 (drain extension region) are not extended under the gate electrode 47. It is preferable to extend the source and drain regions 36 and 37 under the gate insulating film 46 below the ends of the gate electrode 47, to reduce gate-source resistance and gate-drain resistance.

FIGS. 28A to 28G are sectional views showing the method of the embodiment 5 for manufacturing a MISFET having the impurity concentration profiles of the embodiment 1 according to the damascene gate process. The method will be explained in detail.

Figure 28A:
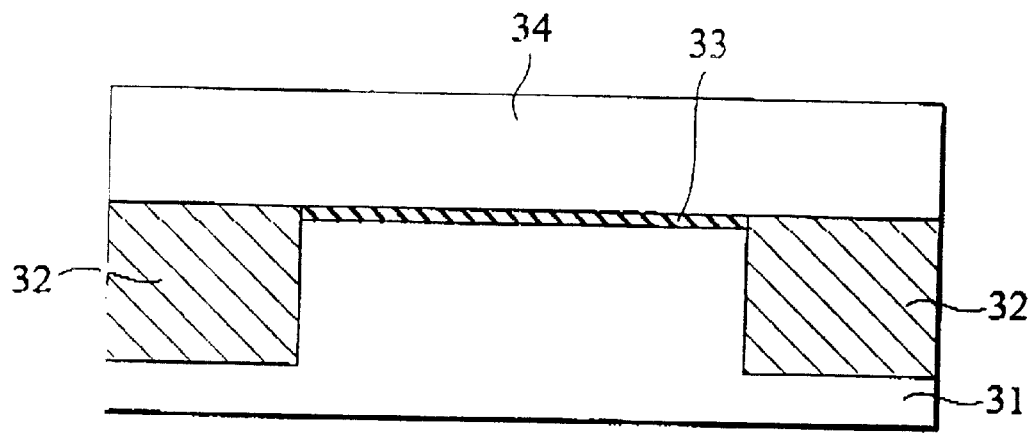
FIGS. 28A to 28G are sectional view showing a method of manufacturing the MISFET of FIG. 27.

(1) In FIG. 28A, a silicon substrate 31 is dry-etched to form an element isolation groove. An insulating film such as a silicon oxide film is deposited or coated to fill the groove. The insulating film outside the element isolation groove is removed by CMP or MP, to form an element isolation region 32 in the silicon substrate 31. A sacrificial oxide film 33 of about 3 nm thick is formed on the substrate 31 by thermal oxidation. A film 34 serving as a dummy gate pattern 35 is formed on the sacrificial oxide film 33 and element isolation region 32. The film 34 may be a silicon oxide film containing hydrogen or a lamination of two layers. The lamination may be made of a lower layer such as an amorphous silicon film whose etching speed is faster than that of the sacrificial oxide film 33, and an upper layer such as a silicon nitride film whose polishing speed is slower than that of an interlayer insulating film 42 to be formed and polished later.

Figure 28B:
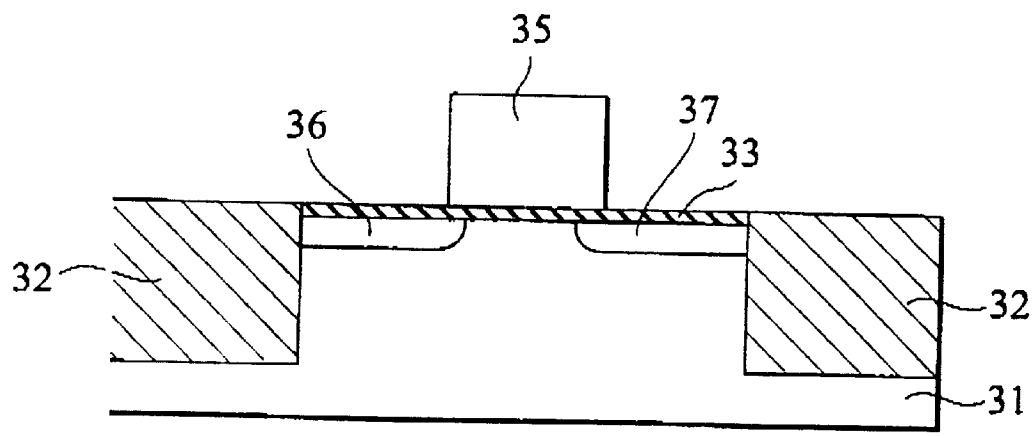

(2) In FIG. 28B, the film 34 is processed by anisotropic etching such as RIE into a dummy gate pattern 35 that corresponds to a gate electrode pattern. The dummy gate pattern 35 is used to implant impurity ions into the substrate surface. The implanted ions are electrically activated by heat treatment to form source and drain regions 36 and 37. The impurities may be introduced by plasma doping, gas-phase diffusion, or solid-phase diffusion. The impurities may be activated by RTA carried out at 800 or 900 degrees centigrade attained by a heating speed of 100 degrees centigrade per second or faster for 30 seconds or shorter, to keep the shallowness of the source and drain regions 36 and 37.

Figure 28C:
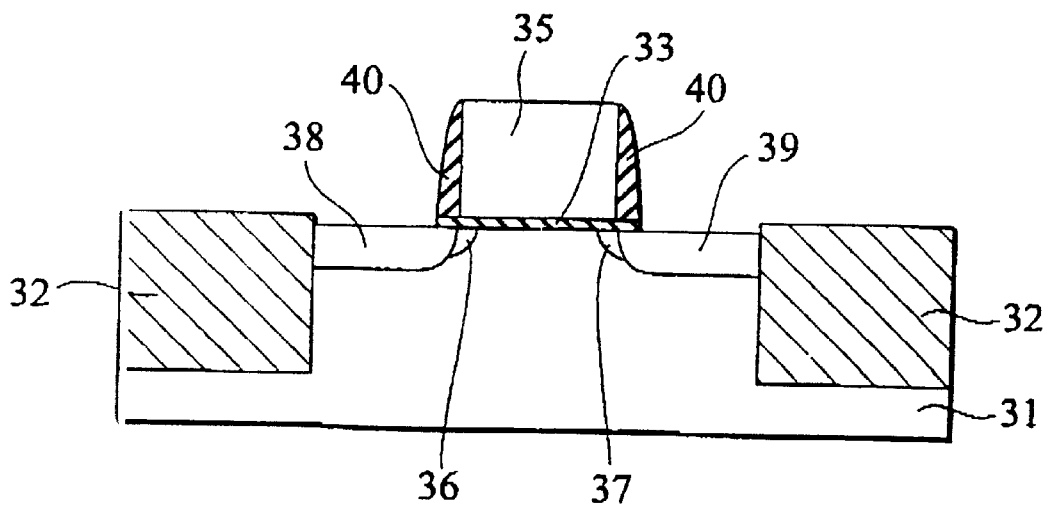

(3) In FIG. 28C, a side wall 40 is formed from a silicon nitride insulating film or silicon nitride oxide insulating film of 5 to 30 nm thick. This film is entirely formed over the substrate surface including the pattern 35 by chemical vapor deposition (CVD). The insulating film is partly etched by RIE to leave the side wall 40 along the side wall of the pattern 35. The insulating film is made from material whose RIE speed is slower than that of the pattern 35. If the pattern 35 is made of a silicon oxide film, the insulating film will be a silicon nitride film or a silicon oxide nitride (SiOxNy) film. If the pattern 35 is a polysilicon film, the insulating film will be a silicon oxide film.

It is preferable to form an oxide film of 10 nm thick or thinner on the pattern 35 before forming the side wall 40. This oxide film prevents the side wall 40 from horizontally moving when the pattern 35 is removed.

The side wall 40 and pattern 35 are used as a mask to implant impurity ions into the substrate surface. The implanted impurities are electrically activated to form deep source and drain regions 38 and 39. To increase the concentration of the activated impurities, heat treatment may be carried out with an electron beam, a laser having ultraviolet wavelengths, a mercury lamp or a xenon lamp at 1000 degrees centigrade for less than one second. The activation of the source and drain regions 36 and 37 and the activation of the deep source and drain regions 38 and 39 may simultaneously be carried out. The deep source and drain regions 38 and 39 may be covered with a metal silicide layer such as a cobalt silicide ($CoSi_2$) layer.

Unlike a standard planar transistor processor, the damascene gate process forms the source and drain regions 36 and 37 and the deep source and drain regions 38 and 39 before the formation of a channel impurity concentration profile. As a result, channel impurities are not affected by the heat treatment on the regions 36 to 39 or by the heat treatment for making the surfaces of the deep source and drain regions 38 and 39 into silicide. Consequently, the damascene gate process forms a lightly doped drain structure (LDD).

Figure 28D:
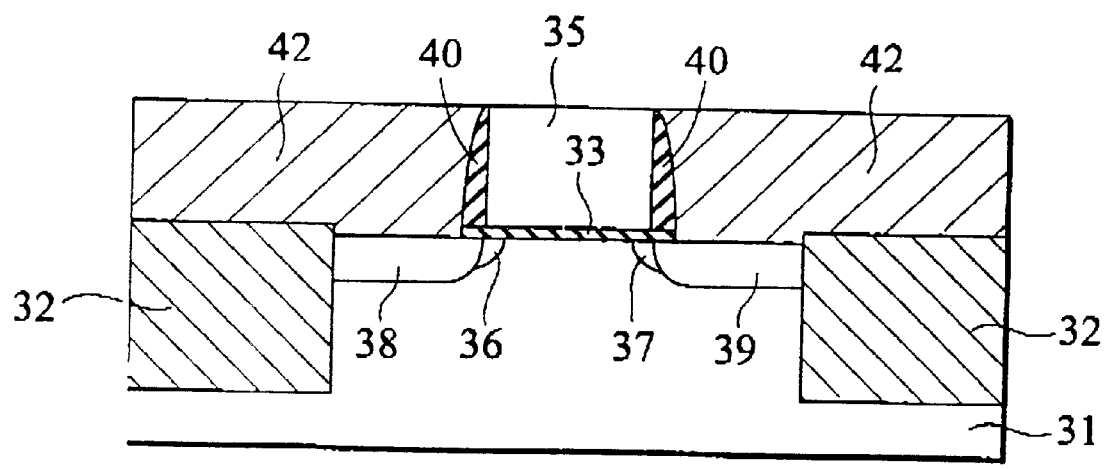

(4) In FIG. 28D, an interlayer insulating film 42 is entirely formed over the substrate surface by CVD. The interlayer insulating film 42 is polished and flattened by CMP to expose the surface of the pattern 35.

Figure 28E:
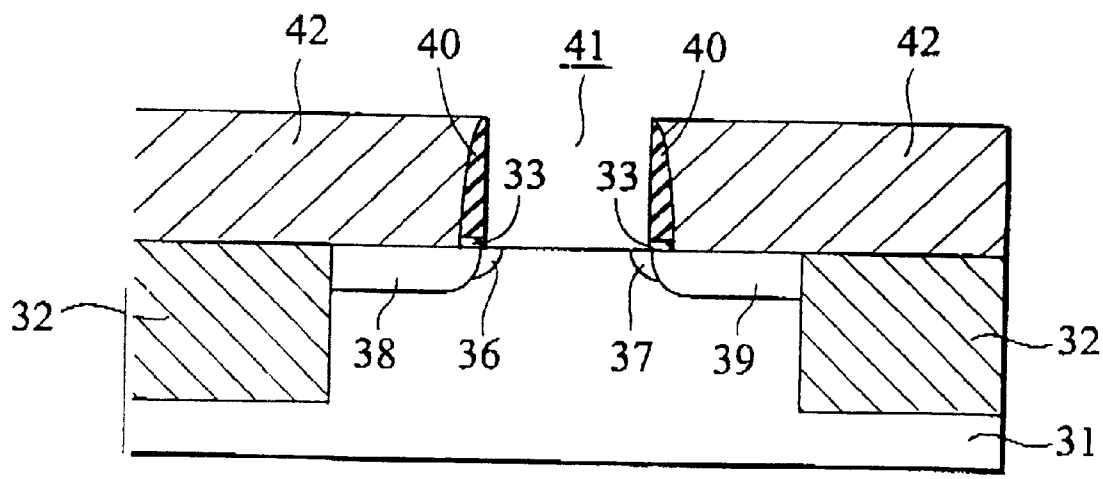
Figure 28F:
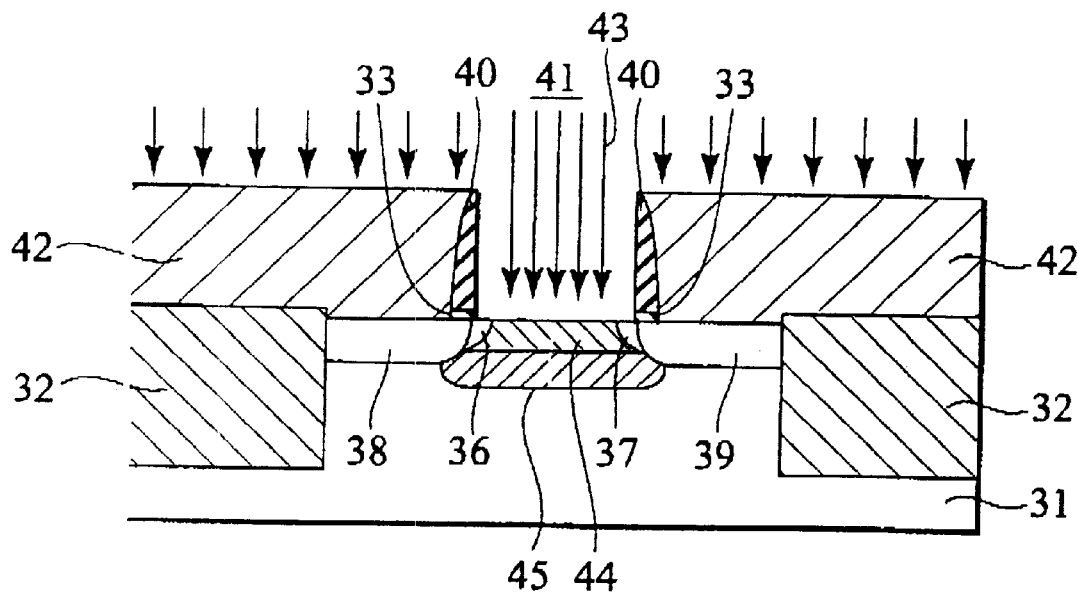

(5) In FIG. 28E, the pattern 35 and sacrificial oxide film 33 are removed by selective etching, to form an opening 41. In FIG. 28F, impurity ions 43 are implanted into the substrate surface through the opening 41. More precisely, indium ions of $5 \times 10^{13}$ cm$^{-2}$ are implanted at 190 keV. Thereafter, antimony ions of $5 \times 10^{11}$ cm$^{-2}$ are implanted at 5 keV. The implanted impurities are activated by RTA at 850 degrees centigrade for 30 seconds.

Figure 28G:
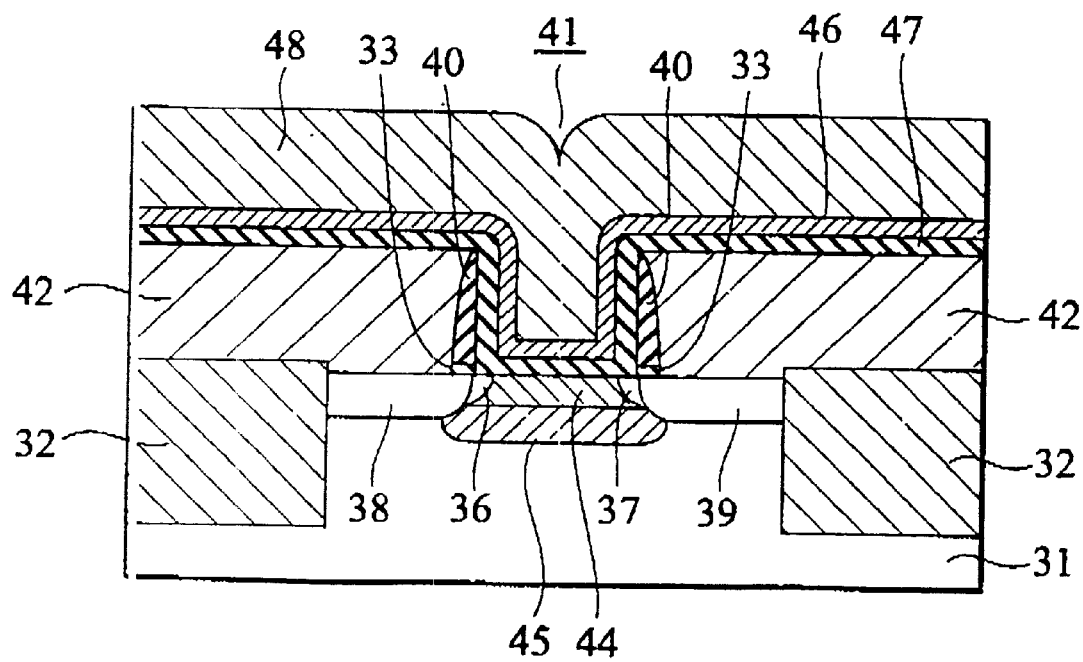

(6) In FIG. 28G, a gate insulating film 46 is formed. This film 46 may be an SiOxNy film of 2 to 3 nm thick, or a nitride film formed by nitriding nitride radicals at 500 degrees centigrade or below. The gate insulating film 46 may be formed by CVD on the bottom and side walls of the opening 41. Alternatively, the gate insulating film 46 may be formed only on the bottom of the opening 41 by oxidizing the exposed silicon substrate 31 at the bottom of the opening 41.

A conductive film 47 of 10 nm thick or thinner serving as a first gate electrode is formed from conductive metal such as TiN that determines a gate work function. When using TiN, the composition of TiN and film forming temperature and pressure are set to make the grain diameter of TiN less than 30 nm.

A conductive film 48 serving as a second gate electrode is entirely formed. More precisely, an Al film is entirely formed by spattering and is reflowed to fill the inside of the opening 41. Alternatively, a low-resistance metal film such as a tungsten film is entirely deposited by CVD to fill the opening 41.

(7) Excessive parts of the gate insulating film 46 and conductive films 47 and 48 outside the opening 41 are removed by CMP or MP, to provide a polished flat surface. As a result, the opening 41 contains the gate insulating film 46, first gate electrode 47, and second gate electrode 48, to complete the MIS transistor of FIG. 27. Thereafter, wiring contacts are formed through the interlayer insulating film 42 to the source and drain regions. Micronization may increase parasitic capacitance between the gate electrode and the contact or wiring, to deteriorate circuit characteristics such as a response speed. To reduce the parasitic capacitance, the surface flattening process by CMP or MP of the step (7) may expose and recess the top of the side wall nitride film 40. An insulating film whose dielectric constant is smaller than that of the nitride film 40 is buried in the recess, thereby replacing the side wall 40 with the low-dielectric-constant film. The side wall 40 may be replaced with a silicon oxide film formed by low-pressure CVD, a fluorine-added silicon oxide film formed by plasma CVD, or a low-dielectric-constant organic, organic-inorganic-mixed, or inorganic film formed by rotative coating.

Embodiment 6

The embodiment 6 of the present invention provides a MISFET having the impurity concentration profiles of the embodiment 3 and a method of manufacturing the MISFET. The embodiment 6 forms the transistor without using the damascene gate process. Namely, the embodiment 6 forms the channel impurity concentration profile of the embodiment 3 according to a conventional planar transistor manufacturing method. To achieve this, the embodiment 6 forms the channel impurity concentration profile from heavy metal impurities having a small diffusion coefficient. In addition, the embodiment 6 minimizes heat treatment when forming a gate insulating film, activating source and drain impurities, and forming a polysilicon gate electrode. Although the embodiment 6 involves a gentler channel impurity concentration profile falling toward the surface of a substrate, it can suppress Vth variations.

Figure 29:
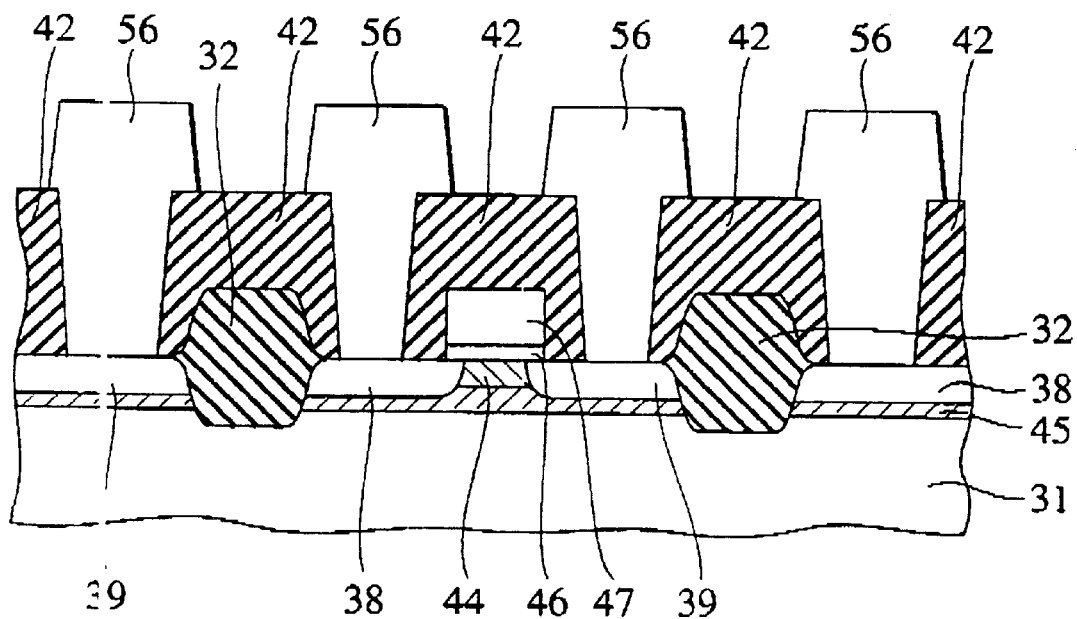
FIG. 29 is a sectional view showing a MISFET according to an embodiment 6 of the present invention employing the channel impurity concentration profile of the embodiment 3.

FIG. 29 is a sectional view showing a MISFET according to the embodiment 6 having the channel impurity concentration profile of the embodiment 3. The MISFET has a semiconductor substrate 31 of a first conductivity type, a gate insulating film 46 in contact with the top surface of the substrate 31, and a gate electrode 47 in contact with the top surface of the gate insulating film 46. The substrate 31 has a counter impurity region 44 of a second conductivity type formed under the gate insulating film 46, a source region 38 of the second conductivity type formed at the surface of the substrate 31 in contact with the counter impurity region 44, a drain region 39 of the second conductivity type formed at the surface of the substrate 31 in contact with the counter impurity region 44, and a channel impurity region 45 of the first conductivity type formed under the regions 44, 38, and 39. The counter impurity region 44 and channel impurity region 45 have the impurity concentration profiles of the embodiment 3. An element isolation region 32 is formed in contact with the side faces of the source region 38, drain region 39, and channel impurity region 45. An interlayer insulating film 42 is formed on the surface of the element isolation region 32 and on the top and side faces of the gate electrode 47. Lead electrodes (contact plugs) 56 are formed on the source and drain regions 38 and 39 in contact with the top and side faces of the interlayer insulating film 42.

Figure 30A:
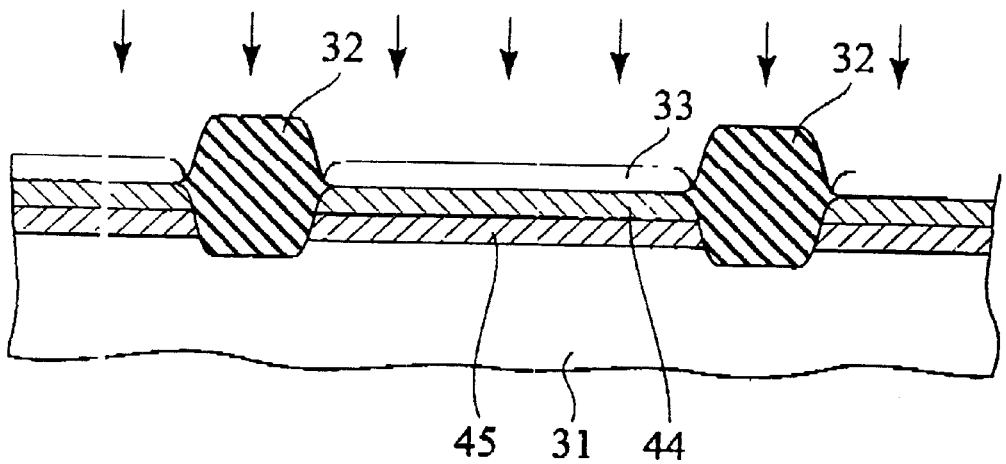
FIGS. 30A to 30C are sectional views showing a method of manufacturing the MISFET of FIG. 29.
Figure 30B:
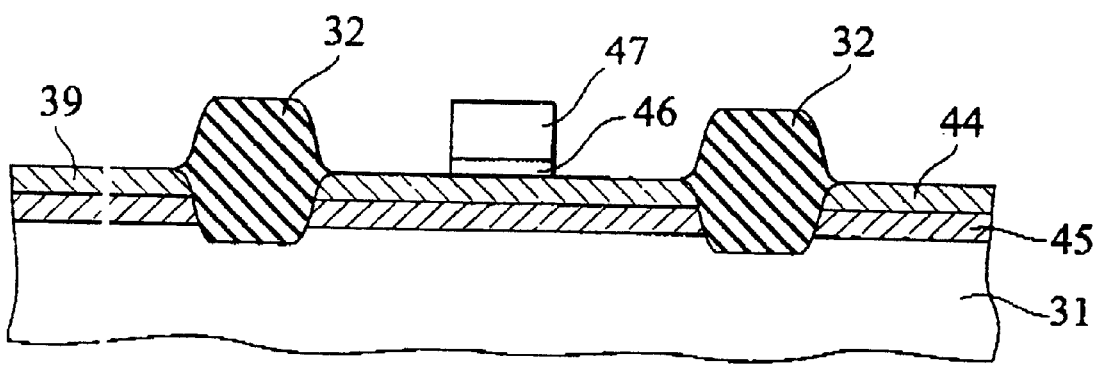
Figure 30C:
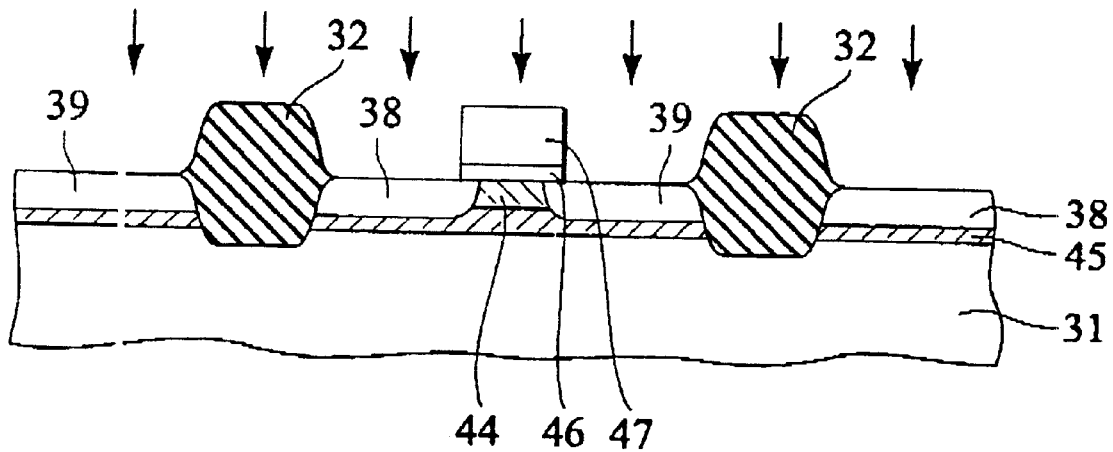

FIGS. 30A to 30C are sectional views showing a method of manufacturing the MISFET of the embodiment 6 having the channel impurity concentration profile of the embodiment 6 with the use of the planar process. The method will be explained in detail.

(1) In FIG. 30A, an element isolation region 32 is formed on a substrate 31. A sacrificial oxide film 33 of 20 nm thick is formed. Through the sacrificial oxide film 33, indium ions of $1.2 \times 10^{14}$ cm$^{-2}$ are implanted at 60 keV to form a channel impurity region 45. Arsenic ions of $1 \times 10^{12}$ cm$^{-2}$ are implanted at 5 keV to form a counter impurity region 44.

(2) In FIG. 30B, the sacrifical oxide film 33 is removed, and a gate oxide film 46 of 5 nm thick is formed by steam oxidation (hydrogen adding thermal oxidation) at 850 degrees centigrade for 10 minutes. Polysilicon is deposited by CVD. Photolithography and RIE are carried out to form a gate electrode 47.

(3) In FIG. 30C, the gate electrode 47 is used as a mask to implant ions. This forms source and drain regions 38 and 39 and introduces impurities into the polysilicon gate electrode 47. The impurities in the source and drain regions 38 and 39 and gate electrode 47 are activated by annealing at a substrate temperature of 900 degrees centigrade for one minute.

(4) An interlayer insulating film 42 is deposited, and a mask is used to form contact holes by lithography. As shown in FIG. 29, the contact holes are filled with an aluminum film by spattering. Leads 56 are formed by photolithography and RIE. At this time, a peak indium concentration is at a depth of about 30 nm and is about $3'10^{18}$ cm$^{-3}$. A surface indium concentration is bout $5 \times 10^{17}$ cm$^{-3}$. The indium diffuses during heat treatment carried out after the ion implantation, to increase the surface concentration. In spite of this, a channel impurity concentration in a net n-type impurity region is low compared with a conventional MISFET that has a pn junction in a channel region. As a result, the MISFET of the embodiment 6 involves little Vth variations.

Embodiment 7

The embodiment 7 of the present invention provides metal gate CMOS transistors each having the channel impurity concentration profile of the present invention and a method of manufacturing the CMOS transistors. An integrated CMOS circuit densely forms nMOSFETs and pMOSFETs on the same substrate. When these transistors have each a metal gate, it is necessary to simplify a gate electrode forming process and form the channel impurity concentration profile of each transistor so as to minimize Vth variations. The present invention employs a low counter impurity concentration profile and a channel impurity concentration profile that steeply falls at the surface of a substrate, to realize a low Vth value and reduce Vth variations for a CMOS circuit consisting of a pMOSFET and an nMOSFET having metal gates of the same material. Only one of the pMOSFET and nMOSFET may have the channel impurity concentration profile of the present invention, and the other may have a conventional channel impurity concentration profile. The embodiment 7, however, employs the channel impurity concentration profile of the present invention for both the pMOSFET and nMOSFET.

Figure 31:
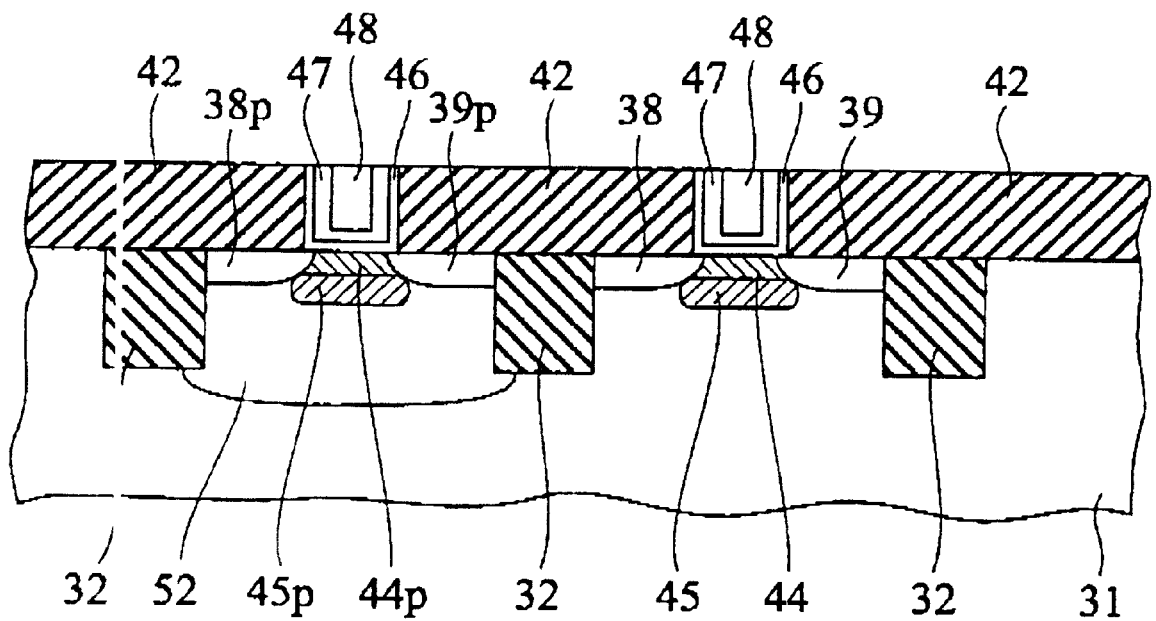
FIG. 31 is a sectional view showing CMOS transistors according to an embodiment 7 of the present invention.

FIG. 31 is a sectional view showing a CMOS circuit employing the channel impurity concentration profile of the present invention and metal gate electrodes. The CMOS circuit consists of an nMOSFET and a pMOSFET formed on the same semiconductor substrate 31.

The nMOSFET has the p-type semiconductor substrate 31, a gate insulating film 46 in contact with the top surface of the substrate 31, a first gate electrode 47 in contact with the top surface of the gate insulating film 46, and a second gate electrode 48 in contact with the top surface of the first gate electrode 47. The substrate 31 has an n-type counter impurity region 44 formed under the gate insulating film 46, a p-type channel impurity region 45 formed under he counter impurity region 44, an n-type source region 38 formed at the surface of the substrate 31 in contact with the counter impurity region 44, and an n-type drain region 39 formed at the surface of the substrate 31 in contact with the counter impurity region 44. The counter impurity region 44 and channel impurity region 45 have the impurity concentration profiles of the embodiment 2. An interlayer insulating film 42 is formed on the source and drain regions 38 and 39 in contact with the side face of the gate insulating film 46. An element isolation region 32 is formed in contact with the side faces of the source and drain regions 38 and 39 and the bottom of the interlayer insulating film 42. A contact (not shown) is formed through the interlayer insulating film 42 to each of the source and drain regions and is connected to wiring of the integrated circuit.

The pMOSFET has the p-type semiconductor substrate 31, a gate insulating film 46 in contact with the top surface of the substrate 31, a first gate electrode 47 in contact with the top surface of the gate insulating film 46, and a second gate electrode 48 in contact with the top surface of the first gate electrode 47. The substrate 31 has a p-type counter impurity region 44p formed under the gate insulating film 46, an n-type channel impurity region 45p formed under the counter impurity region 44p, a p-type source region 38p formed at the surface of the substrate 31 in contact with the counter impurity region 44p, a p-type drain region 39p formed at the surface of the substrate 31 in contact with the counter impurity region 44p, and an n-type well region 52 in contact with the bottoms of the regions 45p, 38p, and 39p. The counter impurity region 44p and channel impurity region 45p have the impurity concentration profiles of the embodiment 2. The interlayer insulating film 42 is formed on the source and drain regions 38p and 39p in contact with the side face of the gate insulating film 46. The element isolation region 32 is formed in contact with the side faces of the source and drain regions 38p and 39p and the bottom of the interlayer insulating film 42.

Figure 32A:
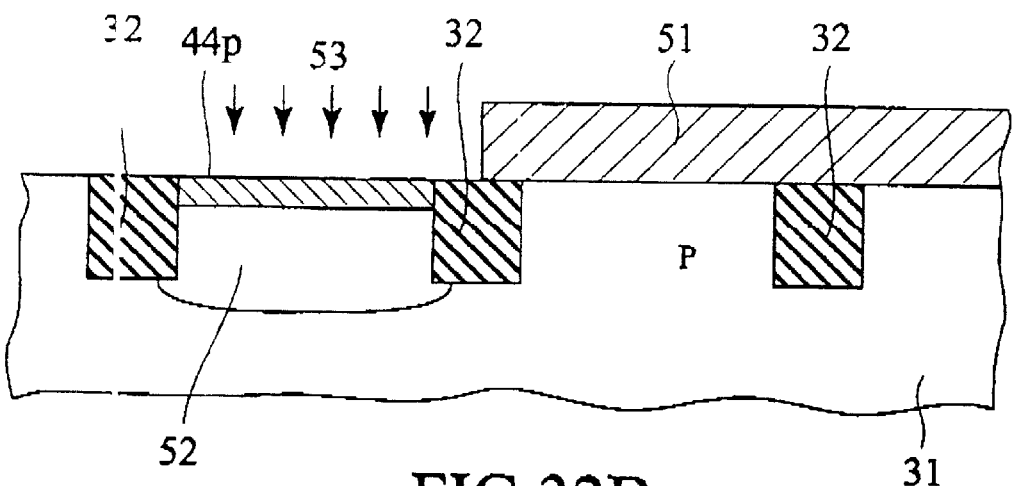
FIGS. 32A to 32C are sectional views showing a method of manfacturing the CMOS transistors of FIG. 31.
Figure 32B:
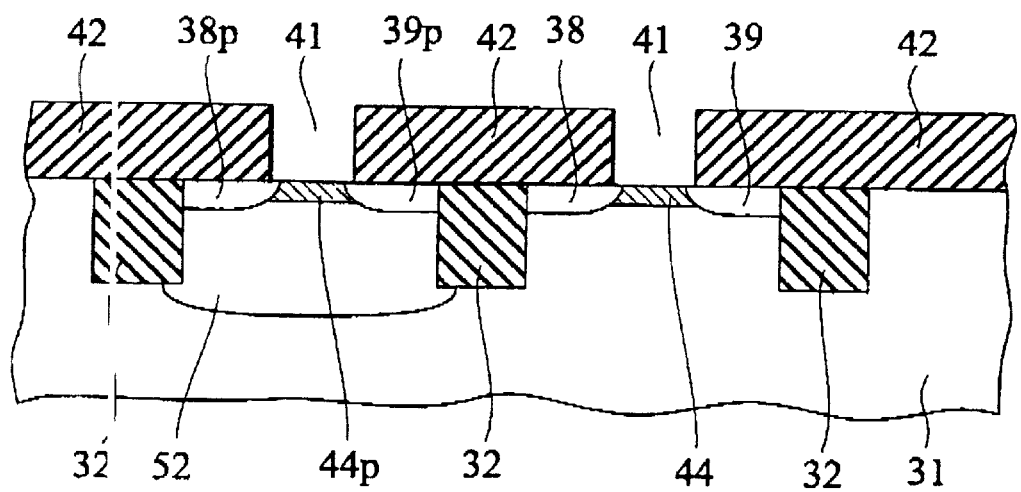
Figure 32C:
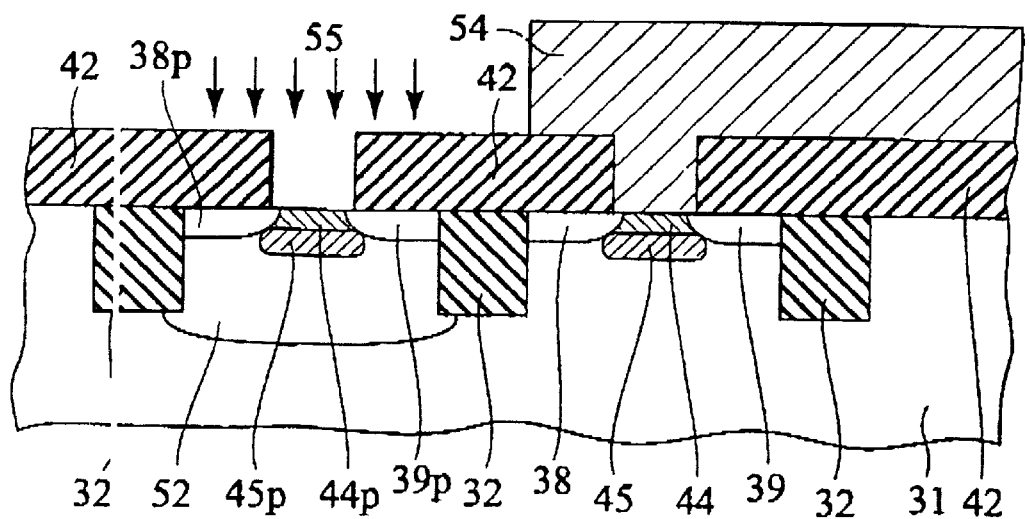

FIGS. 32A to 32C are sectional views showing a method of manufacturing the metal gate CMOS transistors of the embodiment 7 with the use of damascene gate process. Any one of the embodiments 1 to 6 may be employed to form the CMOS transistors. The example mentioned below employs the channel concentration profile of the embodiment 4 to form a CMOS structure.

(1) In FIG. 32A, an element isolation region 32 is formed on a p-type silicon substrate 31, to electrically isolate an nMOSFET and a pMOSFET from each other. The element isolation region 32 is formed by forming a groove, filling the groove with an oxide film, and flattening the oxide film by CMP as explained with reference to FIG. 28A of the embodiment 5.

An n-type well region 52 is formed in a part of the substrate where a pMOSFET is going to be formed. A sacrificial oxide film of, for example, 4 nm thick is formed on the surface of an element area by thermal oxidation. An area where an nMOSFET is going to be formed is covered with a resist 51 by photolithography. The resist 51 is used as a mask to implant, for example, phosphorus ions of $2 \times 10^{13}$ $cm^{-2}$ at 500 keV. Heat annealing is carried out to diffuse impurities in the n-type well 52 to a required depth and activate the impurities. Instead of the annealing, the impurities may be activated by later heat treatment such as one for oxidizing a gate.

The pMOSFET is formed according to the counter impurity concentration profile forming method of the embodiment 4. The resist 51 used to form the n-type well 52 is used as a mask to implant counter impurities 53 for the pMOSFET. This forms a p-type counter impurity region 44p. The counter impurity ions may be boron ions of $1 \times 10^{13}$ $cm^{-2}$ implanted at a zero-degree implantation angle and 10 keV in acceleration energy.

The resist 51 is removed and the counter impurity concentration profile forming method of the embodiment 4 is carried out. An area where the pMOSFET is going to be formed is covered with a resist by photolithography. The resist is used as a mask to implant ions to form a counter impurity region 44 for the nMOSFET. The ions for the nMOSFET counter impurity region 44 may be arsenic ions of $2 \times 10^{12}$ $cm^{-2}$ implanted at zero-degree implantation angle and 5 keV in acceleration energy.

(2) The resist is removed, and a film 34 serving as a dummy gate pattern 35 (FIG. 28B of the embodiment 5) is formed. The dummy gate pattern 35 is formed by lithography and anisotropic etching as explained with reference to FIG. 28B.

The pattern 35 is used as a mask to form source and drain regions adjacent to the pattern 35, as explained with reference to FIG. 28B. The areas where the nMOSFET and pMOSFET are formed are successively covered with resist by photolithography. The resist is used as a mask to selectively implant p-type impurity ions into source and drain regions 38p and 39p of the pMOSFET and n-type impurity ions into the source and drain regions 38 and 39 of the nMOSFET. It is preferable to use a side wall 40 to form LDD drain and source structures having deep diffusion layers retracted from the channel region. As explained above, resist masks are successively formed to selectively form a p-type deep impurity layer for the pMOSFET and an n-type deep impurity layer for the nMOSFET.

The resist masks are removed, and the impurities are activated. Metal such as titanium or cobalt is deposited over the source and drain regions 38, 39, 38*p*, and 39*p* as explained in the embodiment 5. This forms silicide to reduce contact resistance to the source and drain regions. In this way, the embodiment 7 implants counter impurities for a pMOSFET and an nMOSFET into a substrate, forms and activates source and drain regions, and carries out heat treatment for forming silicide. This heat treatment makes the counter impurity concentration profiles gentler as explained in the embodiment 4. The gentle profiles reduce Vth variations against profile variations, as explained in the embodiment 2.

In FIG. 32B, an interlayer insulating film 42 is deposited and is flattened as explained with reference to FIG. 28D. The dummy gate pattern 35 is removed by etching to form an opening 41.

(3) In FIG. 32C, channel impurities are implanted to form channel impurity regions 45 and 45*p* for the nMOSFET and pMOSFET. An oxide film on the substrate in the opening 41 is removed. On the exposed surface of the substrate, a sacrificial oxide film of, for example, 2 nm thick is formed by steam oxidation at about 750 degrees centigrade. The sacrifical oxide film may be made by chemical oxidation such as COM to avoid heat treatment. The nMOSFET and pMOSFET are successively covered with resist by photolithography, and n-type impurity ions 55 are selectively implanted into the pMOSFET channel region through the opening 41. The n-type impurity ions are implanted so that the concentration profile thereof steeply decreases at the substrate surface. In addition, the concentration of the n-type impurities must sufficiently be high to suppress the short channel effect. The n-type impurities may be antimony ions of $4 \times 10^{13}$ cm$^{-2}$ implanted at zero-degree implantation angle and 130 keV in acceleration energy. Similarly, p-type impurities of sufficiently high concentration are selectively implanted into the nMOSFET channel region. The p-type impurities may be indium ions of $2 \times 10^{13}$ cm$^{-2}$ implanted at zero-degree implantation angle and 130 keV in acceleration energy.

(4) The resist is removed and a gate insulating film and a gate electrode are formed as explained with reference to FIG. 28G of the embodiment 5. This completes the pMOSFET and nMOSFET of FIG. 31.

The embodiment 7 employs the channel profiles of the present invention according to the work function of a gate electrode to realize a required Vth with little variations. The embodiment 7 simultaneously forms the gate electrodes of pMOSFET and nMOSFET. Namely, the embodiment 7 employs a single gate structure to greatly simplify processes, reduce costs, and improve yield compared with a dual gate structure.

To realize the single gate structure, the embodiment 7 applies the channel profiles of the present invention to both the pMOSFET and nMOSFET. This, however, complicates channel impurity concentration profile forming processes. To easily form the impurity concentration profiles of nMOSFET and pMOSFET according to required Vth values, it is possible to shift a single gate work function from a mid-gap. It is also possible to employ the same metal or metal compound to form the first and second gate electrodes 47 and 48 of each of the pMOSFET and nMOSFET. In this case, only one of the pMOSFET and nMOSFET is subjected to an additional process to change the work function of the first gate electrode 47 thereof, thereby realizing required Vth values for the pMOSFET and nMOSFET.

The additional process applied to one of the pMOSFET and nMOSFET forms the gate electrode 47 by CVD or PVD and changes the crystalline orientation of metal or metal compound to change the work function thereof. Also possible is adding impurities such as nitride into one of the gate electrodes 47 to change the work function thereof.

In this way, the embodiment 7 applies the channel profiles of the present invention to both or one of the pMOSFET and nMOSFET of a CMOS circuit, adjusts a single gate work function, and is required, additionally adjusts one of the pMOSFET and nMOSFET to provide a high-performance metal gate CMOS circuit involving little Vth variations.

Embodiment 8

Figure 33:
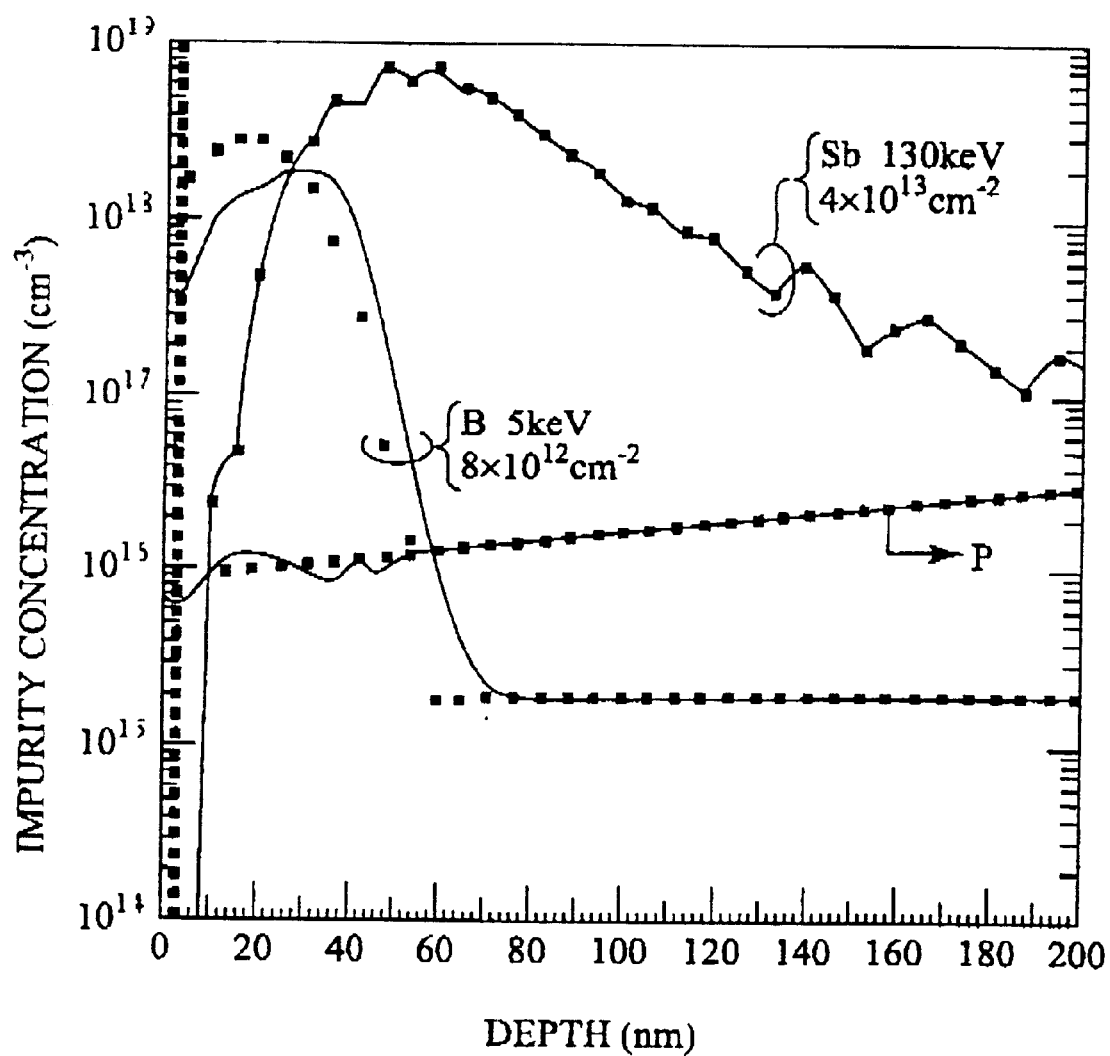
FIG. 33 is a graph showing channel and counter impurity concentration profiles of a metal-gate pMOSFET according to an embodiment 8 of the present invention.

FIG. 33 is a graph showing the channel impurity concentration profile and counter impurity concentration profile of a metal-gate pMOSFET according to the embodiment 8 of the present invention. An abscissa represents depths from the surface of a silicon substrate, and an ordinate represents impurity concentrations. Values in FIG. 33 are based on process simultaneous. A profile plotted with dots is of just after ion implantation, and a profile plotted with a continuous line is a final profile. Channel impurities are antimony (Sb) ions, and counter impurities are boron (B) ions. Phosphorus ions are deeply implanted in advance to form an n-type well. The channel antimony impurities have a concentration of $5 \times 10^{18}$ cm$^{-3}$ at a depth of 40 nm, which steeply falls toward the substrate surface. In this low-concentration surface area, the counter boron impurities are implanted. The concentration of boron decreases toward the substrate surface. These impurity concentration profiles correspond to the channel and counter impurity concentration profiles of FIGS. 12A and 12B.

A method of manufacturing the metal-gate pMOSFET of the embodiment 8 will be explained. The processes of the embodiment 5 of FIGS. 28A to 28E are carried out as they are. Thereafter, the dummy gate is removed. Antimony ions of $4 \times 10^{13}$ cm$^{-2}$ are implanted at 130 keV, and boron ions of $8 \times 10^{12}$ cm$^{-2}$ are implanted at 5 keV. The sacrificial oxide film is removed, and a gate insulating film of 3 nm thick is formed by steam oxidation at 750 degrees centigrade. Thereafter, the processes starting from FIG. 28G of the embodiment 5 are carried out.

In this way, the embodiment 8 implants antimony ions to form an antimony concentration profile that steeply decreases at a substrate surface. Just after the antimony implantation, the embodiment 8 deeply implants boron ions to overlap the surface side of the antimony profile. The concentration of boron in the substrate is high after the last gate oxidizing process. On the other hand, boron ions in the vicinity of the substrate surface diffuse from the substrate surface into an oxide film by the succeeding heat treatment and then to the outside. As a result, the concentration of boron at the substrate surface becomes low. The embodiment 8 overlaps boron ions of negative charge on antimony ions of positive charge, so that the boron ions are attracted by the antimony ions due to electric field effect. These phenomena form a counter impurity concentration profile that decreases from a pn junction toward the substrate surface.

Embodiment 9

FIG. 34 is a graph showing Vth variations caused by statistical variations in the numbers and arrangements of channel and counter impurity atoms, based on device simulations. The device simulations are basically the same as surface-channel device simulations disclosed by Kazumi Nishinohara et al. in "Effects of Microscopic Variations in Dopant Distributions on MOSFET Threshold Voltages," IEEE Transactions on Electron Devices, Vol. 39, pp 634–639, 1992. The device simultaneous will be explained.

Each device structure is discretized into a lattice before calculating device characteristics. For each discrete unit space, the number of impurities is calculated according to a set impurity concentration and the volume of the unit space. The number of impurities is used as an average impurity number for the unit space, and around the average impurity number, random numbers are generated as variations. The set impurity concentration is replaced with an impurity concentration corresponding to one of the random numbers. These processes provide impurity concentration profile variations, which are used for device simulations. The generated random numbers show Poisson's distribution.

One group of random numbers provides one device structure sample. Ten device structure samples are prepared for each impurity concentration profile, and a threshold voltage Vth is calculated for each sample. Three types of impurity concentration profiles were picked up for the simulations. These profiles are for metal-gate nMOSFETs and are as follows:

(1) Impurity concentration profiles of FIG. 1

The profiles of FIG. 1 involve a channel impurity concentration of $2 \times 10^{18}$ cm$^{-3}$, a counter impurity concentration of $5.3 \times 10^{18}$ cm$^{-3}$, and a counter impurity concentration profile 2 extending to a depth of 10 nm from the surface of a substrate.

(2) Impurity concentration profiles of FIG. 8B

The profiles of FIG. 8B involve a channel impurity concentration profile 1 having a higher concentration of $5 \times 10^{18}$ cm$^{-3}$, a counter impurity concentration profile 2 of $1.6 \times 10^{18}$ cm$^{-3}$ extending to a depth of 10 nm from the surface of a substrate, and a depth B of 25 nm.

(3) Impurity concentration profiles of FIG. 7B

The profiles of FIG. 7B involve a channel impurity concentration profile 1 having a higher concentration of $5 \times 10^{18}$ cm$^{-3}$, a counter impurity concentration profile 2 of $8.3 \times 10^{17}$ cm$^{-3}$, and a depth B of 25 nm.

In each case, a gate length L is 95 nm and a channel width W0 is 95 nm.

Generally, increasing a channel width W wider then W0 averages statistical impurity distribution variations, and Vth variations are reduced to about $(W0/W)^{1/2}$. Each counter impurity concentration was adjusted so that an impurity concentration profile without variations may provide Vth=0.4 V. FIG. 34 shows that the profiles of FIG. 1 in which n- and p-type impurities of high concentrations cancel each other cause largest Vh variations with respect to statistical variations in a distribution of atoms. On the other hand, the profiles of FIG. 8B of the present invention that involve high-concentration counter impurities only at a substrate surface cause Vth variations one third or smaller of those of FIG. 1. The profiles of FIG. 7B of the present invention that involve a lower and longer counter impurity concentration profile than that of FIG. 8B cause further smaller Vth variations.

The statistical variations of atom distributions are basically unable to remove when a device is manufactured through ion implantation and thermal diffusion involving statistical characteristics. As a gate length is shortened due to micronization, a channel region becomes smaller to reduce the number of impurity atoms in a channel depletion layer. Then, variations in the number and arrangement of impurity atoms more strongly cause variations in device characteristics. The channel profiles of the present invention are effective to improve yield of very fine ICs containing MISFETs that employ counter impurities with channel impurities.

Embodiment 10

A problem with the micronization of a MOSFET is the short channel effect. The short channel effect is suppressible by forming shallow source and drain regions. This is achievable by a concave structure that forms a channel region below the surfaces of source and drain regions. The concave structure may be employed with a buried channel to realize a relatively low threshold voltage. A contact state between a source/drain region and a channel region is critical to the characteristics of an nMOS transistor. The embodiment 10 of the present invention provides a MISFET structure capable of maintaining a required contact state between a channel region and a source/drain region and a method of manufacturing such a MISFET structure.

The MISFET of the embodiment 10 employs the channel impurity concentration profile of FIG. 1 and the impurity concentration profiles of the embodiment 3.

Figure 35A:
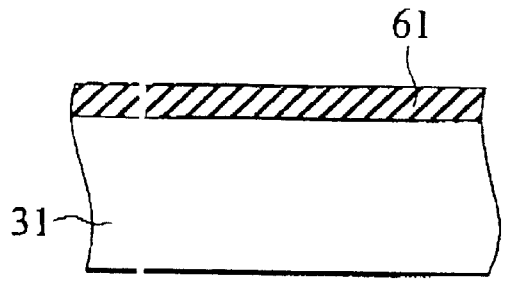
FIGS. 35A to 35M are sectional views showing a method of manufacturing a MISFET according to an embodiment 10 of the present invention.
Figure 35E:
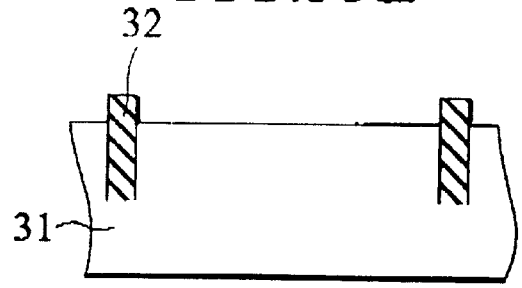
Figure 35B:
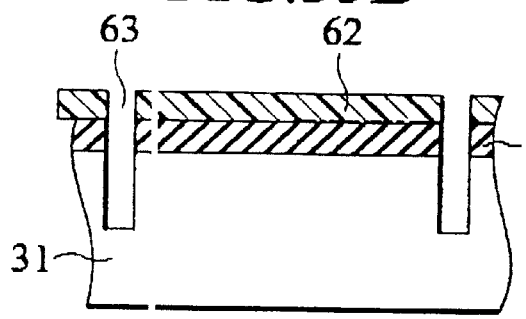
Figure 35F:
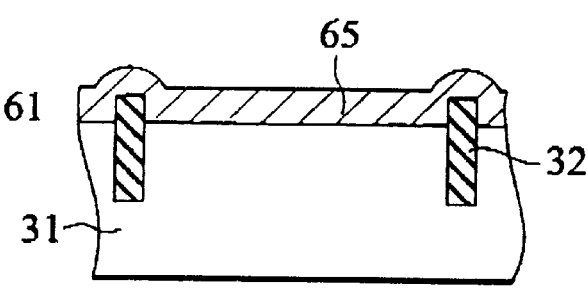
Figure 35C:
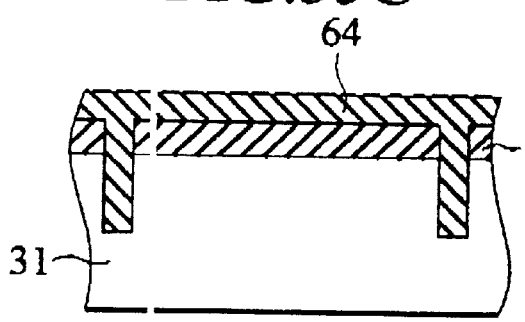
Figure 35G:
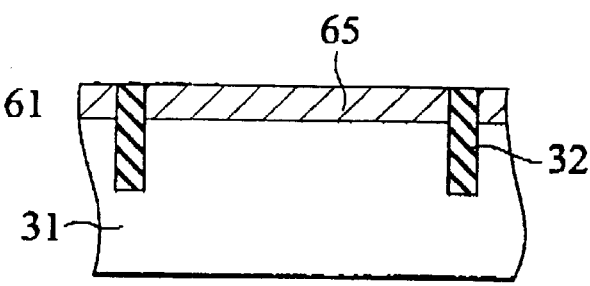
Figure 35D:
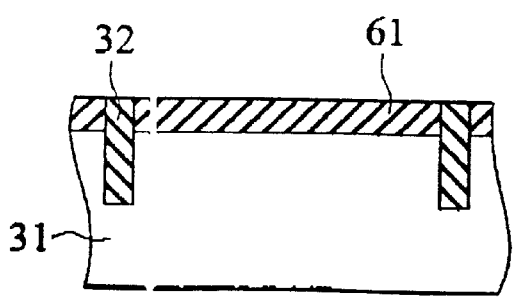
Figure 35H:
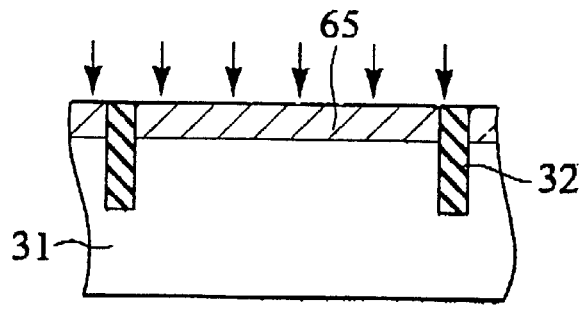
Figure 35I:
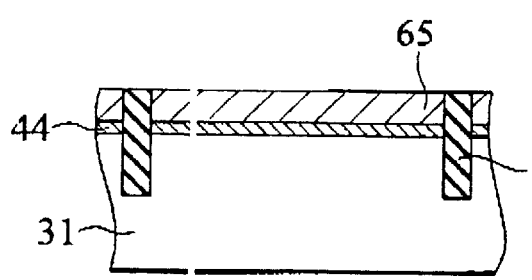
Figure 35L:
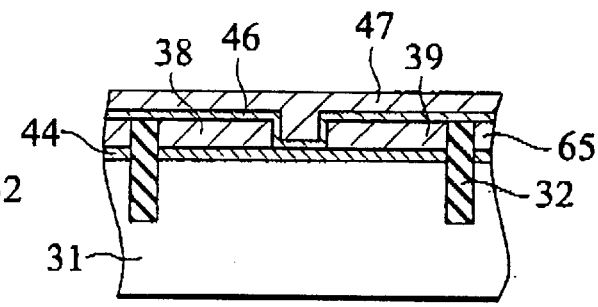
Figure 35J:
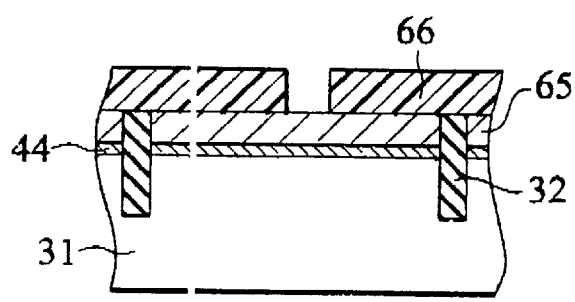
Figure 35M:
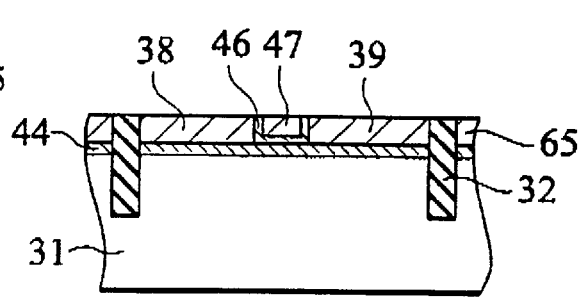
Figure 36A:
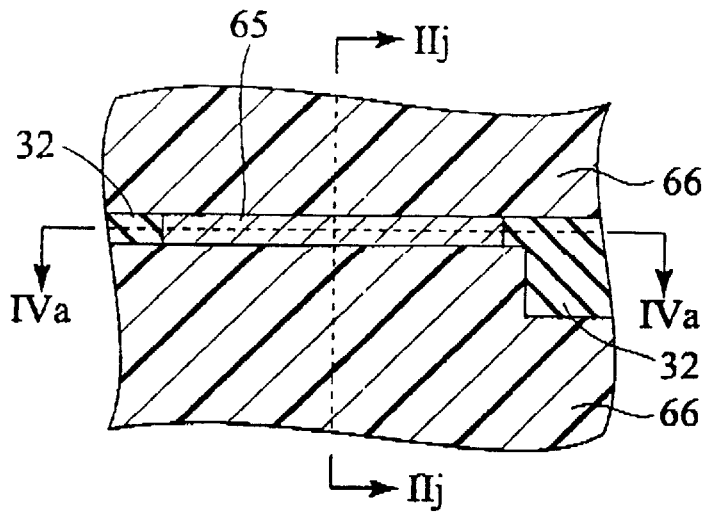
FIGS. 36A to 36C are top views showing some steps of the embodiment 10.
Figure 36B:
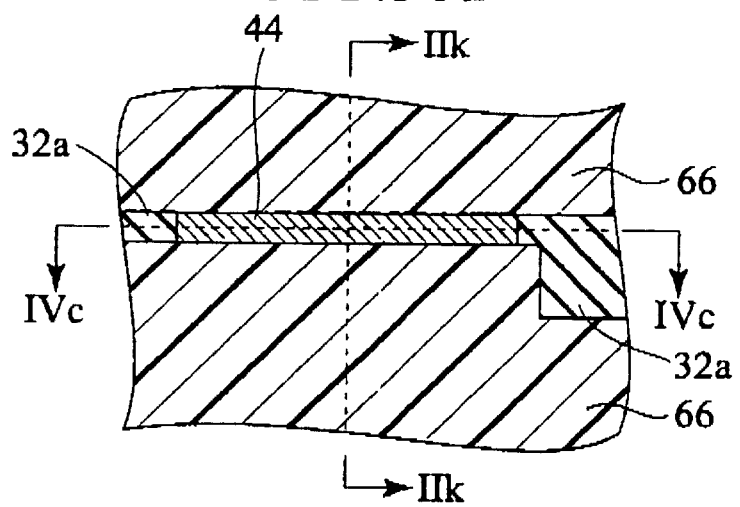
Figure 36C:
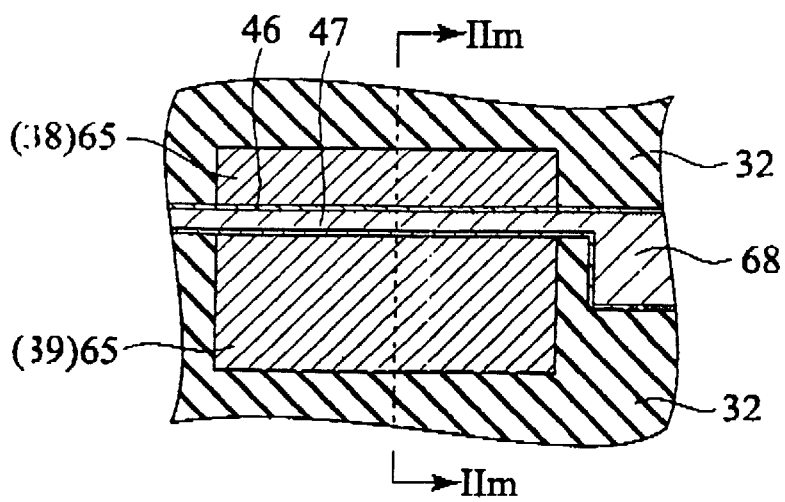

FIGS. 35M and 36C are sectional and top views showing the MISFET according to the embodiment 10. The MISFET has a semiconductor substrate 31 of a first conductivity type, a gate insulating film 46 in contact with the top surface of the substrate 31, a gate electrode 47 having a bottom, first side face, and second side face that are in contact with the gate insulating film 46, a source region 38 of a second conductivity type having a bottom in contact with the top surface of the substrate 31 and a side face opposed to the first side face of the gate electrode 47, and a drain region 39 of the second conductivity type having a bottom in contact with the top surface of the substrate 31 and a side face opposed to the second side face of the gate electrode 47. The substrate 31 has a counter impurity region 44 of the second conductivity type formed at the surface of the substrate 31 under the regions 38 and 39 and film 46. The counter impurity region 44 has the impurity concentration profile of FIG. 1. An element isolation region 32 surrounds the source and drain regions 38 and 39. A lead electrode 68 is integral with the gate electrode 47 and is formed on the element isolation region 32. The counter impurity region 44 maintains a constant contact state between the source and drain regions 38 and 39 and a channel region.

Figure 35K:
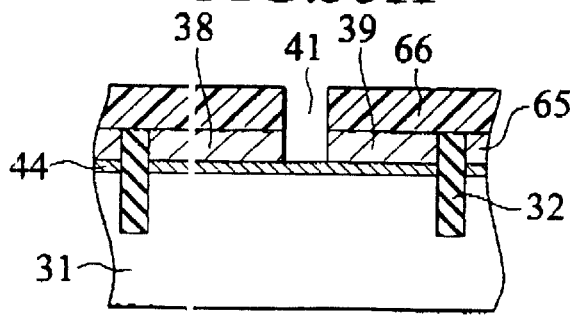
Figure 37A:
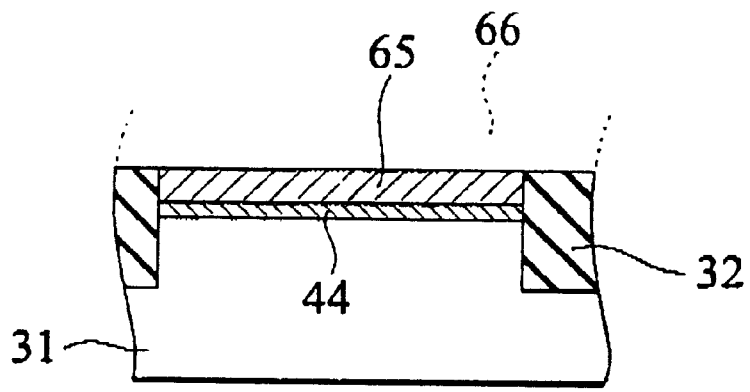
FIGS. 37A to 37C are sectional views showing some steps of the embodiment 10.
Figure 37B:
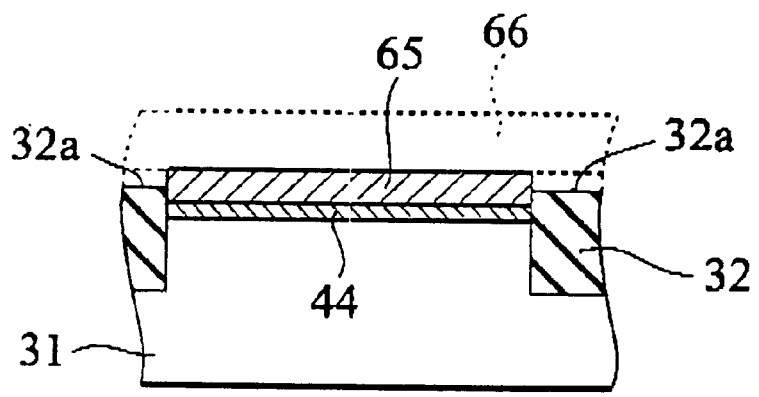
Figure 37C:
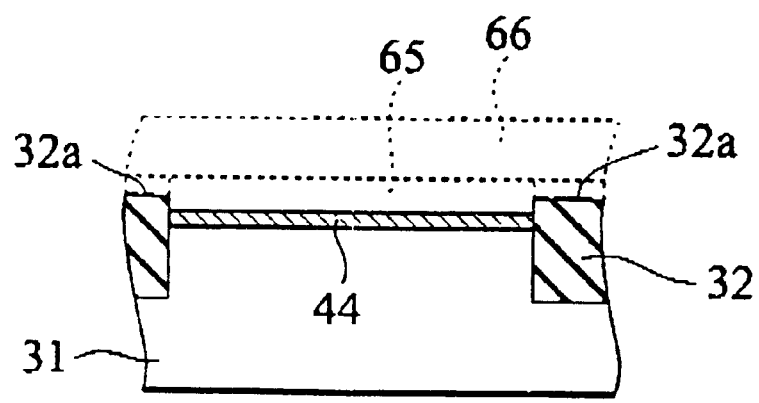

FIGS. 35A to 35M are sectional views showing a method of manufacturing the MISFET of the embodiment 10. FIGS. 36A to 36C are top views showing part of the manufacturing method. FIGS. 37A to 37C are sectional views showing part of the manufacturing method and the periphery of the MISFET. In the following explanation, the MISFET is an nMISFET. The same explanation is applicable to a pMISFET by reversing conductivity types.

In FIG. 35A, a substrate 31 is of p-type or has a p-type well (not shown). A silicon nitride film 6' is formed by vapor deposition on the substrate 31. The thickness of the nitride film 6' is, for example, about 100 nm. This thickness determines the thickness of a polysilicon film 65 serving as source and drain regions 38 and 39 as well as the depth of a gate 47.

In FIG. 35B, a resist pattern 62 is formed on the silicon nitride film 61. The resist pattern 62 is used as a mask to etch the film 61 and substrate 31, to form a groove 63 of, for example, about 200 nm deep.

The resist pattern 62 is removed, and defects of the groove 63 are removed if necessary. In FIG. 35C, an insulator film 64 mainly made of silicon oxide is formed on the nitride film 61 to fill the groove 63. The insulator film 64 serves as an element isolation region 32.

The deflects of the groove 63 may be removed by forming a thin thermal oxide film over the walls of the groove 63, or by etching the surface of the groove 63 by CDE or wet etching. The insulator film 64 is formed by CVD of proper filling characteristics, such as sub-atmosphere CVD employing $O_3$ TEOS gas or inductively coupled (ICP) high-density plasma CVD, or by spin or glass (SOG).

In FIG. 35D, the insulator film 64 is polished by CMP to expose the top surface of the nitride film 61. In FIG. 35E, the nitride film 61 is removed by thermal phosphoric acid.

In FIG. 35F, a polysilicon semiconductor film 65 is formed by, for example, CVD. In FIG. 35G, the polysilicon film 65 is polished by, for example, CMP to expose the top surface of the insulator film 32.

In FIG. 35H, n-type impurities such as As or P ions are implanted into the polysilicon film 65, so that the polysilicon film 65 may have an average n-type impurity concentration of $2 \times 10^{20}$ cm$^{-3}$ or over. The dose and acceleration energy of this ion implantation must be adjusted so that the concentration of n-type impurities at the surface of the substrate 31 may not exceed the concentration of p-type impurities originally contained in the substrate 31. Instead of ion implantation, the n-type impurities may be introduced when the polysilicon film 65 is formed by CVD.

In FIG. 35I, the n-type impurities implanted in the polysilicon film 65 are solid-phase-diffused into the surface of the substrate 31 by, for example, RTA (rapid thermal annealing) at 1050 degrees centigrade for 10 seconds, to form a thin impurity diffusion layer 44. The impurity diffusion layer 44 serves as a counter impurity region. The concentration of the n-type impurities in the counter impurity region 44 is lower than that in the polysilicon film 65. A typical thickness of the counter impurity region 44 is in the range of 20 nm to 30 nm. The concentration of the n-type impurities in the counter impurity region 44 is about $1 \times 10^{18}$ to $2 \times 10^{20}$ cm$^{-3}$.

In FIG. 35J, a resist pattern 66 is formed on the polysilicon film 65. In FIG. 35K, the resist pattern 56 is used as a mask to form a groove 41 by RIE in the polysilicon film 65.

In FIG. 35L, the resist pattern 66 is removed. An insulating film 46 is formed by CVD on the polysilicon film 65 to cover the bottom and side walls of the groove 41. The insulating film 46 serves as a gate insulating film. The insulating film 46 may be formed by spattering or a combination of thermal oxidation and thermal nitriding. A conductive metal film 47 is formed by CVD or spattering on the insulating film 46 to fill the groove 41. The metal film 47 serves as a gate electrode.

The insulating film 46 may be made of silicon oxide, silicon nitride having a higher dielectric constant than the silicon oxide, $Ta_2O_5$, $TiO_2$, (Ba, Sr)$TiO_3$, $HfO_2$, $ZrO_2$, or oxide including metal and Si. The metal film 47 may be made of TiN, TaN, Al, W, or Cu. If the gate insulating film 46 and metal layer 47 react to each other, a reaction preventive film of TiN, TaN, ZrN, HfN, VN, NbN, CrN, MoN, or WN will be formed between the films 46 and 47.

In FIG. 35M, the insulating film 46 and metal film 47 outside the groove 41 are removed by, for example, CMP to leave the insulating film 46 and metal film 47 in the groove 41 and expose the top surfaces of the layers 65, 38, and 39, thereby completing the nMISFET. Thereafter, PMD (premetal dielectrics) and wiring are carried out according to standard processes.

It is preferable to secure a gate electrode lead area in the processes of FIGS. 35J and 35K. FIG. 36A is a plan view corresponding to FIG. 35J, which is a sectional view taken along a line IIj—IIj of FIG. 36A. FIG. 37A is a sectional view taken along a line IVa—IVa of FIG. 36A. FIG. 36B is a plan view corresponding to FIG. 35K, which is a sectional view taken along a line IIk—IIk of FIG. 36B. FIG. 37C is a sectional view taken along a line IVc—IVc of FIG. 36B. FIG. 36C is a plan view corresponding to FIG. 35M, which is a sectional view taken along a line IIm—IIm of FIG. 36C.

To secure the lead area 68 for the gate electrode 47 in the processes of FIG. 35J and 35K, the resist pattern 66 is formed as shown in FIGS. 36A and 37A. In FIG. 37B, the insulator film 32 is selectively etched so that the top surface 32a of the insulator film 32 becomes lower than the top surface of the polysilicon film 65.

FIGS. 36B and 37C, the polysilicon film 65 is selectively etched to secure a lead recess for the lead electrode 68.

The process of FIGS. 35J and 35K are carried out to provide the structure of FIG. 37C. The processes of FIGS. 35L and 35M are carried out to simultaneously form the gate electrode 47 and lead electrode 68 of FIG. 36C.

Figure 38:
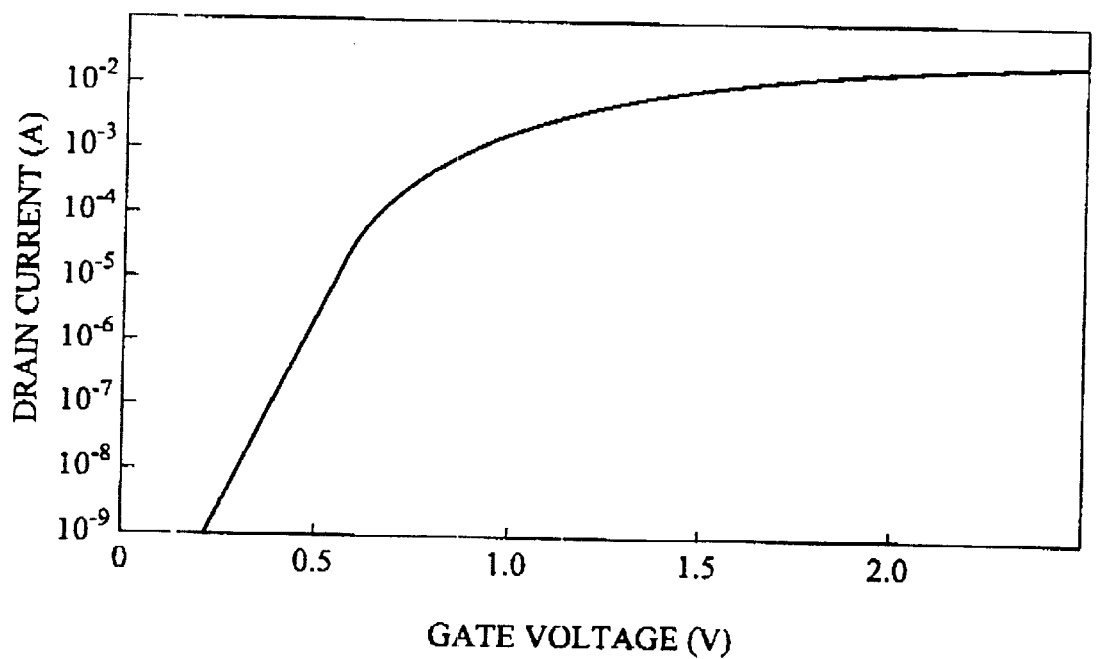
FIG. 38 is a graph showing a simulated relationship between the gate voltage and drain current of an nMISFET based on the embodiment 10.

FIG. 38 shows simulation results of the performance of the nMOSFET of FIG. 35M. An abscissa represents gate voltages and an ordinate represents drain currents. The simulations are based on a gate length of 0.085 $\mu$m, a gate width of 0.085 $\mu$m, the counter impurity region 44 being 30 nm thick, the gate insulating film 46 being 2.7 nm thick, and a drain voltage of 1.5 V. The impurity concentrations of the substrate 31, counter impurity region 44, and semiconductor layer 65 are $1 \times 10^{18}$, $-2 \times 10^{17}$, and $-1 \times 10^{20}$ cm$^{-3}$, respectively. Here, a negative value indicates an n-type, and a positive value a p-type. The gate electrode 47 is made of metal such as TiN so that the Fermi level of the gate electrode 47 is at the center of a silicon forbidden band. Namely, it is away from a valence band and a conduction band by 0.55 eV.

In FIG. 38, the mMISFET of FIG. 35M normally operates as a transistor. The threshold voltage of the nMISFET is about 0.2 V, which is sufficiently low. The threshold voltage is defined as a gate voltage with respect to a drain current of $10^{-9}$ A. The nMISFET of FIG. 35M provides a sufficiently low threshold voltage even when the gate electrode 47 is made of metal.

The embodiment 10 forms the semiconductor layer 65 on the substrate 31. The semiconductor layer 65 contains conductive impurities whose conductivity type is opposite to that of the substrate 31. Before forming the groove 41 for the gate electrode 47 in the semiconductor layer 65, the embodiment 10 solid-phase-diffuses the impurities into the surface of the substrate 31, to form the impurity diffusion layer 44. This layer 44 corresponds to the source and drain extensions and counter dope layer of a conventional MISFET. Consequently, the embodiment 10 is capable of maintaining a constant contact state between the source and drain regions 38 and 39 (the layer 65) and a channel region. Since the embodiment 10 employs solid-phase diffusion, the impurity diffusion layer 44 is thin.

Figure 39A:
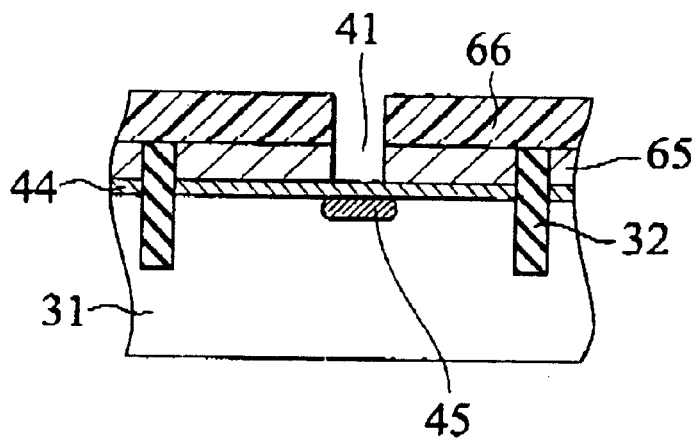
FIGS. 39A to 39C are sectional views showing a method of manufacturing a MISFET according to a modification of the embodiment 10.
Figure 39B:
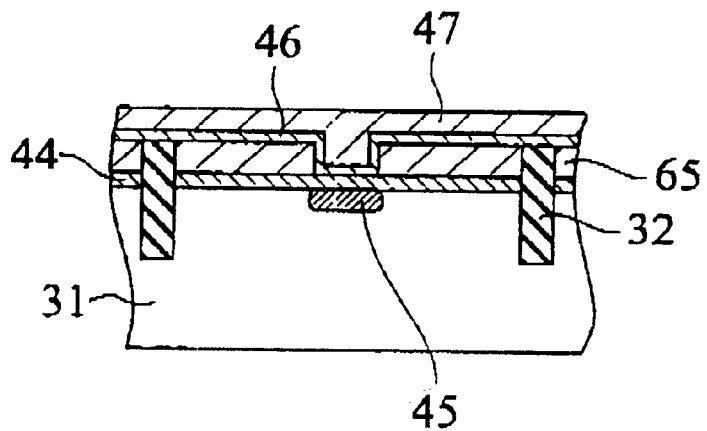
Figure 39C:
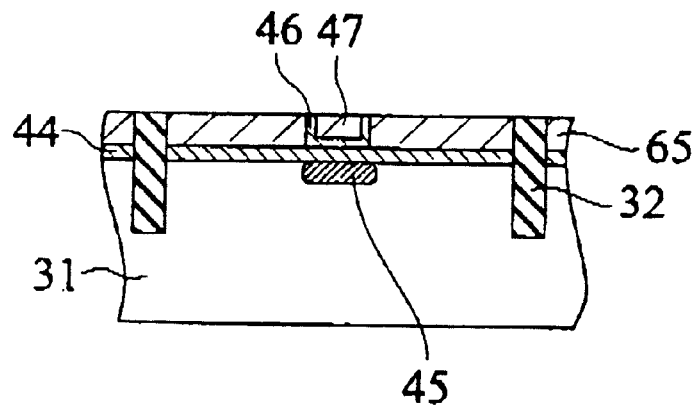

A MISFET according to a modification of the embodiment 10 and a manufacturing method thereof will be explained. This MISFET has the impurity concentration profiles of the embodiment 3. FIG. 39C is a sectional view showing the MISFET. The MISFET of FIG. 39C differs from the MISFET of FIG. 35M in that it has a channel impurity region 45 of a first conductivity type under an impurity diffusion layer 44 below a gate electrode 47. The regions 44 and 45 have the impurity concentration profiles of FIGS. 24 and 9B.

The MISFET according to the modification of the embodiment 10 is manufactured through the steps of FIGS. 35A to 35K. Thereafter, in FIG. 39A, impurity ions are implanted into the substrate 31 through the opening 41. More precisely, indium ions of $5 \times 10^{13}$ cm$^{-2}$ are implanted at 190 keV in acceleration energy. The implanted impurities are activated by RTA at 850 degrees centigrade for 30 seconds. The processes of FIGS. 35L and 35M are carried out to provide cross-sectional structures of FIGS. 39B and 39C.

In this way, the embodiment 10 provides a semiconductor device composed of metal-gate MISFETs each having a sufficiently low threshold voltage and suppressed characteristic variations, as well as a method of manufacturing such a semiconductor device.

Embodiment 11

Like the embodiment 10, the embodiment 11 of the present employs a concave structure in which a channel region is formed below the surfaces of source and drain regions and maintains a constant contact state between the source and drain regions and the channel region by forming a counter impurity region. In addition, the embodiment 11 solves the problem of large parasitic capacitance inherent to the concave structure. The parasitic capacitance is caused because the source and drain regions face of the sides faces of a gate electrode. The parasitic capacitance hinders a transistor operation speed. The embodiment 11 minimizes the parasitic capacitance.

The embodiment 11 provides a MISFET having the channel impurity concentration profile of FIG. 1 and the counter impurity concentration profile of the embodiment 2. The embodiment 11 also provides a method of manufacturing such a MISFET.

Figure 40:
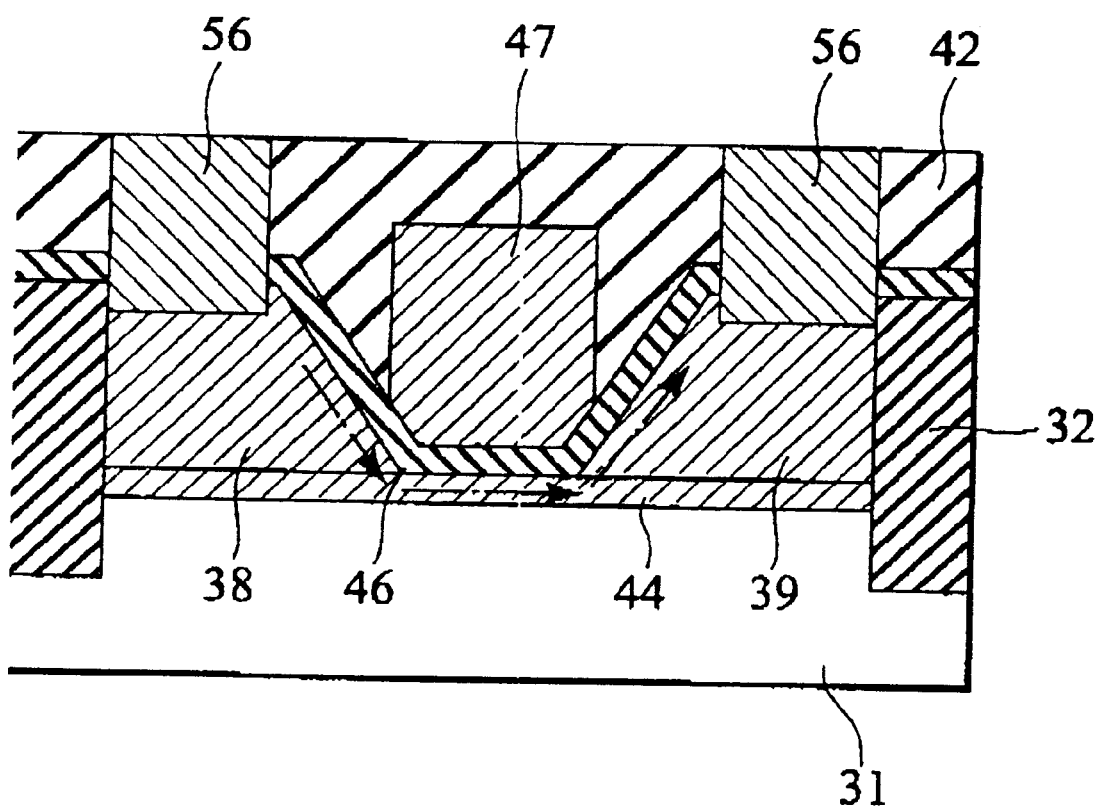
FIG. 40 is a sectional view showing a MISFET according to an embodiment 11 of the present invention.

FIG. 40 is a sectional view showing the MISFET of the embodiment 11 having the channel impurity concentration profile of FIG. 1. The MISFET has a semiconductor substrate 31 of a first conductivity type, a gate insulating film 46 in contact with the top surface of the substrate 31, a gate electrode 47 having a bottom surface and inclined first and second side faces in contact with the gate insulating film 46, a source region 38 of a second conductivity type having a bottom surface in contact with the top surface of the substrate 31 and an inclined side face opposed to the first side face of the gate electrode 47, and a drain region 39 of the second conductivity type having a bottom surface in contact with the top surface of the substrate 31 and an inclined side face opposed to the second side face of the gate electrode 47. The substrate 31 has a counter impurity region 44 of the second conductivity type under the regions 38 and 39 and film 46. The counter impurity region 44 has the concentration profile of the embodiment 2. An element isolation region 32 surrounds the source and drain regions 38 and 39. The counter impurity region 44 maintains a constant contact state between the source/drain region and the channel region. The inclined side faces of the source and drain regions 38 and 39 increase the distance between the tops of the source and drain regions 38 and 39 and the gate electrode 47, thereby reducing parasitic capacitance.

The manufacture the MISFET, a dummy gate electrode pattern 35 is formed on a silicon substrate 31. Epitaxial regions 71 and 72 are selectively grown from monocrystalline silicon in an active region where the gate electrode pattern 35 is not present on the substrate 31. The epitaxial regions 71 and 72 have tapered surfaces with respect to the side faces of the gate electrode pattern 35. The tapered epitaxial regions 71 and 72 are used as inclined source and drain regions.

FIGS. 41A to 41F are sectional views showing a method of manufacturing the MISFET of the embodiment 11 having the channel impurity concentration profile of FIG. 1. The MISFET explained below is an nMISFET. The following explanation is also applicable to a pMISFET by inverting conductivity types.

Figure 41A:
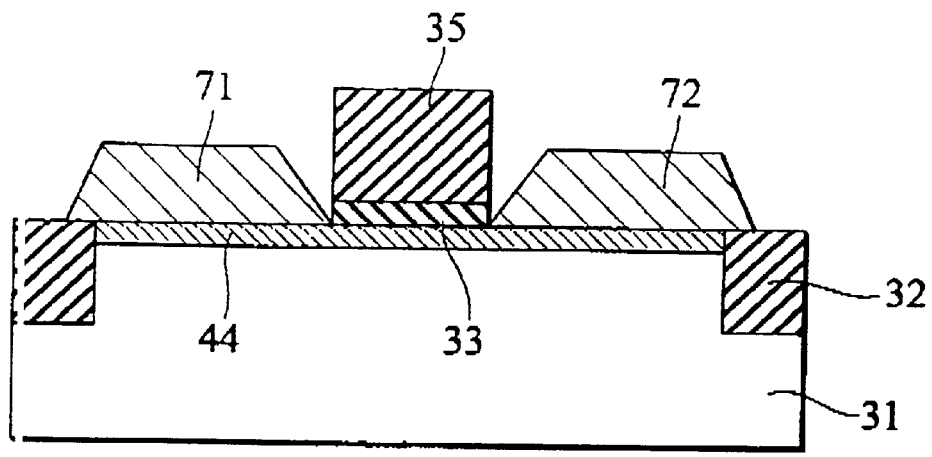
FIGS. 41A to 41F are sectional views showing a method of manufacturing the MISFET of FIG. 40.

In FIG. 41A, an element isolation region 32 is formed on a p-type substrate 31 outside an active region. An n-type counter impurity region 44 is formed by ion implantation in the active region of the substrate 31. A sacrificial oxide film 33 of silicon oxide ($SiO_2$) is formed by the thermal oxidation on the counter impurity region 44. A silicon nitride ($Si_3N_4$) film is formed by CVD. The silicon nitride film is processed by lithography into a dummy gate 35. The sacrificial oxide film 33 outside the dummy gate 35 is removed by, for example, diluted hydrofluoric acid. The sacrificial oxide film 33 under the dummy gate 35 remains.

The dummy gate 35 is used as a mask to epitaxially and selectively grow n-type silicon layers 71 and 72 with silicon crystals in the counter impurity region 44 serving as cores. The dummy gate 35 blocks the distribution of core silicon crystals. As a result, silicon crystals at each end of the silicon layers 71 and 72 obliquely grow to form facets. The (111) face of a silicon crystal involves smallest surface energy and slowest growing speed. The embodiment 11 uses these characteristics of silicon crystals, to form a facet on the (111) face inclined by about 50 degrees with respect to the surface of the substrate 31.

The details of the manufacturing method will be explained. In FIG. 41A, a silicon substrate 31 having an exposed counter impurity region 44 is placed in an LPCVD chamber. The substrate 31 is annealed in a hydrogen atmosphere at 900 degrees centigrade for 180 seconds, to remove a natural oxide film from the substrate surface. Continuously in the chamber, amorphous silicon is deposited on the substrate 31 for 28 seconds at, for example, 600 degrees centigrade and 100 Torr by supplying hydrogen gas at 10 slm and silane ($SiH_4$) gas at 1slm.

Continuously in the chamber, monocrystalline silicon is solid-phase-grown by annealing for 30 seconds in an $H_2$ atmosphere at 600 degrees centigrade. The monocrystalline silicon on the substrate serves as a core to settle the amorphous silicon. At this time, no monocrystal is formed on the $SiO_2$ film 32 and dummy gate 35. As a result, epitaxial silicon regions 71 and 72 having side walls inclined by 50 degrees with respect to the substrate surface are formed from the $SiO_2$ film 32 and dummy gate 35.

The epitaxial silicon regions 71 and 72 are selectively formed on the substrate 31 in a self-aligning manner with respect to the dummy gate 35. The epitaxial regions 71 and 72 are inclined with respect to the substrate 31. Extra amorphous silicon is removed by hydrofluoric acid, to complete the epitaxial regions 71 and 72 of FIG. 41A.

Figure 41B:
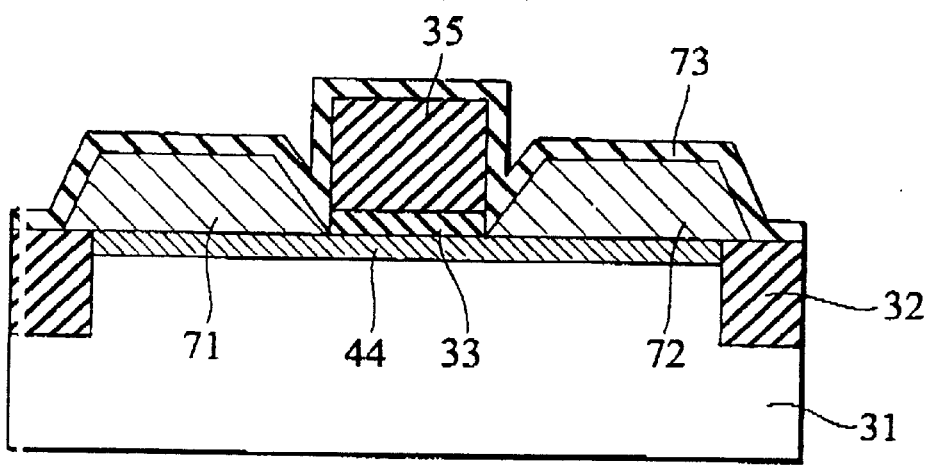

In FIG. 41B, an $SiO_2$ film 73 of, for example, 10 nm thick is formed by CVD over the epitaxial regions 71 and 72 and dummy gate 35. In an area where the bottom of the dummy gate 35 meets the epitaxial regions 71 and 72, the $SiO_2$ film 73 is thicker than a gate insulating film 46, to form a gate electrode 47 having inclined side faces, which obliquely upwardly extend in parallel with the inclined side faces of source and drain regions 38 and 39.

Figure 41C:
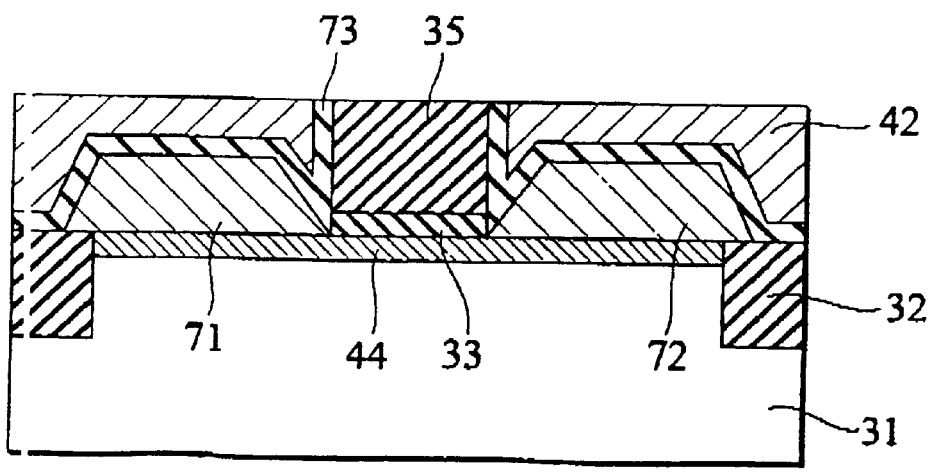

In FIG. 41C, a polysilicon film 42 is entirely deposited. The dummy gate 35 is used as a stopper to remove the polysilicon film 42 by CMP. This exposes the top of the dummy gate 45 from the polysilicon film 42. The film 42 may be made of another material such as TEOS depending on the material of the dummy gate 35.

Figure 41D:
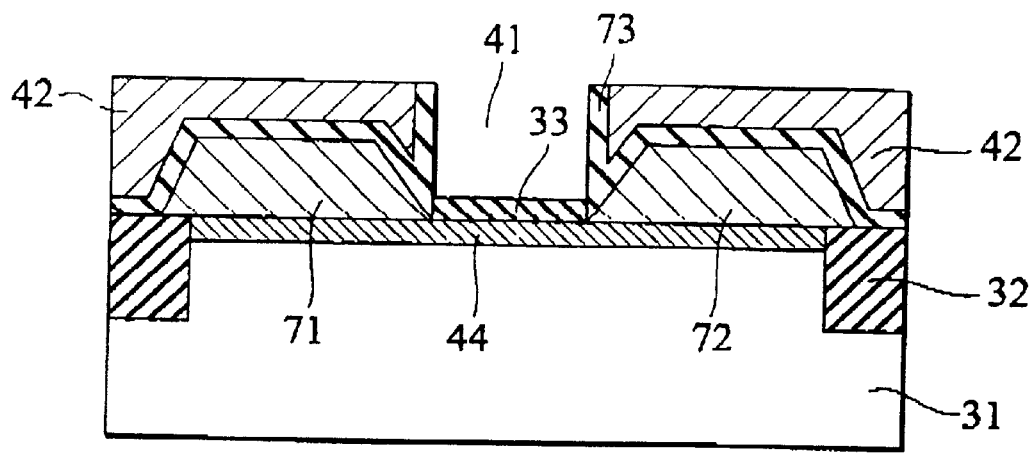

In FIG. 41D, the dummy gate 35 is removed by hot phosphoric acid to form a recess 41. The recess 41 is used to form a gate insulating film 46 and a gate electrode 47.

Figure 42A:
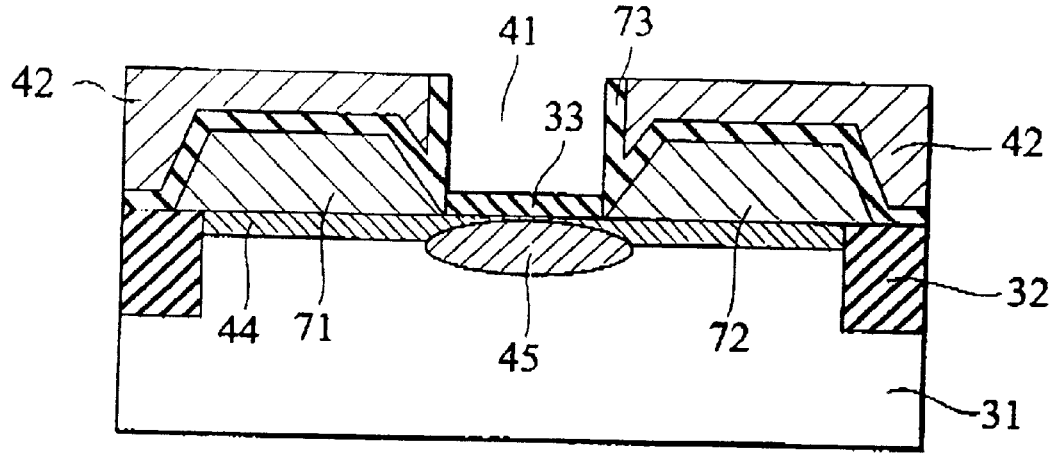
FIGS. 42A to 42C are sectional views showing a method of manufacturing a MISFET according to a modification of the embodiment 11.

If required, channel ions for controlling Vth may be implanted through the recess 41 to form a region 45 of FIG. 42A before forming the gate electrode 47. In this case, the polysilicon film 42 and photoresist are used to form a mask to selectively implant the channel ions into the recess 41. The ion implanted region 45 reduces a leak current at a source-drain junction, compared with unselective channel ion implantation. The ion implanted region also reduces junction capacitance and forms the impurity concentration profiles of the embodiment 2 of FIGS. 22 and 7B.

The $SiO_2$ films 33 and 73 are removed from the bottom and side walls of the recess 41. Then, the recess 41 has tapered parts between the bottom and side walls thereof having the same inclination as that of the epitaxial regions 71 and 72. The side walls of the recess 41 are widened by the thickness of the $SiO_2$ film 73 formed on the side walls of the recess 41. Since the $SiO_2$ film 73 is on the inclined side faces of the epitaxial regions 71 and 72, the removal of the $SiO_2$ film 73 exposed the inclined parts of the epitaxial regions 71 and 72.

Figure 41E:
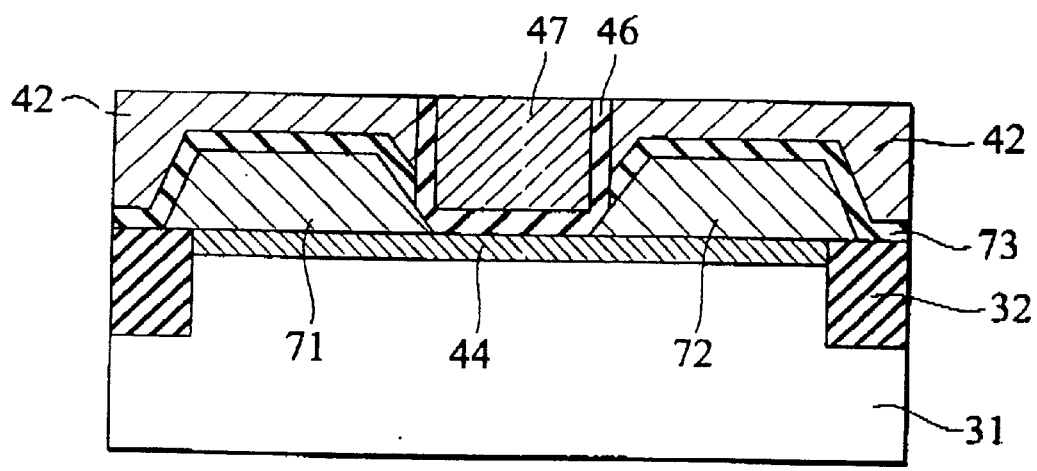
Figure 42B:
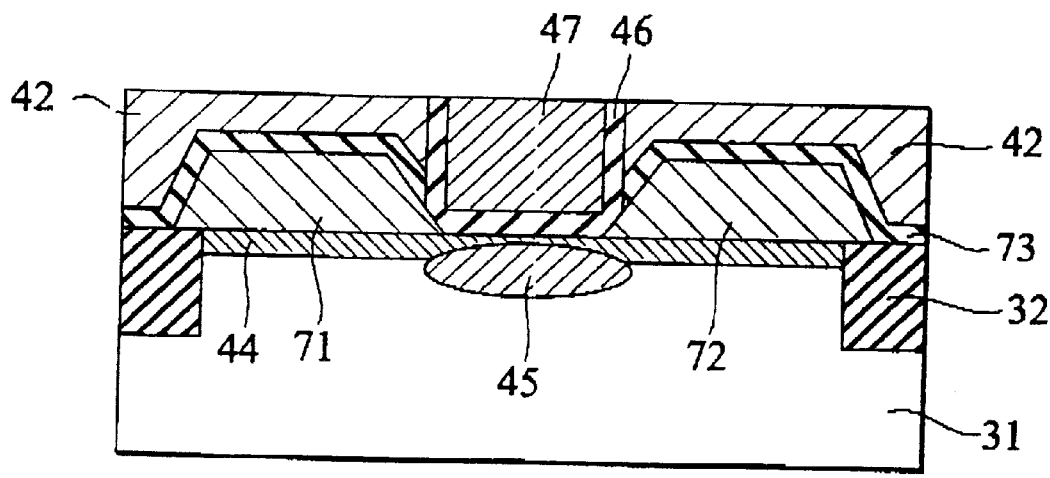

In FIGS. 41E and 42B, a gate insulating film 46 is formed by, for example, thermal oxidation in the recess 41. The gate insulating film 46 may be made of a lamination of a CVD-$SiO_2$ film, a CVD-SiON film, and a CVD-$Si_3N_4$ film. The gate insulating film 46 is thinner than the $SiO_2$ film 73 and is, for example, about 3.5 nm thick. Forming the gate insulating film 46 thinner than the $SiO_2$ film 73 provides the gate electrode 47 with side faces having the same inclination as the epitaxial regions 71 and 72.

To form the gate electrode 47, a conductive film is entirely formed to fill the recess 41, and the conductive film outside the recess 41 is removed by CMP. The epitaxial regions 71 and 72 opposed to the inclined parts of the gate electrode 47 operate as accumulation regions. The conductive film to form the gate electrode 47 may be a metal film. This is possible because high-temperature annealing for activating the source and drain regions is carried out before the formation of the gate electrode 47, and therefore, the gate electrode 47 is subjected to no heat treatment. The gate electrode 47 may be made of a lamination of TiN and Al.

Figure 41F:
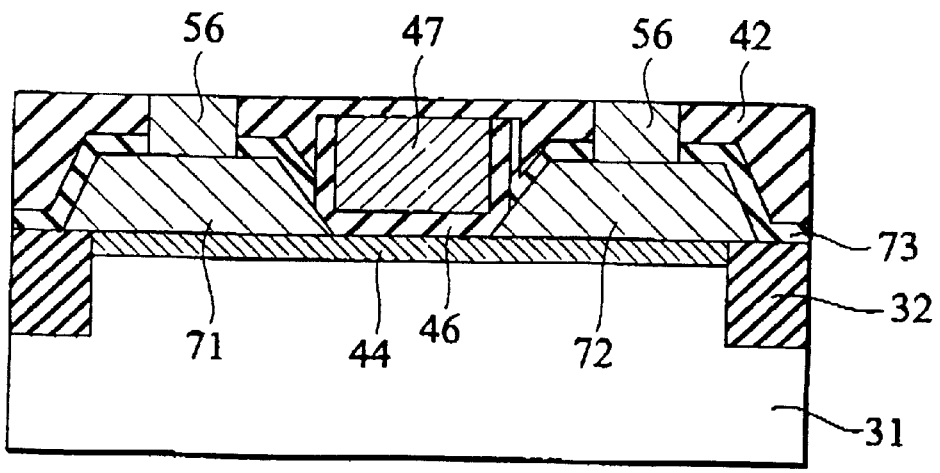
Figure 42C:
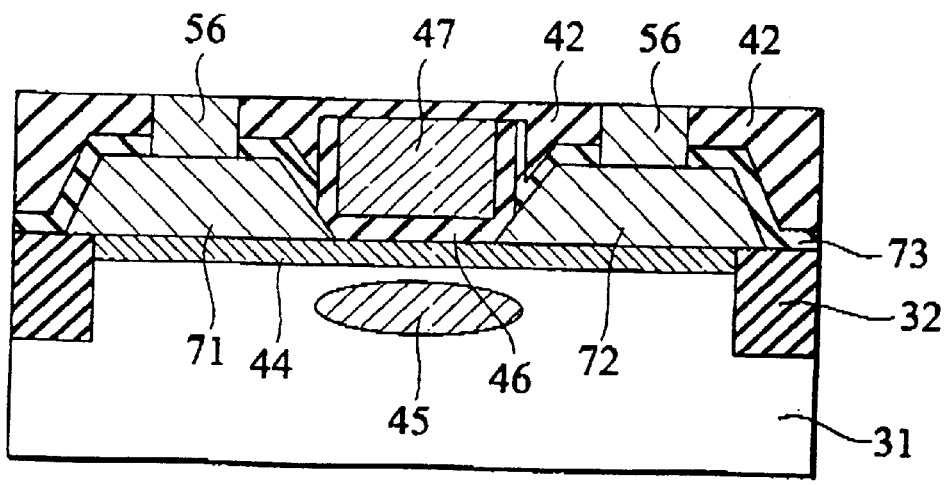

In FIGS. 41F and 42C, the polysilicon film 42 is removed by CDE, and an interlayer insulating film 42 is entirely formed. To remove the polysilicon film 42 by CDE, an insulating film cap is formed on he gate electrode 47 depending on the kind of conductive material used to form the gate electrode 47, and the insulating film cap on the polysilicon film 42 is removed by CMP. A plug 56 is formed through the interlayer insulating film 42.

The above processes employ the nitride dummy gate 35 to selectively form the epitaxial regions 71 and 72. Namely, the epitaxial regions 71 and 72 are formed by solid-phase growth with the use of a (111) face so that the regions 71 and 72 may be inclined by about 50 degrees with respect to the substrate 31. Instead of the (111) face, a (311) face having a gentler angle of about 30 degrees may be used. In this case, the dummy gate 35 is made by a lamination of an $SiO_2$ film 33 of 50 nm thick and a nitride film 35 of 50 nm thick, and the epitaxial regions 71 and 72 are selectively formed by gas-phase growth.

The embodiment 11 determines, when forming the dummy gate 35, a gate position by lithography and the positions of inclined source and drain regions in a self-aligning manner, thereby suppressing channel length variations.

The surface of the counter impurity region 44 is not subjected to RIE, and the surface of the substrate 31 is not damaged by etching. The selective epitaxial regions 71 and 72 realize the use of a proper silicon surface like a planar transistor while utilizing the short channel effect suppressing function of the concave structure.

The embodiment 11 selectively forms the voltage controlling ion implanted layer 45 (FIG. 42C) in a channel area under the gate electrode 47. The dummy gate 35 of $Si_3N_4$ is used to selectively grow the epitaxial layers 71 and 72 outside an area where the gate electrode 47 is formed. Namely, the embodiment 11 employs the dummy gate 35 to form parts other than the gate electrode 47, removes the dummy gate 35, and forms the gate electrode 47 by the damascene gate process, which enables ion implantation to be selectively carried out in a channel area.

Embodiment 12

Like the embodiments 10 and 11, the embodiment 12 of the present invention employs the concave structure to form a channel region below the surfaces of source and drains regions. The embodiment 12 employs the parasitic capacitance reducing measure of the embodiment 11. In addition, the embodiment 12 employs a measure to reduce parasitic resistance inside source and drain regions 38 and 39.

The embodiment 12 provides a MISFET having the impurity concentration profiles of the embodiment 1 and a method of manufacturing such a MISFET.

Figure 43:
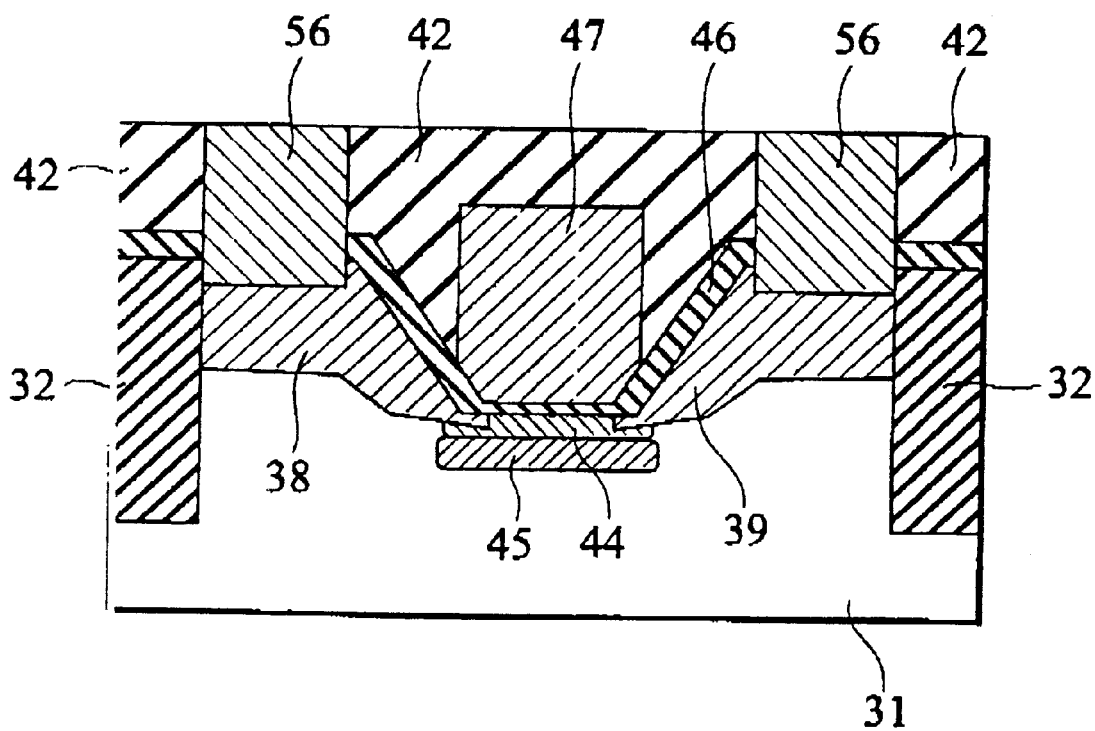
FIG. 43 is a sectional view showing a MISFET according to an embodiment 12 of the present invention.

FIG. 43 is a sectional view showing MISFET of the embodiment 12. The MISFET has a semiconductor substrate 31 of a first conductivity type, a gate insulating film 46 in contact with the top surface of the substrate 31, a gate electrode 47 having a bottom surface and inclined first and second side faces in contact with the gate insulating film 46, a source region 38 of a second conductivity type having a bottom surface in contact with the top surface of the substrate 31 and an inclined side face opposed to the first side face of the gate electrode 47, and a drain region 39 of the second conductivity type having a bottom surface in contact with the top surface of the substrate 31 and an inclined side face opposed to the second side face of the gate electrode 47. The substrate 31 has a counter impurity region 44 of the second conductivity type formed at the substrate surface under the gate insulating film 46, and a channel impurity region 45 formed under the counter impurity region 44. The counter and channel impurity regions 44 and 45 have the impurity concentration profiles of the embodiment 1 of FIGS. 19 and 9B. An element isolation region 32 surrounds the source and drain regions 38 and 39. The counter and channel impurity regions 44 and 45 provide the effect of the embodiment 1. The inclined side faces of the source and drain regions 38 and 39 provide the effect of the embodiment 11. The highest points of the bottom surfaces of the source and drain regions 38 and 39 are higher than the lowest points of the bottom surface of the gate insulating film 46. This shortens a current path in each of the source and drain regions 38 and 39 to easily pass a current to a plug 56, thereby reducing parasitic resistance.

FIGS. 44A to 44F are sectional views showing the method of manufacturing the MISFET of the embodiment 12. The MISFET is an nMISFET in the following explanation. The same explanation is applicable to a pMISFET by inverting conductivity types.

Figure 44A:
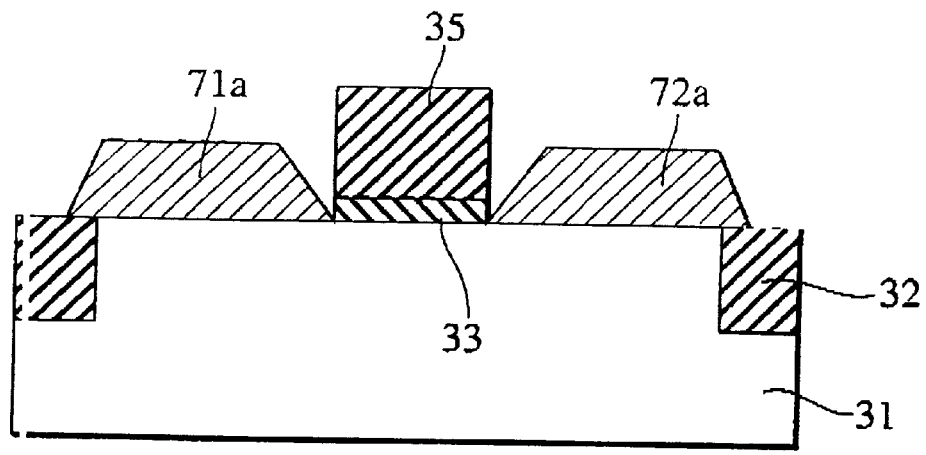
FIGS. 44A to 44F are sectional views showing a method of manufacturing the MISFET of FIG. 43.

In FIG. 44A, an element isolation region 32 is formed on a substrate 31 outside an active region. A sacrifical silicon oxide ($SiO_2$) film 33 is formed by, for example, thermal oxidation on the active region. A silicon nitride ($Si_3N_4$) film is formed by CVD and is shaped by lithography into a dummy gate 35. The sacrificial oxide film 33 outside the dummy gate 35 is removed by diluted hydrofluoric acid. The sacrificial oxide film 33 under the dummy gate 35 remains.

The dummy gate 35 is used as a mask to selectively and epitaxially grow p-type crystalline silicon layers 71a and 72a with core silicon crystals in a region 44. The conductivity type of layers 71a and 72a is p, which is the same as that of the substrate 31.

Figure 44B:
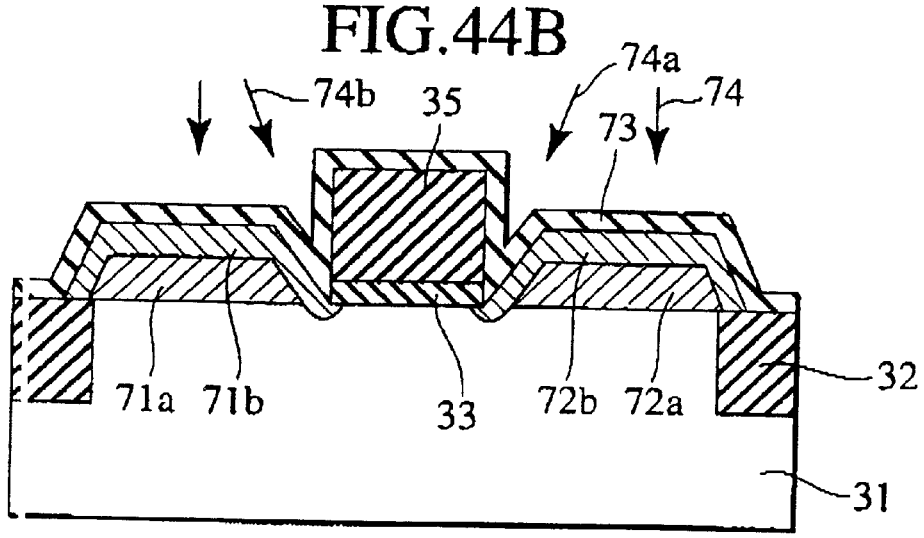

In FIG. 44B, an $SiO_2$ film 73 of, for example, 10 nm thick is formed by CVD over the epitaxial regions 71a and 72a and dummy gate 35. The $SiO_2$ film 73 on the epitaxial regions 71a and 72a serves as a protective film for the next ion implantation (74, 74a, 74b).

The ion implantation 74 and oblique ion implantation 74a and 74b are carried out with n-type impurity ions. Thermal diffusion annealing is carried out by RTA at 900 degrees centigrade for 30 seconds to activate the implanted impurities and diffuse them into the bottom of the $SiO_2$ film 33. Impurity implanted regions 71b and 72b form the source and drain regions 38 and 39 of FIG. 43, respectively. Inclined side faces of the epitaxial regions 71a and 72a are subjected to the ion implantation 74 and oblique ion implantation 74a and 74b, to form the n-type regions 71b and 72b extending from the tops of the epitaxial regions 71a and 72a to the substrate 31 along the inclined sides.

Figure 44C:
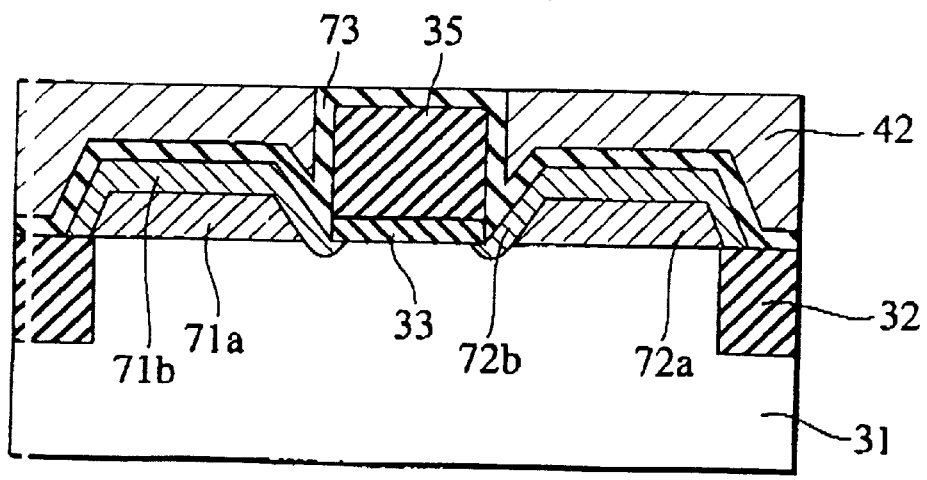

In FIG. 44C, a polysilicon film 42 is entirely deposited. The dummy gate 35 is used as a stopper to remove the polysilicon film 42 and $SiO_2$ film 73 by CMP.

Figure 44D:
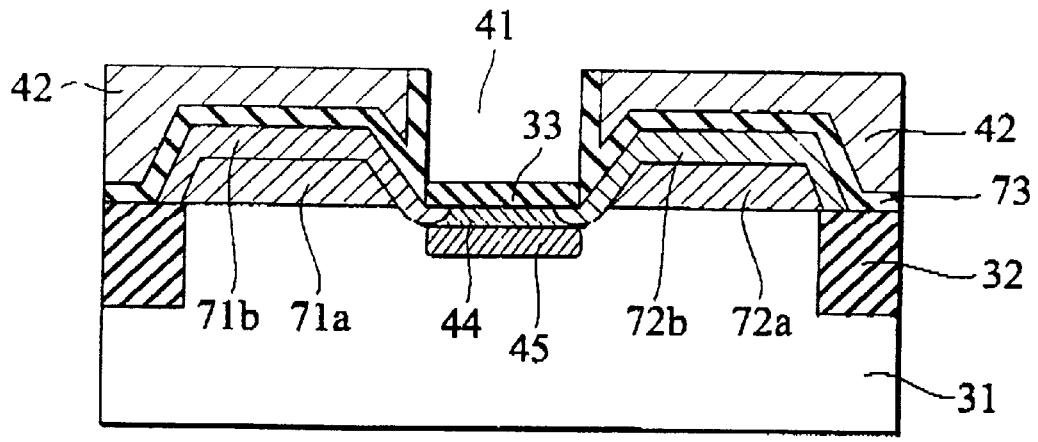

In FIG. 44D, the dummy gate 35 is removed with hot phosphoric acid to form a recess 41 corresponding to a gate electrode. If required, the polysilicon film 42 and photoresistant used to form a mask to selectively implant ions into the recess 41. More precisely, indium ions of $5 \times 10^{13}$ cm$^{-2}$ are implanted at 190 keV, and antimony ions of $5 \times 10^{11}$ cm$^{-2}$ are implanted at 5 keV. The implanted impurities are activated by RTA at 850 degrees centigrade for 30 seconds.

The $SiO_2$ films 33 and 73 are removed from the bottom and side walls of the recess 41. As a result, the recess 41 is tapered between the bottom and the side walls thereof at the same inclination as the side faces of the regions 71 and 72.

Figure 44E:
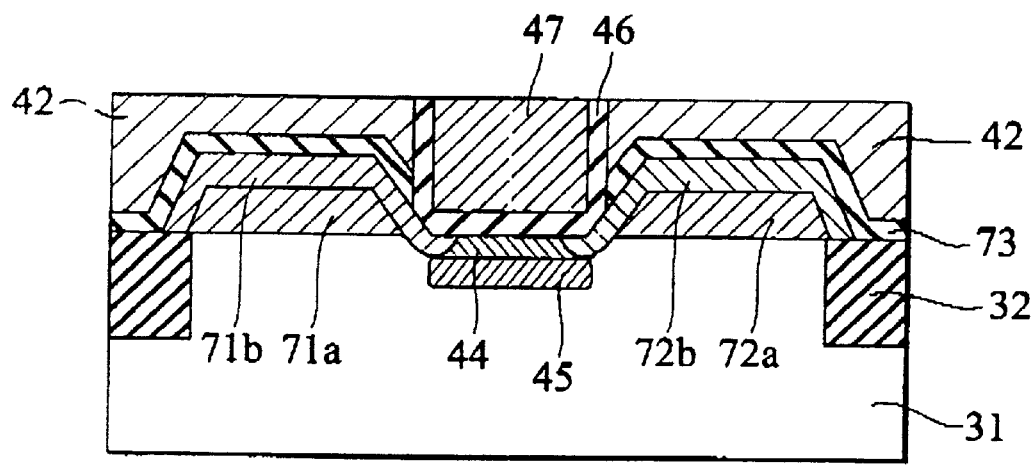

FIG. 44E, a gate insulating film 46 is formed by, for example, thermal oxidation in the recess 41. The gate insulating film 46 is thinner than the $SiO_2$ film 73, so that a gate electrode 47 may have side faces whose inclination is the same as that of the side faces of the regions 71 and 72.

To form the gate electrode 47, a conductive film is entirely deposited to fill the recess 41. The conductive film outside the recess 41 is removed by CMP.

Figure 44F:
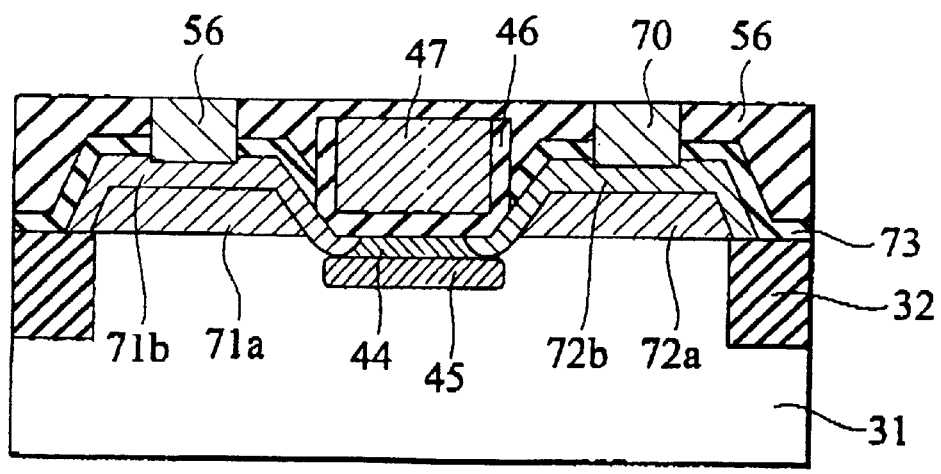

In FIG. 44F, the polysilicon film 42 is removed by CDE, and an interlayer insulating film 42 is entirely formed. Thereafter, plugs 56 are formed.

Various modifications will become possible for those skilled in the art after receiving the teachings of the present disclose without departing from the scope thereof.

What is claimed is:

1. A semiconductor device comprising:
    a first semiconductor region formed in a semiconductor substrate and having a first conductivity type due to first-conductivity-type active impurities contained in the first semiconductor region, said first-conductivity-type active impurities contained in the first semiconductor region being configured to have a concentration profile that decreases toward the surface of the semiconductor substrate and includes a part wherein said concentration profile decreases more than 10% per 3 nm;
    a second semiconductor region formed between the first semiconductor region and the surface of the semiconductor substrate and having a second conductivity type due to second-conductivity-type active impurities contained in the second semiconductor region, the second semiconductor region also containing first-conductivity-type active impurities whose minimum concentration is substantially zero or smaller than a quarter of a concentration of the second-conductivity-type active impurities contained in the second semiconductor region, said second-conductivity-type active impurities being configured to have a concentration at the bottom of the second semiconductor region being smaller than half a maximum concentration of the first-conductivity-type impurities contained in a depletion layer of the first semiconductor region formed during the operation of the semiconductor device, and configured to a maximum concentration being smaller than twice of a minimum concentration of the second-conductivity-type active impurities between the surface of the semiconductor substrate and the bottom of the depletion layer of the first semiconductor region during the operation of the semiconductor device;
    wherein the bottom of said second semiconductor region is at a depth of about 20–30 nm from the surface of said semiconductor substrate;
    an insulating film formed on the surface of the semiconductor substrate over the second semiconductor region;
    a conductor formed on the insulating film, and having work function close to mid-gap of the semiconductor substrate;
    a third semiconductor region of the second conductivity type formed in contact with the second semiconductor region; and
    a fourth semiconductor region of the second conductivity type formed in contact with the second semiconductor region.

2. The semiconductor device of claim 1, wherein:
    at the bottom of the second semiconductor region, the gradient of a concentration profile of the second-conductivity-type active impurities is smaller than that of the first-conductivity-type active impurities.

3. The semiconductor device of claim 1, wherein:
    a concentration of the second-conductivity-type active impurities at the bottom of the depletion layer of said first semiconductor region during the operation of the semiconductor device is smaller than a quarter of a maximum concentration of the first-conductivity-type active impurities in the depletion layer of the first semiconductor region.

4. The semiconductor device of claim 1, wherein:
    a concentration profile of the second-conductivity-type impurities has a peak in the second semiconductor region.

5. The semiconductor device of claim 1, wherein:

a concentration profile of the second-conductivity-type impurities in the second semiconductor region has a peak where a concentration of the first-conductivity-type active impurities is smaller than half the concentration of the second-conductivity-type active impurities.

6. The semiconductor device of claim 1, wherein:

at the surface of the semiconductor substrate, a concentration of the first-conductivity-type active impurities is smaller than a quarter of a concentration of the second-conductivity-type active impurities.

7. The semiconductor device of claim 1, wherein:

said concentration profile of said first-conductivity-type active impurities in the first semiconductor region includes a part wherein said concentration profile decreases more than 10% per 1 nm.

8. The semiconductor device of claim 1, wherein:

the firs-conductivity-type impurities are indium atoms.

9. The semiconductor device of claim 1, wherein;

the second-conductivity-type impurities are phosphorus atoms.

10. The semiconductor device of claim 1, wherein:

the second-conductivity-type impurities are atoms of a material selected from antimony and arsenic.

11. The semiconductor device of claim 1, wherein:

the firs-conductivity-type impurities are atoms of a material selected from antimony and arsenic.

12. The semiconductor device of claim 1, wherein:

the second-conductivity-type impurities are boron atoms.

13. The semiconductor device of claim 1, wherein:

the second-conductivity-type impurities are indium atoms.

14. The semiconductor device of claim 1, wherein:

the conductor is made of a material selected from metal and metal compound.

* * * * *